United States Patent [19]

Kitsukawa et al.

[11] Patent Number: 5,644,548

[45] Date of Patent: Jul. 1, 1997

[54] DYNAMIC RANDOM ACCESS MEMORY HAVING BIPOLAR AND C-MOS TRANSISTOR

[75] Inventors: Goro Kitsukawa, Tokyo; Takao Watanabe, Kokubunji; Ryoichi Hori, Tokyo; Noriyuki Honma, Kokubunji; Kunihiko Yamaguchi, Sayama; Kiyoo Ito, Higashikurume; Masahiro Iwamura; Ikuro Masuda, both of Hitachi, all of Japan

[73] Assignee: Hitachi, Ltd., Tokyo, Japan

[21] Appl. No.: 703,521

[22] Filed: Aug. 27, 1996

Related U.S. Application Data

[63] Continuation of Ser. No. 391,537, Feb. 21, 1995, Pat. No. 5,587,952, which is a continuation of Ser. No. 35,272, Mar. 22, 1993, abandoned, which is a division of Ser. No. 921,385, Jul. 30, 1992, abandoned, which is a continuation of Ser. No. 308,680, Feb. 3, 1989, abandoned, which is a continuation-in-part of Ser. No. 803,673, Dec. 2, 1985, abandoned, which is a continuation-in-part of Ser. No. 170,623, Mar. 17, 1988, Pat. No. 4,813,020, which is a continuation of Ser. No. 825,939, Feb. 4, 1986, abandoned, which is a continuation-in-part of Ser. No. 803,673, and a continuation-in-part of Ser. No. 170,623, which is a continuation of Ser. No. 825,939.

[30] Foreign Application Priority Data

Dec. 3, 1984 [JP] Japan ................... 59-254014
Dec. 17, 1984 [JP] Japan ................... 59-264466
Jan. 23, 1985 [JP] Japan ................... 60-8976

[51] Int. Cl.$^6$ ................................... G11C 8/00
[52] U.S. Cl. ..................... 365/230.06; 365/230.08
[58] Field of Search ................ 365/230.06, 230.08, 365/185.23, 189.08

[56] References Cited

U.S. PATENT DOCUMENTS

| | | | |
|---|---|---|---|
| 3,980,899 | 9/1976 | Shimada | 365/230.06 |
| 4,514,829 | 4/1985 | Chao | 365/230.06 |
| 4,611,131 | 9/1986 | Shah | 365/230.06 |
| 4,618,784 | 10/1986 | Chappell | 365/230.06 |

*Primary Examiner*—Tan T. Nguyen
*Attorney, Agent, or Firm*—Antonelli, Terry, Stout & Kraus, LLP

[57] ABSTRACT

A dynamic random access memory device is provided having a dynamic memory cell, a word line coupled to the dynamic memory cell, a data line coupled to the dynamic memory cell, a precharge circuit coupled to the data line, a word driver coupled to the word line and a decoder coupled to the word driver. A plurality of address lines coupled to the decoder. The decoder has a first logic circuit whose inputs are connected to the plurality of address lines. The decoder also has a latch circuit whose input is connected to an output of the first logic circuit and whose output is connected to the word line.

3 Claims, 56 Drawing Sheets

FIG. 88
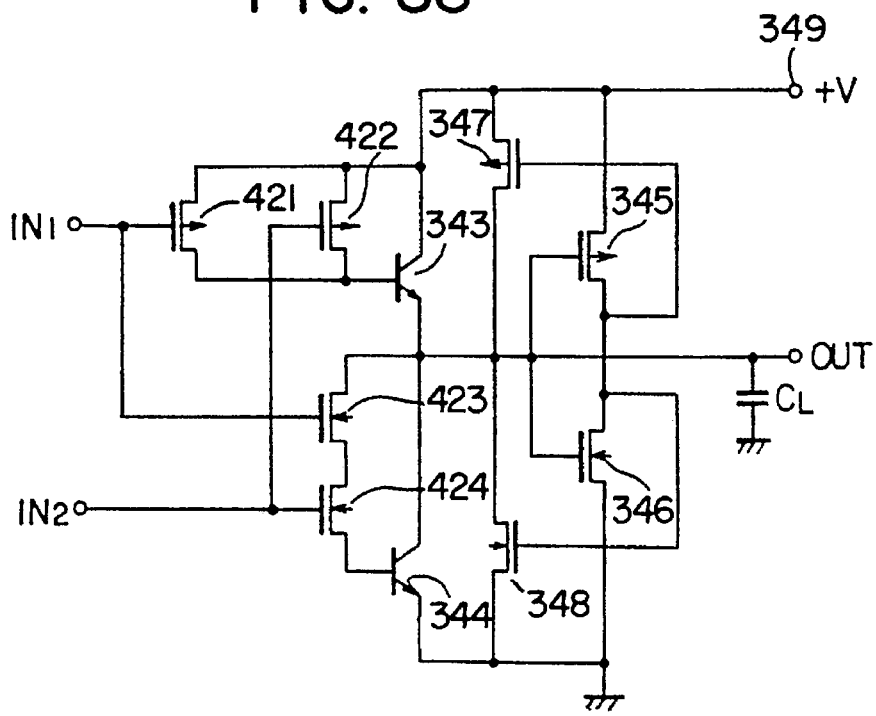
FIG. 89
FIG. 90
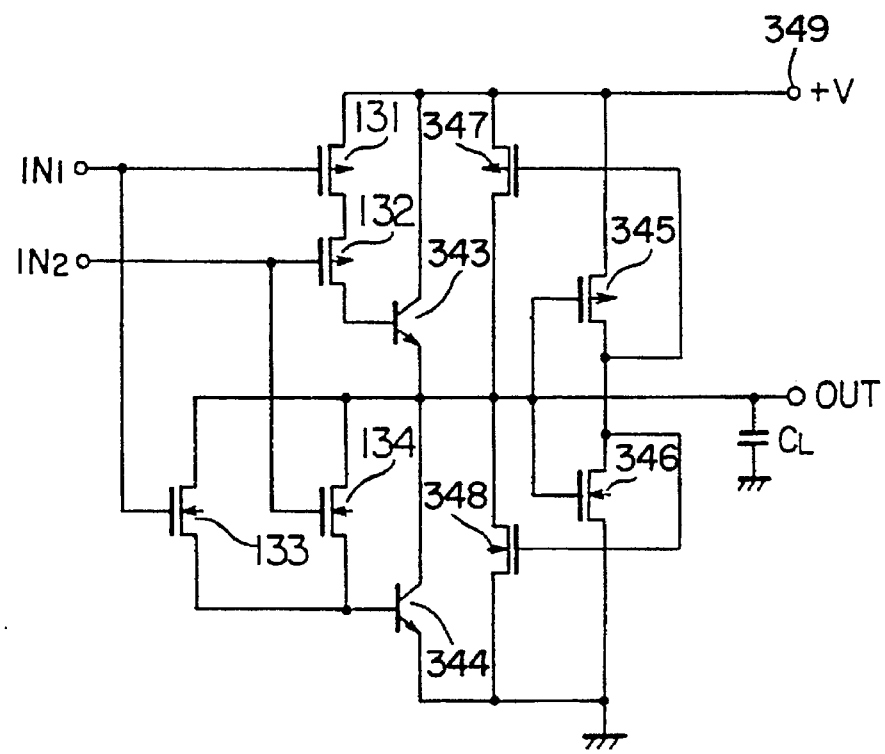
FIG. 91

DYNAMIC RANDOM ACCESS MEMORY HAVING BIPOLAR AND C-MOS TRANSISTOR

This is a continuation of application Ser. No. 08/391,537, filed Feb. 21, 1995 now U.S. Pat. No. 5,587,952; which is a continuation of application Ser. No. 08/035,272, filed Mar. 22, 1993 abandoned; which is a divisional of application Ser. No. 07/921,385 filed Jul. 30, 1992 abandoned; which is a continuation of application Ser. No. 07/308,680 filed Feb. 3, 1989 abandoned; which is a continuation-in-part of Ser. No. 06/803,673 filed Dec. 2, 1985 abandoned and Ser. No. 170,623 filed Mar. 17, 1988 now U.S. Pat. No. 4,813,020; which is a continuation of Ser. No. 06/825,939 filed Feb. 4, 1986 (now abandoned). This application is also related to application Ser. No. 07/764,769 filed Sep. 24, 1991 (now abandoned).

This application is a continuation-in-part of application Ser. No. 803,673, filed Dec. 2, 1985 and application Ser. No. 170,623, filed Mar. 17, 1988, which is a continuation of application Ser. No. 825,939, filed Feb. 4, 1986, now abandoned.

BACKGROUND OF THE INVENTION

The present invention relates to a semiconductor device, and, more particularly, to a composite circuit which is a combination of a MOS (metal-oxide-semiconductor) transistor and a bipolar transistor, or a MOS-drive bipolar-output logic circuit.

Further, the present invention relates to a dynamic semiconductor memory comprising a dynamic memory cell using an insulated-gate field effect transistor and storage capacitance in a memory cell, and a driving circuit using a bipolar transistor having particularly high drivability and high noise immunity and being suitable to obtain pulse output amplitude higher than the supply voltage and an insulated-gate field effect transistor. Further, the invention relates to a method of generating control signals within a chip so that the dynamic memory performs normal operations.

In a semiconductor memory, in order to achieve high speed and high density simultaneously, a memory cell is constituted by an insulated-gate field effect transistor (hereinafter referred to as an "MIS transistor"), and peripheral circuits for transmitting or receiving signals with the memory cell include a bipolar transistor. Examples of the above-mentioned constitution are disclosed in Japanese Patent Application Laid-Open No. 129994/1980 and No. 58193/1981. In these patents, a flip-flop composed of four MIS transistors and two load-devices is used in a memory cell, and a so-called static memory is constituted. Consequently, the area of the memory cell is relatively large and constitution at high density is difficult. On the other hand, as shown in FIGS. 1A and 1B, in a dynamic memory cell using between one and three MIS transistors and storage capacitance for storing information '1', '0' by the amount of the stored charges in the capacitance, the area of the memory cell is small and constitution at high density is favorable. In the semiconductor memory using the dynamic memory cell, however, since the memory cell does not have self reproduction capability of the stored information, read signals to the data line D must be amplified and then rewritten, and the potential of the data line D must be pre-charged to constant voltage before the reading. Consequently, in an actual dynamic memory, in order to perform a memory operation (e.g., read, write, hold), relatively complicated control is required in comparison to static memory arrangements. Accordingly, in the dynamic memory of the prior art, both the memory cell and the peripheral circuits are constituted using MIS transistors, and constitution is at high density but the speed is slow at the access time or the like.

On the other hand, Japanese Patent Application Laid-Open No. 75487/1984 describes that in a semiconductor memory where large current must be supplied to word line driving circuits such as a taper isolated dynamic RAM having a memory cell constituted by a MIS transistor with its drain/source connected between a bit line and a word line, use of a driving circuit comprising a bipolar transistor can achieve high density and high speed. Since the memory cell of the taper isolated dynamic RAM is constituted by one MIS transistor, it is favorable from the viewpoint of high density in comparison to the static RAM.

If the high density is further advanced holding the high speed, however, current flowing through the word line driving circuit increases and therefore the bipolar transistor used in the word line driving circuit must be of large size so as to hold high reliability, resulting in an increase of the chip area. Consequently, the merit of high density is deteriorated.

Further, Japanese Patent Application Laid-Open No. 25423/1984 discloses a driving circuit in the prior art. The driving circuit is shown in FIG. 1C, and operation and problems thereof will be described. The following description will be performed assuming that voltage Vss of a voltage supply 9 is 0 V. When voltage of an input terminal 1 is 0 V, a p-channel insulated gate field effect transistor 4 is turned on and current flows through the base of a first npn bipolar transistor 7 which is turned on. On the other hand, a second npn bipolar transistor 8 is not turned on because its base potential is 0 V. As a result, current flows through an output terminal 2, and potential of the output terminal 2 rises. The potential of the output terminal 2 becomes a value of voltage Vcc of a positive voltage supply 3 subtracted by base-emitter forward voltage $V_{BE}$ of the first npn bipolar transistor 7. If voltage of the input terminal 1 is changed to the positive supply voltage Vcc, since voltage of the output terminal 2 is $V_{cc}-V_{BE}$ at first, the n-channel insulated gate field effect transistor 6 is turned on and current flows through the base of the second npn bipolar transistor 8 so as to lower the potential of the output terminal. On the other hand, since the p-channel insulated gate field effect transistor becomes cut-off, base current of the first npn bipolar transistor 7 does not flow and the n-channel insulated gate transistor 5 is turned on, whereby charge stored in the base of the first npn bipolar transistor 7 is discharged by the n-channel insulated gate field effect transistor and the npn bipolar transistor 7 rapidly becomes cut-off. As a result, potential of the output terminal 2 is rapidly lowered. Then the potential of the output terminal 2 is determined by threshold voltage Vth of the n-channel insulated gate transistor 6 and base-emitter forward voltage $V_{BE}$ of the second npn bipolar transistor 8, and becomes $V_{BE}$+Vth. If the value becomes negative, the second npn bipolar transistor 8 is saturated and the high speed is deteriorated. Consequently, it is preferable that the value is set to become slightly positive taking into consideration variation in the manufacture condition of the semiconductor device, as described in the patent application.

The circuit in the prior art has a defect in that voltage amplitude of the output terminal cannot be made equal to the amount of the supply voltage. In order to eliminate the defect, flowing-in or flowing-out of current to the output terminal may be performed by insulated gate field effect transistors. In this case, in order to achieve the high speed in similar degree to that using the bipolar transistors, transistors having large channel length and width are required and therefore this method is unfavorable from the viewpoint of high density. As shown in FIG. 1D, either of the bipolar transistors may be displaced by an insulated gate field effect transistor as in the circuit constitution of Japanese Patent Application Laid-Open No. 35761/1973. Also in this case, however, it is clear that above-mentioned defect cannot be completely eliminated.

In summary, in the prior art arrangements, logical amplitude becomes small at the BiP side and the density is deteriorated at the MOS side.

Further in a circuit of the prior art as shown in FIG. 1C or FIG. 1D, if potential of the output terminal is abnormally varied, the variation cannot be absorbed. This aspect will be described referring to FIG. 1D. In FIG. 1D, assume that potential of the output terminal 11 is in a steady condition at a value of the voltage Vcc of the positive voltage supply 12 subtracted by the base/emitter forward voltage $V_{BE}$ of the npn bipolar transistor 15. Assume that abnormal potential variation is produced in the output terminal 11 by any cause. If the potential variation tends to lower the potential of the output terminal 11, the npn bipolar transistor 15 is turned on and the potential of the output terminal is restored. However, if the potential variation tends to raise the potential of the output terminal 11, the transistor 15 becomes cut-off. Furthermore, since the input terminal 10 is at 0 V, the N-channel insulated gate field-effect transistor 16 becomes cut-off and therefore the potential variation cannot be absorbed. Although the description has been performed regarding the case that the output terminal 11 is at high level, conditions are similar also in the case that the output terminal 11 is at low level. Furthermore, it is clear that a similar defect exists also in the circuit of FIG. 1C.

Accordingly, the above-described circuits in the prior art have defects in that the output amplitude is less than the amount of the supply voltage and potential of the output terminal is subject to variation.

A further discussion of the composite circuits which utilize a low power consumption of CMOS transistors and a high load drive capability of bipolar transistors will now be discussed.

One of those, which is shown in FIG. 72, is a circuit similar to one shown in FIG. 8 of the IEEE Transaction on Electron Devices, Vol. ED-16, No. 11, November 1969, page 950. In FIG. 72, numeral 301 denotes a PMOS transistor having a source thereof connected to a power supply +V, a gate thereof connected to an input terminal IN and a drain thereof connected to a base of an NPN transistor 303, and numeral 302 denotes an NMOS transistor having a drain thereof connected to an output terminal OUT, a gate thereof connected to the input terminal IN and a source thereof connected to a base of an NPN transistor 304. A collector of the NPN transistor 303 is connected to the power supply +V and an emitter thereof is connected to the output terminal OUT. A collector of the NPN transistor 304 is connected to the output terminal OUT and an emitter thereof is connected to a common potential point or a ground potential point GND.

The operation of the circuit is as follows. When the input terminal IN is at an "L" level, the NMOS transistor 302 is off and the NPN transistor 304 is also off. On the other hand, the PMOS transistor 301 is on and a base current is supplied to the NPN transistor 303 through the PMOS transistor 301. As a result, a charge current flows from the NPN transistor 303 to a load (not shown) and the output terminal OUT is switched to an "H" level. When the input terminal IN is at the "H" level, the PMOS transistor 301 is off and the NPN transistor 303 is also off. On the other hand, the NMOS transistor 302 is on and a base current is supplied to the NPN transistor 304 through the NMOS transistor 302 and the NPN transistor 304 is turned on. As a result, the charge stored in the load is discharged through the NPN transistor 304 and the output terminal OUT is switched to the "L" level. In this circuit, an output voltage level of the circuit is shifted by base-emitter voltages $V_{BEQ1}$ and $V_{BEQ2}$ of the NPN transistors 303 and 304. Thus, the "H" level is $(+V-V_{BEQ1})$ and the "L" level is $V_{BEQ2}$.

FIG. 302 shows a circuit similar to one disclosed in Japanese Patent Unexamined Publication No. 54-148469. In FIG. 73, numeral 305 denotes a PMOS transistor having a source thereof connected to a power supply +V, a gate thereof connected to an input terminal IN and a drain thereof connected to a junction point or node B of a base of an NPN transistor 307 and a base of a PNP transistor 308. Numeral 306 denotes an NMOS transistor having a drain thereof connected to said junction point, a gate thereof connected to the input terminal IN and a source thereof connected to a power supply −V. A collector of the NPN transistor 307 is connected to the power supply +V and an emitter thereof is connected to an output terminal OUT. An emitter of the PNP transistor 308 is connected to the output terminal OUT and a collector thereof is connected to the power supply −V.

In this circuit, an output voltage level is also shifted by base-emitter voltages $V_{BEQ1}$ and $V_{BEQ2}$ of the NPN transistor 307 and the PNP transistor 308. Thus, the "H" level is $(+V-V_{BEQ1})$ and the "L" level is $(-V+V_{BEQ2})$.

FIG. 74 shows a circuit similar to one disclosed in Japanese Unexamined Patent Application No. 52-26181. In FIG. 74, numeral 309 denotes a PMOS transistor having a source thereof connected to a power supply +V, a gate thereof connected to an input terminal IN and a drain thereof connected to a base of an NPN transistor 311. Numeral 310 denotes an NMOS transistor having a drain thereof connected to an output terminal OUT, a gate thereof connected to an input terminal IN and a source thereof connected to a power supply −V. A collector of the NPN transistor 311 is connected to the power supply +V and an emitter thereof is connected to the output terminal OUT.

In this circuit, an output voltage level is also shifted by base-emitter voltage $V_{BEQ1}$ of the NPN transistor 311. Thus, the "H" level is $(+V-V_{BEQ1})$ and the "L" level is −V.

In FIG. 75, numeral 312 denotes a symbol of a MOS-drive bipolar-output logic circuit having offsets at the output levels shown in FIGS. 72 to 74.

FIG. 76 shows a MOS-drive bipolar-output tri-state circuit 313 which is similar to the circuit of FIG. 20 disclosed in U.S. patent application Ser. No. 703,171 entitled "Arithmetic Operation Unit and Arithmetic Operation Circuit" filed Feb. 19, 1985 in the name of Hitachi, Ltd., based on Japanese Patent Applications Nos. 59-31257 filed on Feb. 20, 1984 and 60-2020 filed on Jan. 11, 1985. In the figure, numerals 314 and 315 denote series-connected PMOS transistors, a source of the PMOS 314 is connected to a power supply +V and a gate thereof is connected to an input terminal $\overline{E}$. A gate of the PMOS transistor 315 is connected to an input terminal IN and a drain thereof is connected to a base of a NPN transistor 318. Numerals 316 and 317 denote series-connected NMOS transistors. A drain of the NMOS transistor 316 is connected to an output terminal OUT and a gate thereof is connected to the input terminal IN. A gate of the NMOS transistor 317 is connected to an input terminal E and a source thereof is connected to a base of an NPN transistor 319. A collector of the NPN transistor 318 is connected to the power supply +V and an emitter thereof is connected to the output terminal OUT. A collector of the NPN transistor 319 is connected to the output terminal OUT and an emitter thereof is connected to a ground GND, a load capacitor $C_L$ is connected to the output terminal OUT.

This circuit is a tri-state logic circuit and the output level is shifted. The operation is as follows.

When the input terminal E is at the "L" level and the input terminal $\overline{E}$ is at the "H" level, the PMOS transistor 314 and the NMOS transistor 317 are off, and the NPN transistor 318 and the NPN transistor 319 are also off. As a result, the output terminal OUT is in a high impedance state regradless of the level of the input terminal IN.

When the input terminal E is at the "H" level and the input level $\overline{E}$ is at the "L" level, the NMOS transistor 317 and the PMOS transistor 314 are on. If the input terminal IN is at the "L" level, the PMOS transistor 315 and the NPN transistor 318 are on and the output terminal OUT is charged to (+V−$V_{BEQ1}$). If the input terminal IN is at the "H" level, the NMOS transistor 316 and the NPN transistor 319 are on and the output terminal OUT is discharged to +$V_{BEQ2}$. Thus, this circuit functions as an inverter having an output "H" level thereof shifted down by $V_{BEQ1}$ and an output "L" level thereof shifted up by $V_{BEQ2}$.

In FIG. 77, numeral 320 denotes a symbol of the circuit of FIG. 76.

The MOS-bipolar composite circuits described above are different from a CMOS transistor buffer circuit in that they can switch a large capacitive load at a high speed and the output voltage level is shifted by the base-emitter voltage $V_{BE}$ of the bipolar transistor.

However, when such an output voltage level shifted signal is used as a gate drive signal of a MOS switch, the MOS switch may not be completely turned off in a certain circuit. A typical MOS switch circuit in which such a problem may arise is a well-known clocked inverter shown in FIG. 78. A numeral 321 in FIG. 79 denotes a symbol of FIG. 78.

In FIG. 78, numeral 322 denotes a PMOS transistor having a source thereof connected to a power supply +V, a gate thereof connected to an input terminal IN and a drain thereof connected to a source of a PMOS transistor 323. A gate of the PMOS transistor 323 is connected to a clock terminal $\overline{\phi}$ and a drain thereof is connected to an output terminal OUT. Numeral 324 denotes an NMOS transistor having a drain thereof connected to the output terminal OUT, a gate thereof connected to a clock terminal $\phi$ and a source thereof connected to a drain of an NMOS transistor 325. A gate of the NMOS transistor 325 is connected to a common potential point GND, $C_s$ denotes connected to the input terminal IN and a source thereof a stray capacitance at the output terminal OUT.

The operation of this circuit is as follows. When $\phi$ is at the "H" level and $\overline{\phi}$ is at the "L" level, the PMOS transistor 323 and the NMOS transistor 324 are on. If the input terminal IN is at the "L" level, the NMOS transistor 325 is off and the PMOS transistor 322 is on, and the stray capacitance CS is charged through the PMOS transistors 322 and 323 so that the output terminal OUT assumes the "H" level. On the other hand, if the input terminal IN is at the "H" level, the PMOS transistor 322 is off and the NMOS transistor 325 is on, and the charge stored in the stray capacitor $C_s$ is discharged through the NMOS transistors 324 and 325 so that the output terminal OUT assumes the "L" level.

When $\phi$ is at the "L" level and $\overline{\phi}$ is at the "H" level, the PMOS transistor 223 and the NMOS transistor 324 are off. Thus, the level of the output terminal is held irrespective of the level of the input terminal IN. Thus, this circuit has a dynamic latch function.

However, when the clocks $\phi$ and $\overline{\phi}$ are supplied from the prior art composite circuit shown in FIGS. 72 to 74 or the composite circuit shown in FIG. 76 which is not prior art, the operation in the hold state is as follows. Let us assume that the power supply +V is 5 volts, the "H" levels of $\phi$ and $\overline{\phi}$ are 4.3 volts, the "L" levels thereof are 0.7 volt, the "H" level of the input terminal IN is 5 volts and the "L" level thereof is 0 volt.

When $\phi$=0.7 volt, $\overline{\phi}$=4.3 volt and the output terminal OUT is held at the "H" level, the PMOS transistor 323 and the NMOS transistor 324 conduct slightly because the gate-source voltages thereof are not completely zero. If the input terminal IN is at the "L" level, the NMOS transistor 325 is off and the PMOS transistor 322 is on. Therefore, the output terminal OUT is held at the "H" level. If the input terminal IN is at the "H" level, the NMOS transistor 325 is on and the charge stored in the stray capacitor $C_S$ is discharged through the slightly conducting NMOS transistor 324 and the on NMOS transistor 325. As a result, the output terminal OUT is switched from the "H" level to the "L" level. Similarly, when the output terminal OUT is held at the "L" level and the input terminal IN is at the "L" level, the NMOS transistor 325 is off and the PMOS transistor 322 is on. As a result, the charge stored in the stray capacitor $C_S$ is charged through the PMOS transistor 322 which is now in on state and the slightly conducting PMOS transistor 323 so that the output terminal OUT is switched from the "L" level to the "H" level.

Thus, in the prior art composite circuits, the output terminal OUT is not completely "L" level, that is, the level of the output terminal OUT does not completely reach the common potential or the lower potential of the power supply when the output terminal OUT is at the "L" level, and the output terminal OUT is not completely "H" level, that is, the level of the output terminal does not reach the higher potential of the power supply when the output terminal OUT is at the "H" level. This adversely affects to the succeeding stage circuit.

In a circuit shown in Japan Patent Unexamined Publication No. 59-205828 (FIG. 4 in particular), a logic circuit which is a composite circuit comprising MOS transistors and bipolar transistor and another logic circuit comprising MOS transistors and having the same function as the first logic circuit are connected in parallel so that the output signal level completely reach the "L" or "H" level. In this circuit, since an input capacitance is larger than that of a logic circuit which comprises only the composite circuit, an operation speed of a preceding circuit to drive the logic circuit is lower and hence an overall speed is reduced. Furthermore, in a multi-input buffer circuit, the number of elements required for the parallel MOS logic circuit increases in proportion to the number of inputs.

Reference may be made to U.S. patent application Ser. No. 680,495 filed Dec. 11, 1984 in the name of Hitachi, Ltd., and to Japanese Patent Unexamined Publication No. 59-205828.

SUMMARY OF THE INVENTION

In view of the above-mentioned disadvantages in the prior art, an object of the invention is to provide a semiconductor memory of high speed and large capacity.

It is an object of the present invention to provide a logic circuit or semiconductor device which is constructed by a composite circuit comprising MOS transistors and bipolar transistors and which is free from a level shift of an output signal, that is, in which the output signal is at a completely low level, or common potential or one of power supply voltages when the output signal is at an "L" level, and the output signal is at a completely high level, or the other power supply voltage when the output voltage is at an "H" level, and which can switch a large capacitive load at a high speed.

The invention relates to a method of generating control signals in a memory chip of a semiconductor memory composed of a dynamic memory cell and peripheral circuits including a bipolar transistor, and is directed to provide a dynamic semiconductor memory of large capacity and high speed.

In view of disadvantages in the above-mentioned circuit system in the prior art, another object of the invention is to provide a driving circuit which has the high driving capability of a bipolar transistor and which is immune from noise and can obtain amplitude larger than the supply voltage.

According to the invention, in a semiconductor memory comprising a memory cell for storing information and peripheral circuits in which signals are transmitted to or received from the memory cell, the memory cell to be used is a dynamic memory cell which may be constituted by a small number of MIS transistors and particularly can prevent large current from flowing therein through word lines. The peripheral circuits are constituted to include bipolar transistors, whereby high-speed operation and large capacity can be achieved.

Further in accordance with the present invention a semiconductor device is provided having at least one MOS transistor, at least one bipolar transistor adapted to be driven by said MOS transistor, and an output terminal connected to a collector of an emitter of said bipolar transistor. A logical inverter receives a signal at said output terminal and an MOS transistor is provided having a source and a drain thereof parallelly connected across the collector and the emitter of said bipolar transistor. The MOS transistor is adapted to be turned on and off by an output signal of said logical inverter means so that a level-shiftless output is produced.

Further in the invention, the load driving can be performed concurrently by a bipolar transistor and an insulated gate field-effect transistor. Thus, the bipolar transistor performs the high-speed driving, the insulated gate field-effect transistor puts the output terminal at a low-impedance state and provides the immunity from noise, and the output amplitude is obtained without being restricted by the base-emitter forward voltage $V_{BE}$ of the bipolar transistor.

Further according to the invention, an external chip select signal ($\overline{CS}$ in FIG. 2) is used, whereby driving signals suitable for a dynamic memory or control signals of peripheral circuits are generated. In the following description, the chip select signal $\overline{CS}$ is used for controlling, and it is assumed that when the signal is at high potential the device is at a stand-by state or precharge state, and when the signal is at low potential it performs reading or writing. Regarding the name and the polarity of the control signal, even if it is specified to any state, a remedy here is possible by simple changing. Input/output interface is ECL unless otherwise specified. Changing from ECL to TTL is possible by simply changing the input buffer/output buffer and the polarity of the supply voltage.

Further according to the invention, in order to achieve a semiconductor memory of large capacity and high speed, a dynamic semiconductor memory including bipolar transistors at peripheral circuits is provided. That is, dynamic memory cells composed of one or a small number of insulated gate transistors and storage capacitance are used as memory cells to store information, and bipolar transistors are used in peripheral circuits to transmit signals to or receive signals from the memory cell whereby the read/write operation is performed at high speed and high sensitivity.

In accordance with still another aspect of the present invention, there are provided logical inverting means connected to an output terminal of a composite circuit comprising MOS transistors and bipolar transistors driven by the MOS transistors for inverting a level of an output signal, and MOS transistors each having a source and a drain thereof connected in parallel between a collector and an emitter of a corresponding one of the bipolar transistors in the output stage of the composite circuit and adapted to be turned on and off by the output signal of the logical inverting means. When the bipolar transistors conduct with voltage drops corresponding to base-emitter voltages, they are completely conducted by the MOS transistors.

In the present invention, the term complete "L" level means the common potential or one of the power supply voltages, and the term complete "H" level means the other power supply voltage.

Other and further objects, features and advantages of the invention will appear more fully from the following description.

BRIEF DESCRIPTION OF THE DRAWINGS

FIG. 88 shows a ninth embodiment of the present invention;

FIG. 89 shows a symbol for the circuit of FIG. 88;

FIG. 90 shows a tenth embodiment of the present invention;

FIG. 91 shows a symbol for the circuit of FIG. 90;

DETAILED DESCRIPTION OF THE INVENTION

In the present specification and claims, terms "input terminal", "output terminal" and "terminal" are defined as electrical connecting terminals including junction points of patterns on an integrated circuit device.

Embodiment 1

Figure 2:
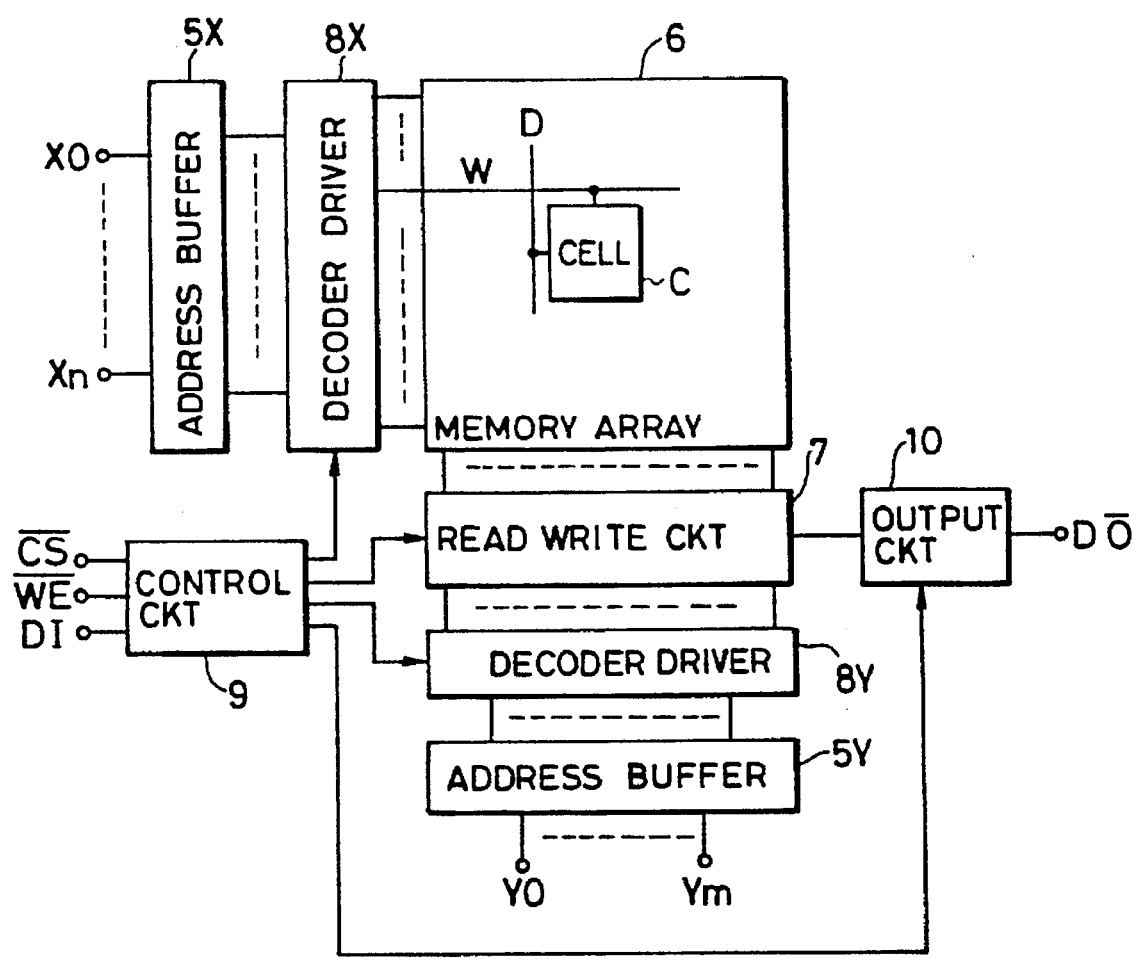
FIGS. 2–11 are diagrams illustrating a first embodiment of the invention.

FIG. 2 is a block diagram of an N-bit dynamic semiconductor memory as a first embodiment of the invention, wherein a dynamic memory cell is composed of MIS transistors used as memory cells so as to achieve high capacity, and bipolar transistors are used in peripheral circuits to receive signals from or transmit signals to the memory cell so as to achieve high speed. In FIG. 2, peripheral circuits including a memory cell array 6 of N bits and bipolar transistors are shown. In the memory cell array 6, word lines W of i in number and data lines D of j in number are crossed to each other, and memory cells C are arranged at N points among the cross-points between the word lines W and the data lines D. Address inputs $X_0$-Xn, $Y_0$-Ym are inputted to address buffer circuits 5X, 5Y respectively, and outputs of the circuits 5X, 5Y are transferred to decoder/driver circuits 8X, 8Y. Among the decoder/driver circuits 8X, 8Y, circuit 8X drives the word line W, and circuit 8Y drives the write/read circuits 7. Thereby information is written into a selected memory cell C within the memory array or read out of the memory cell C. Numeral 9 designates a write/read control circuit which controls the decoder/driver circuits 8X, 8Y, the write/read circuit 7 and an output circuit 10 by the chip select signal $\overline{CS}$, the write control signal $\overline{WE}$ and the input signal $\overline{DI}$. The output circuit 10 is a circuit to output information outward which is read by the write/read circuit 7. A part of the write/read circuit 7 may be disposed at an end of the memory cell array 6 on an opposite side from the decoder/driver circuit 8Y as hereinafter described so that control signals from the decoder/driver circuit 8Y are controlled through the memory cell array 6. In FIG. 2, although address inputs $X_0$-Xn in X-system and address inputs $Y_0$-Ym in Y-system are inputted through separate input terminals, a system that these input terminals are made common and the address inputs are inputted at the time difference, which is the so-called 'address multiplexing configuration', may be adopted. In the following description, the external interface is emitter coupled logic (hereinafter referred to as "ECL") level unless otherwise specified. However, the invention can be applied also to transistor transistor logic (hereinafter referred to as "TTL").

Figure 1A:
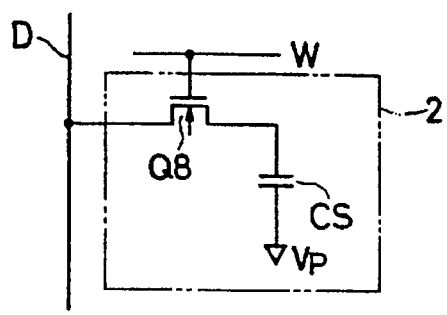
FIGS. 1A–1D are circuit diagrams illustrating circuits in the prior art.
Figure 1B:
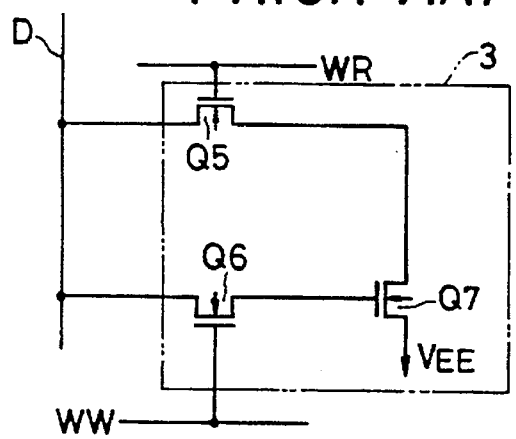
Figure 1C:
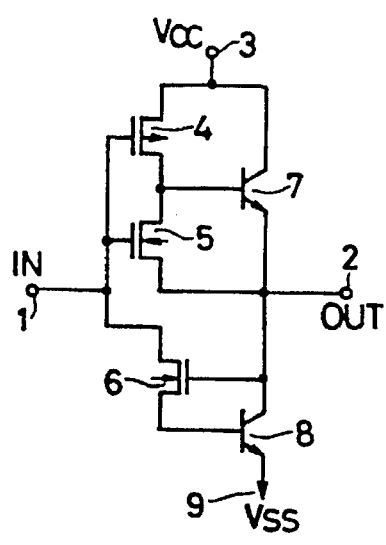
Figure 1D:
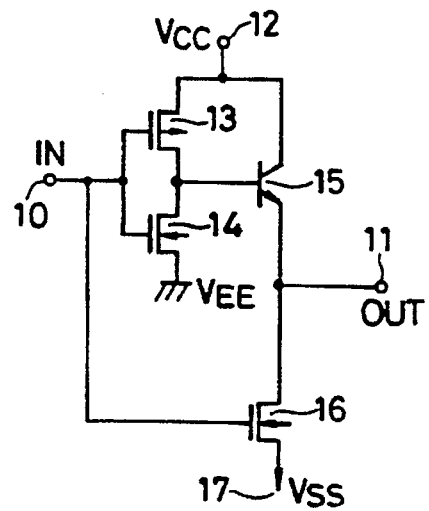

The supply voltage is $V_{EE}$ ($\cong$ −5.2 V) at ECL and $V_{cc}$ (<+5 V) at TTL. In the following embodiment,although a dynamic memory cell having one MIS transistor shown in FIG. 1A is used as memory cell C, the invention is not limited to using this type of memory cell but can be applied also to a dynamic memory cell where a word line is connected to gate of MIS transistors, for example, a memory cell using three MIS transistors as shown in FIG. 1B. These memory cells have been used in a dynamic semiconductor memory constituted by MIS transistors including peripheral circuits. The memory cell as shown in FIG. 1A, FIG. 1B may be constituted using a P-channel MIS transistor.

The write/read circuit 7 and the output circuit 10 among the above-mentioned circuits will now be described specifically.

First, a sense circuit 11 and the output circuit 10 shown in FIG. 3A, FIG. 3B will be described. The sense circuit 11 together with a write circuit 12 as hereinafter described constitutes the write/read circuit 7, and performs information read operations and re-write operations as hereinafter described. The sense circuit 11 is constituted by sub-sense circuits 11S each installed per a pair of data lines D, $\overline{D}$ in the memory cell array 6. In the sub-sense circuit 11S, symbol HP designates a precharge circuit, symbol SA1 a first differential amplifier, and symbol SA2 a second differential amplifier. Output of the sub-sense circuit 11S is transferred through output lines O, $\overline{O}$ grounded by resistors R3, R4 to the output circuit 10 including bipolar transistors. FIG. 3B shows a constitution example of the output circuit 10 in FIG. 3A. N-channel MIS transistors Q17, Q19 in the first differential amplifier SA1 have been called a sense amplifier, and P-channel MIS transistors Q16, Q18 have been called an active restore circuit. These are a sort of amplifier and therefore generally called the first differential amplifier SA1 here.

Next, the read operation by the sense circuit 11 and the output circuit 10 shown in FIG. 3A, FIG. 3B will be described referring to FIG. 4. Before starting the read operation, potential of the line H for charging and the line L for discharging both connected to the first differential amplifier SA1 set to potential to turn the MIS transistors Q16–Q19 off, e.g., $\frac{1}{2} V_{EE}$ thereby the first differential amplifier SA1 is turned off, and the precharge signal $\phi p$ is set to high level whereby the precharge circuit HP is activated. As a result, the N-channel MIS transistors Q11, Q12, Q13 are turned on by the precharge signal $\phi p$, whereby a pair of data lines such as $D_0$, $\overline{D}_0$ or $D_1$, $\overline{D}_1$ are shortcircuited and at the same time the potential is set to the precharge voltage $V_H$. The precharge voltage $V_H$ is specified to a value of about a half of the negative supply voltage $V_{EE}$. If the chip select signal $\overline{CS}$ becomes low level and the read operation is started, the chip select signal $\overline{CS}$ is detected and the precharge signal $\phi p$ is lowered thereby the precharge circuit HP is turned off, and the word line $W_0$ and the Y-select signal $\phi_{y0}$ selected by the address signals $X_0$-Xn, $Y_0$-Ym are transferred to high level. Then non-select word lines which are not shown in FIG. 3A and the Y-select signals such as $\phi Y1$ of non-select pair of data lines D1, $\overline{D}_1$ are set to low level. If potential of the word line $W_0$ becomes high level, the MIS transistors Q8 of all memory cells 2 (FIG. 1A) connected to the line $W_0$ are turned on, and charge flows between the capacitance $C_S$ and the data line to which the memory cells 2 are connected whereby the potential of the data line slightly varies. Noticing the pair of data lines $D_0$, $\overline{D}_0$, as a result of above-mentioned situation, potential of the data line $D_0$ varies and potential of the data line $\overline{D}_0$ remains to be the precharge voltage $V_H$. For example, if potential of high level (0 V) is stored in the capacitance $C_S$ of the memory cell connected to the data line $D_0$ and the word line W0, the potential of the data line $D_0$ becomes a little higher than that of the line $\overline{D}_0$ as shown in solid line of FIG. 4. As a result, current flowing through the resistor R4 (FIG. 3A) to the MIS transistor Q21 of the second differential amplifier SA2 becomes more than current flowing through the resistor R3 to the MIS transistor Q22, whereby potential of the output line $\overline{O}$ becomes lower than that of the output line O. Then the second differential amplifier SA2 connected to non-select pairs of data lines other than the pair of data lines Do, $\overline{D}o$ does not act, because the Y-select signal such as $\phi Y1$ is at low level. Voltage difference produced between the output lines O, $\overline{O}$ is transferred to the output circuit 10 shown in FIG. 3B, and voltage difference is produced at the base of the bipolar transistors Q50, Q51. The potential of the output lines O, $\overline{O}$ is lowered respectively by means of the bipolar transistor Q50, the diode QD1 and the bipolar transistor Q51, the diode QD2 in twice of the base-emitter forward voltage $V_{BE}$, i.e., about 1.6 V, and then applied to the base of the bipolar transistors Q52, Q53. Since the potential of the output line O is higher than that of the output line $\overline{O}$, the bipolar transistor Q52 is turned on and the bipolar transistor Q53 is turned off. Thus current by a constant current source $I_3$ flows mainly through the bipolar transistor Q52, and base potential of the bipolar transistor Q54 rises so that a high level voltage is outputted to the output DO. In the output circuit 10, the input voltages are lowered by means of the bipolar transistors Q50, Q51 and the diodes QD1, QD2, so as to prevent the bipolar transistors Q52, Q53 from saturating. By these bipolar transistors Q50, Q51, capacitance of the metals 26, 27 is reduced to about the reciprocal of the dc current gain $h_{FE}$ of the bipolar transistor as the load of the second differential amplifier SA2. This promotes the high speed and increases the degree of freedom of the layout. In the output circuit 10, detection of the voltage difference of the output lines O, $\overline{O}$ is performed by the bipolar transistors Q52, Q53. Thus the voltage difference produced between the output lines O, $\overline{O}$ can be detected among as small a voltage difference as several tens mV and then outputted. Since a bipolar transistor is used as output transistor Q54, the large driving capability can be easily obtained. Although the read operation has been described regarding so-called "1-read" where high level is outputted to the output DO, the condition is similar to "0-read" where a low level is outputted to the output DO as shown in broken lines in FIG. 4. If the output circuit 10 is slightly changed, potential of the output DO can be controlled during the stand-by or during the write operation as hereinafter described using signals of the control circuit 9 shown in FIG. 2. Further, so-called dummy cells may be installed per each data line, of course, so that noise by coupling with the data line during the word line rising is reduced and the signal amount is equalized at "0-read" and "1-read". The precharge circuit HP may be constituted by the P-channel MIS transistor by suitably setting the precharge signal φp and the precharge voltage $V_H$. The memory cell 2 as shown in FIG. 1A is used in the embodiment. In such a memory cell, as is known well, the re-write operation is required after the read operation. In other words, if the word line potential is transferred to high level in the read operation, the memory cell capacitance $C_S$ and the data line are shortcircuited in all memory cells connected to the word line, whereby the potential of the memory cell $C_S$ varies. Consequently, the potential of the memory cell capacitance $C_S$ must be restored in order to hold the storage information. Consequently, the small voltage difference produced between the pair of data lines is amplified regarding all pairs of data lines, and the data line potential at the higher side is transferred to 0 V and that at lower side is transferred to $V_{EE}$, thereby the potential of the memory cell capacitance $C_S$ shortcircuited by the data line may be restored. In the embodiment, the re-write operation is performed by the first differential amplifier SA1. That is, in FIG. 4, after the small voltage difference is produced between the pair of data lines, the line H for charging connected to the first differential amplifier SA1 is driven to 0V and the line L for discharging is driven to $V_{EE}$ by the driving circuits 15, 16 (FIG. 3A). Among a pair of P-channel MIS transistors Q16, Q18 to constitute the flip-flop, mutual conductance gm of the P-channel MIS transistor with gate connected to the data line at lower side is larger than that of the P-channel MIS transistor with gate connected to the data line at higher side. Further among a pair of N-channel MIS transistors Q17, Q19 to constitute the flip-flop, mutual conductance gm of the N-channel MIS transistor with gate connected to the data line at higher side is larger than that of the N-channel MIS transistor with gate connected to the data line at lower side. Accordingly, current flows into the data line at higher side from the line H for charging, and current flows out of the data line at lower side through the line L for discharging. As a result, the small voltage difference produced between the pair of data lines is amplified, thereby the difference of the mutual conductance is increased. Thus when the data line potential at higher side attains to 0 V and the data line potential at lower side attains to $V_{EE}$, the re-write operation is finished. Since the first differential amplifier SA1 is constituted by the MIS transistors, it has the small area and therefore the layout between the pair of data lines is easy. Furthermore, since the data lines are charged by the P-channel MIS transistors Q16, Q18 and discharged by the N-channel MIS transistors Q17, Q19, potential of the data lines may be amplified fully to the supply voltage irrespective of the threshold voltage of the MIS transistors. Consequently, level of re-write to the memory cell capacitance $C_S$ becomes high and the apparatus becomes immune from soft error due to α-particles. When the re-write operation is finished, since the potential at one of the pair of data lines becomes 0 V, voltage higher than the threshold voltage $V_{TH}$ of the MIS transistors may be applied to gate of the MIS transistor Q21 or Q22 connected to the non-select data line and to the node connected to the output line depending on how the second differential amplifier SA2 is designed. In this case, increase of the capacitance of the output lines O, $\overline{O}$ may adversely affect the read operation. Then the resistors R3, R4 and the second differential amplifier SA2 may be designed so that the potential of the output lines O, $\overline{O}$ is not lowered over the threshold voltage $V_{TH}$ of the MIS transistors Q21, Q22.

As above described, in the embodiment, the two differential amplifiers are installed per pair of the data lines, and the first differential amplifier SA1 performs the re-write operation and the second differential amplifier SA2 reads information to the output circuit 10 through the output lines O, $\overline{O}$. In the output circuit 10, the voltage difference read to the output lines O, $\overline{O}$ as above described can be detected at high sensitivity and high speed by the bipolar transistors and then outputted. Accordingly, the output DO can be obtained through the second differential amplifier SA2 before the first differential amplifier SA1 for the re-write operation finishes. As shown in FIG. 2, since the pair of data lines are connected to gate of the MIS transistors Q21 and Q22 in the second differential amplifier SA2, current does not flow to the second differential amplifier SA2 through the data lines. Even if the second differential amplifier SA2 is started before the starting of the differential amplifier SA1, the data line potential does not vary and there is no fear of the error of the first differential amplifier SA1. If the word line remains to be at high level and the Y-select signal such as $φ_{YO}$, $φ_{Y1}$ to start the second differential amplifier is changed, information from the pair of data lines connected to the second differential amplifier which is newly started can be read in the output lines O, $\overline{O}$. Consequently, if the word line remains to be at high level and the Y-select signal is changed, information of the memory cell connected to the word line can be read continuously. That is, the page mode operation or the static column mode operation as known well can be performed.

Figure 5:
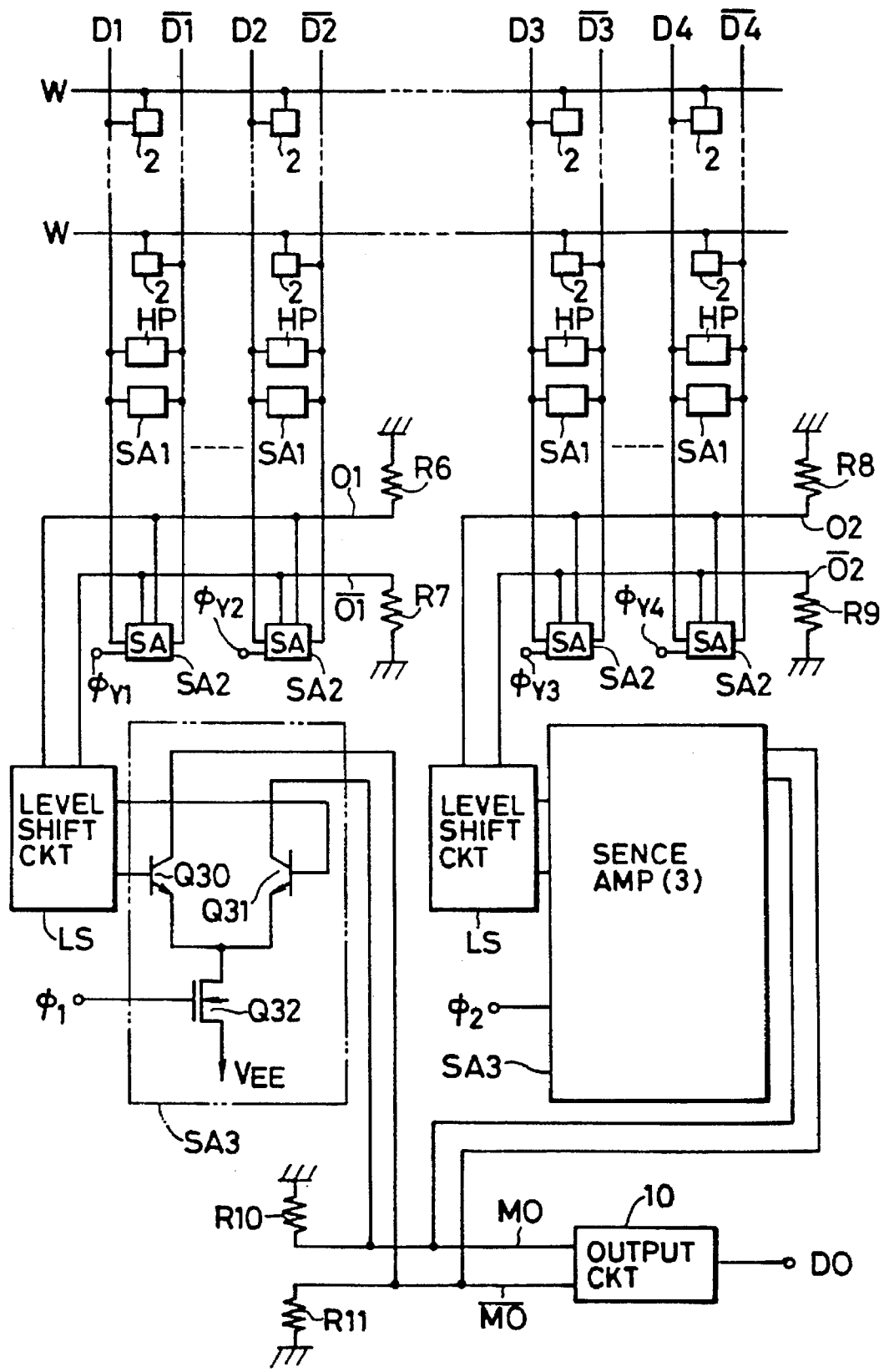

The output circuit 10 shown in FIG. 3B acts if the voltage difference produced between the output lines O, $\overline{O}$ by the second differential amplifier SA2 attains to about several tens mV. However, requirement to increase the voltage difference between the output lines O, $\overline{O}$ to some degree may occur depending on characteristics of the bipolar transistor of the output circuit. In order to achieve this without loss of speed, as shown in FIG. 5, a third differential amplifier SA3 including bipolar transistors may be installed per plural data lines. In FIG. 5, the output lines O1, $\overline{O1}$ or O2, $\overline{O2}$ are connected to the output circuit 10 through the level shift circuit LS and the third differential amplifier SA3 installed per plural pair of data lines. Further in FIG. 5 the level shift circuit LS serves to equally lower the potential of the output lines O1, $\overline{O1}$ or O2, $\overline{O2}$ so that the bipolar transistors Q30, Q31 of the third differential amplifier SA3 are not saturated. The third differential amplifier SA3 is controlled by signal $\phi1$, or $\phi2$ applied to gate of the MIS transistor Q32. For example, when the memory cell connected to the pair of data lines D1, $\overline{D1}$ is selected and $\phi_{Y1}$, $\phi_1$ are transferred to high level, information from the memory read as voltage difference between the output lines O1, $\overline{O1}$ is transmitted to the output circuit 10 by the third differential amplifier. Also when information read in the data line D3, $\overline{D3}$ is transmitted to the output circuit 10, $\phi_{Y3}$ and $\phi_2$ may be transferred to high level. According to above-mentioned constitution, even when the voltage difference required for input of the output circuit 10 is large, the read operation at high speed can be performed by the third differential amplifier SA3 constituted by the bipolar transistors. Since the output lines O, $\overline{O}$ are installed per plural data lines, parasitic capacitance due to the output lines connected to the second differential amplifier SA2 can be reduced.

Figure 3A:
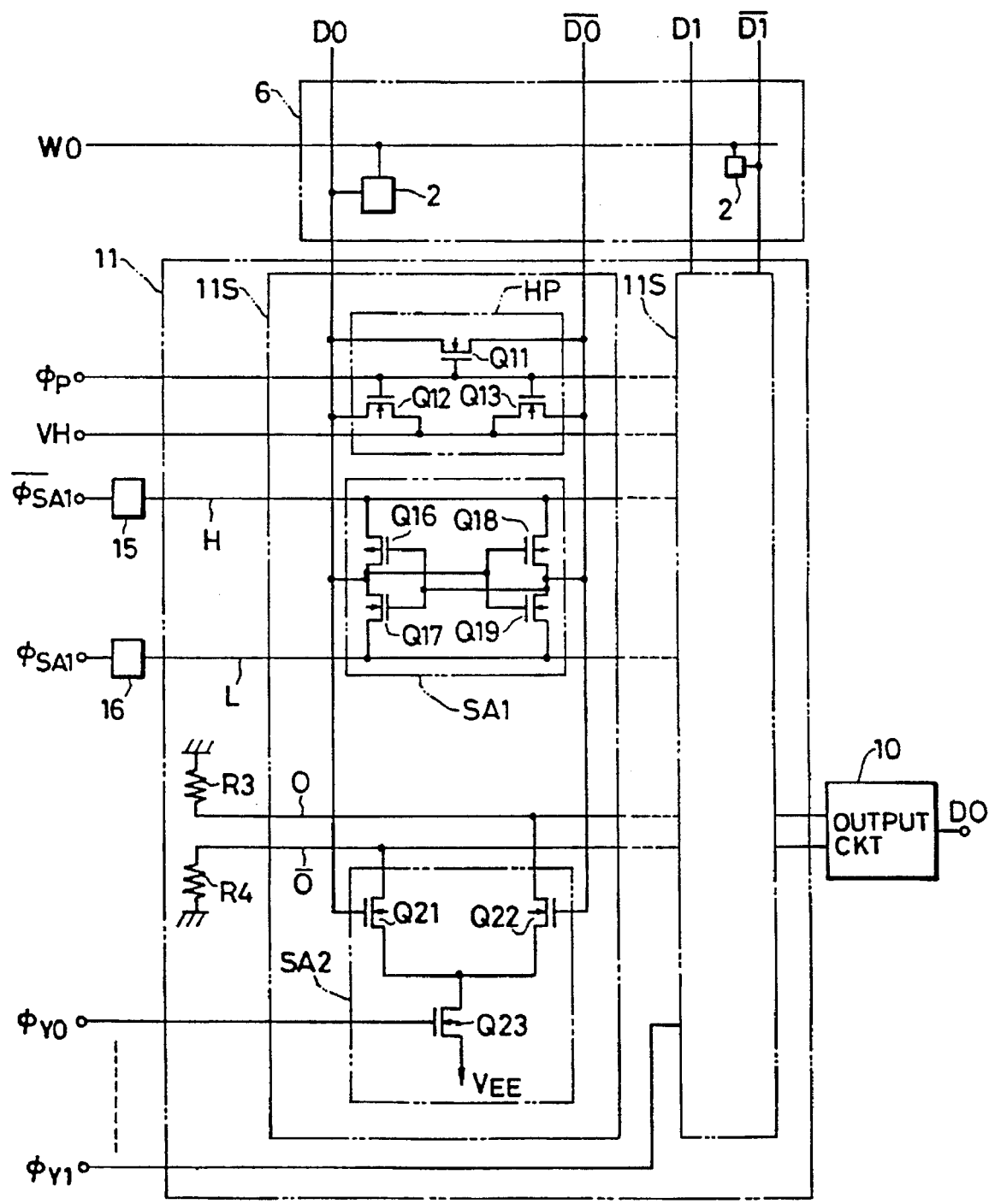
Figure 3B:
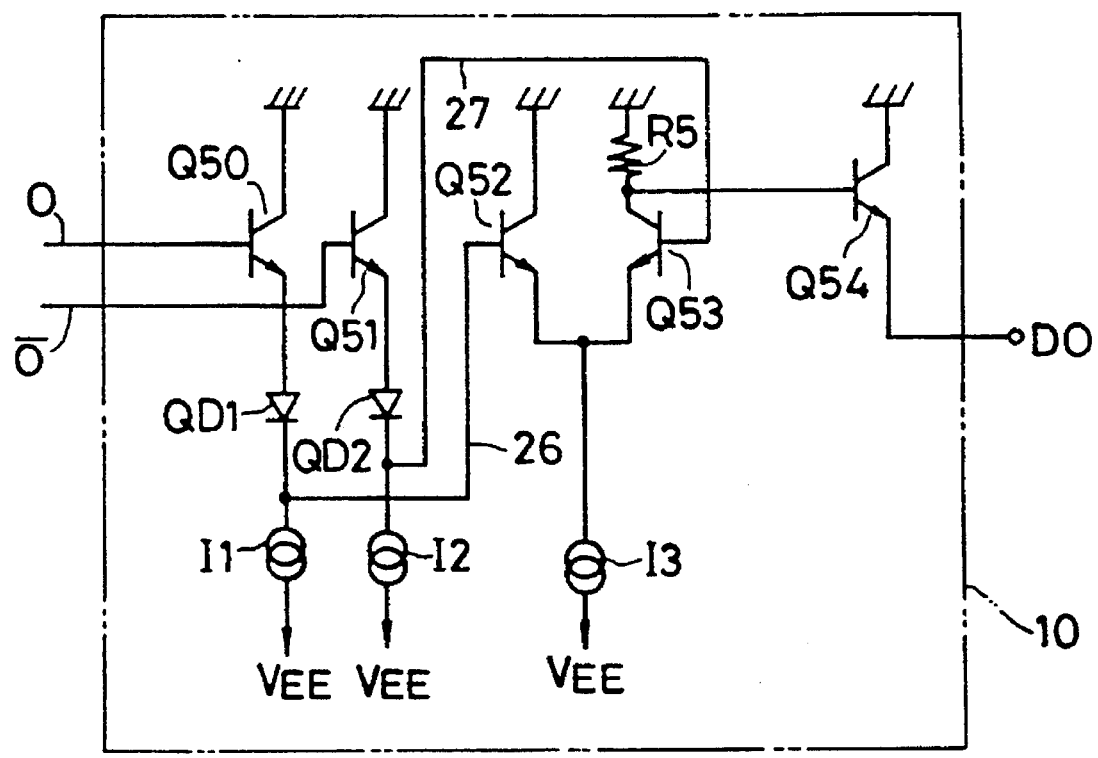
Figure 4:
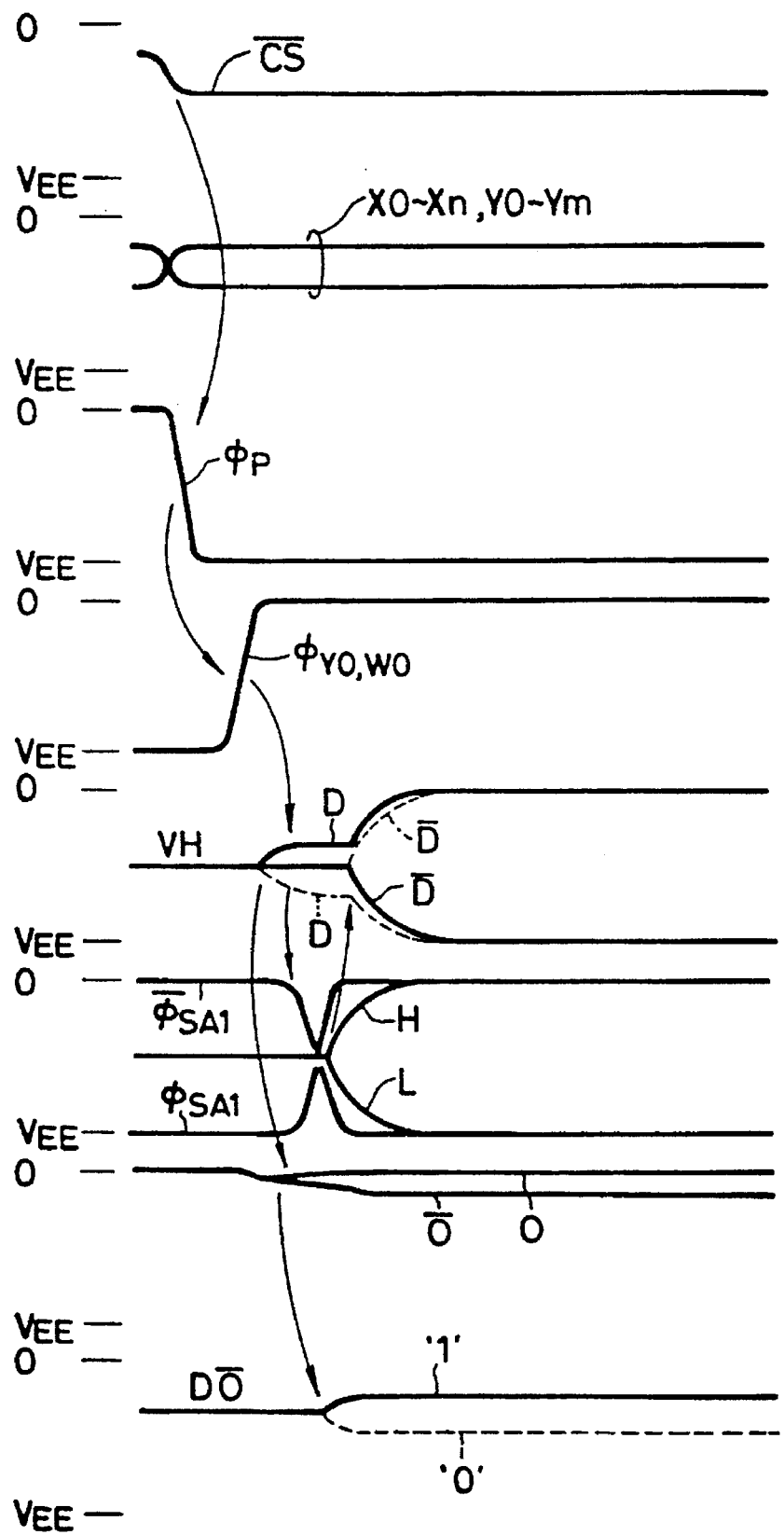
Figure 6:
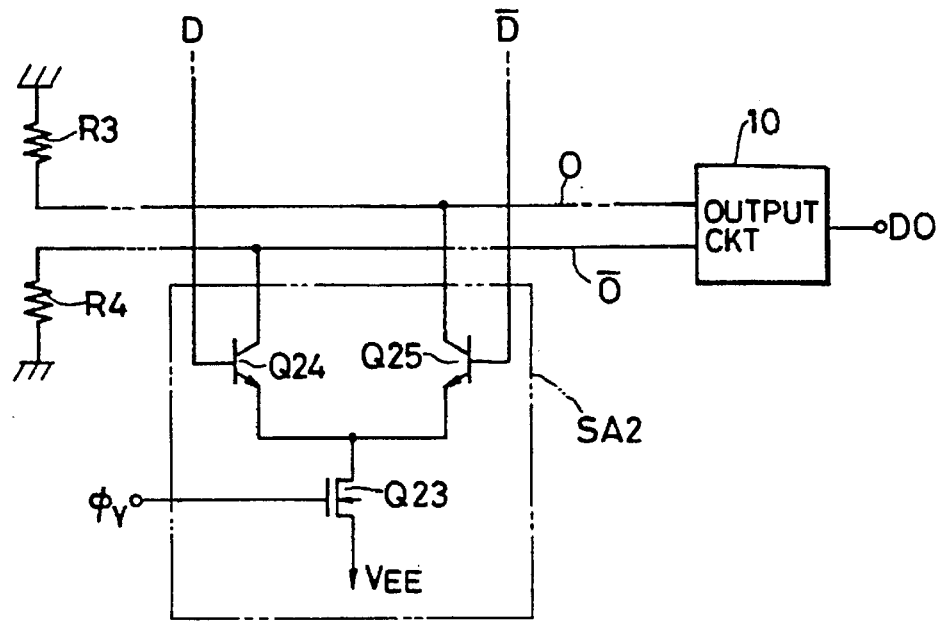

In FIG. 3A, the second differential amplifier is constituted by the MIS transistors. However, the second differential amplifier may be constituted to include bipolar transistors as shown in FIG. 6, if it can be enclosed within the data line pitch. If a pair of data lines are connected directly to base of the bipolar transistors as shown in FIG. 6, the voltage difference of the data lines can be detected more sensitively. However, being different from the case of connection to gate of the MIS transistor, base current of the bipolar transistor must be supplied from the data line. Since the base current cannot be sufficiently supplied by the stored charge of the memory cell, when the first differential amplifier SA1 is started and the supplying of the base current becomes possible, the second differential amplifier SA2 must be started. If the saturation of the bipolar transistors Q24, Q25 causes trouble, the level shift circuit may be installed in the data lines D, $\overline{D}$.

Figure 7:
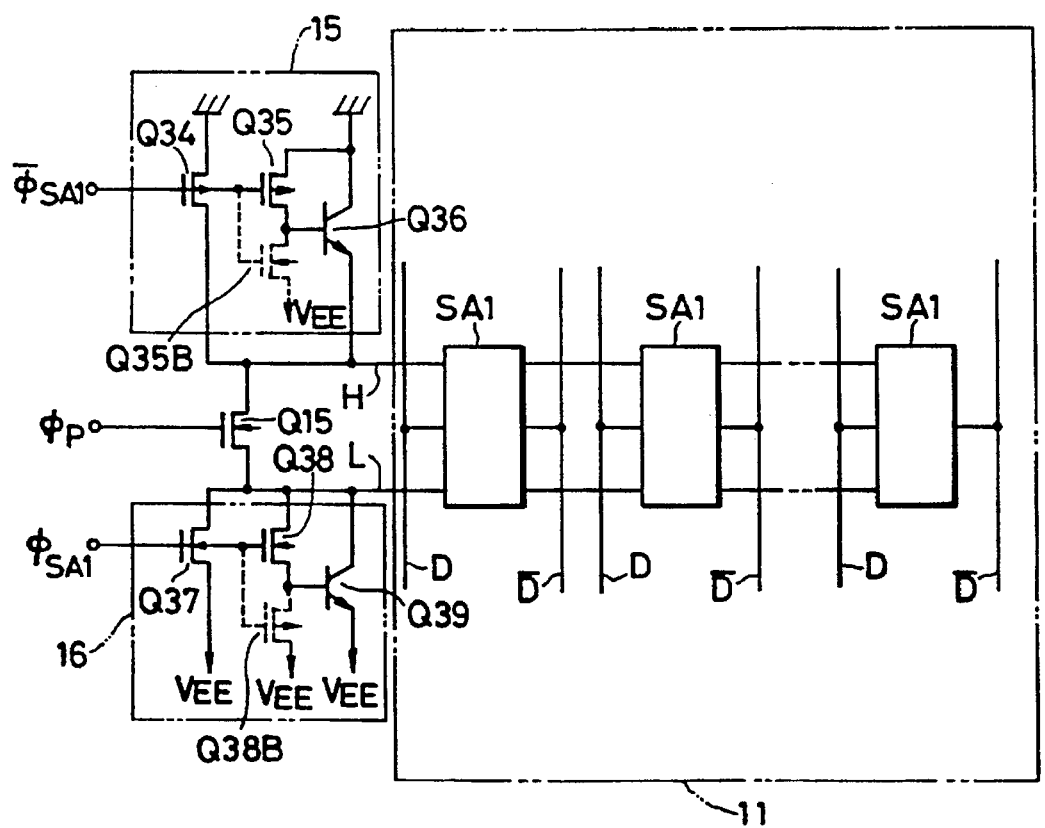

FIG. 7 shows a constitution example of the driving circuits 15, 16 of the first differential amplifier SA1 in FIG. 3A. In FIG. 7, the line H for charging is grounded through the P-channel MIS transistor Q34 and the bipolar transistor Q36, and the line L for discharging is connected through the N-channel MIS transistor Q37 and the bipolar transistor Q39 to the negative supply voltage $V_{EE}$. The MIS transistors Q35, Q38 for base current controlling are connected to base of the bipolar transistors Q36 and Q39 respectively. Since the precharge signal $\phi p$ is at high level before the read operation as shown in FIG. 4, the line H for charging and the line L for discharging are shortcircuited by the N-channel MIS transistor Q15, thereby potential of the line H for charging and the line L for discharging becomes about ½ $V_{EE}$ and the first differential amplifier SA1 does not act then. The driving signal $\overline{\phi SA1}$ is set to high level and the driving signal $\phi SA1$ is set to low level, and the MIS transistors Q34, Q37 and the bipolar transistors Q36, Q39 are made cut-off. Accordingly, even if the line H for charging and the line L for discharging are shortcircuited, the through current does not flow to the supply voltage $V_{EE}$. When the read operation is started and the precharge signal $\phi p$ becomes low level and potential of the selected word line becomes high level thereby the small voltage difference is produced between the pair of data lines, the driving signal $\overline{\phi SA1}$ is transferred to low level and the driving signal $\phi SA1$ is transferred to high level. As a result, the P-channel MIS transistors Q34 and Q35 are turned on, and current flows from the line H for charging to the data line at a higher level through the bipolar transistor Q36 and the MIS transistor Q34. Also the N-channel MIS transistors Q37 and Q38 are turned on, and current flows from the data line at a lower level through the line L for discharging to the negative supply voltage. Thus the voltage difference between the pair of data lines is amplified by the first differential amplifier SA1. Among the pair of data lines D, $\overline{D}$, the data line at a higher level attains to 0 V and that at a lower level attains to $V_{EE}$. In the driving circuits 15, 16 shown in FIG. 7, since the MIS transistor and the bipolar transistor are arranged in parallel, the data line can be charged or discharged at high speed by the bipolar transistor, and final potential of the data line can be made equal to the supply voltage by the MIS transistor. Furthermore, the bipolar transistor having large driving capability is used, thereby the apparatus can be constituted at the small area in comparison to constitution by the MIS transistor only. The storage charge at base of the bipolar transistors Q36 and Q39 may degrade the operation speed. In this case, the N-channel MIS transistor Q35B and the P-channel MIS transistor Q38B shown by broken line may be added. Drain of the N-channel MIS transistor Q38 may be grounded so as to increase the base current of the bipolar transistor Q38. In this case, the bipolar transistor Q39 may be saturated. However, the saturation can be prevented by inserting of a resistor in the base, suitable selection of the mutual conductance gm of the MIS transistor Q38, or suitable selection of potential of the drain of Q38 between the negative supply voltage $V_{EE}$ and 0V.

Figure 8:
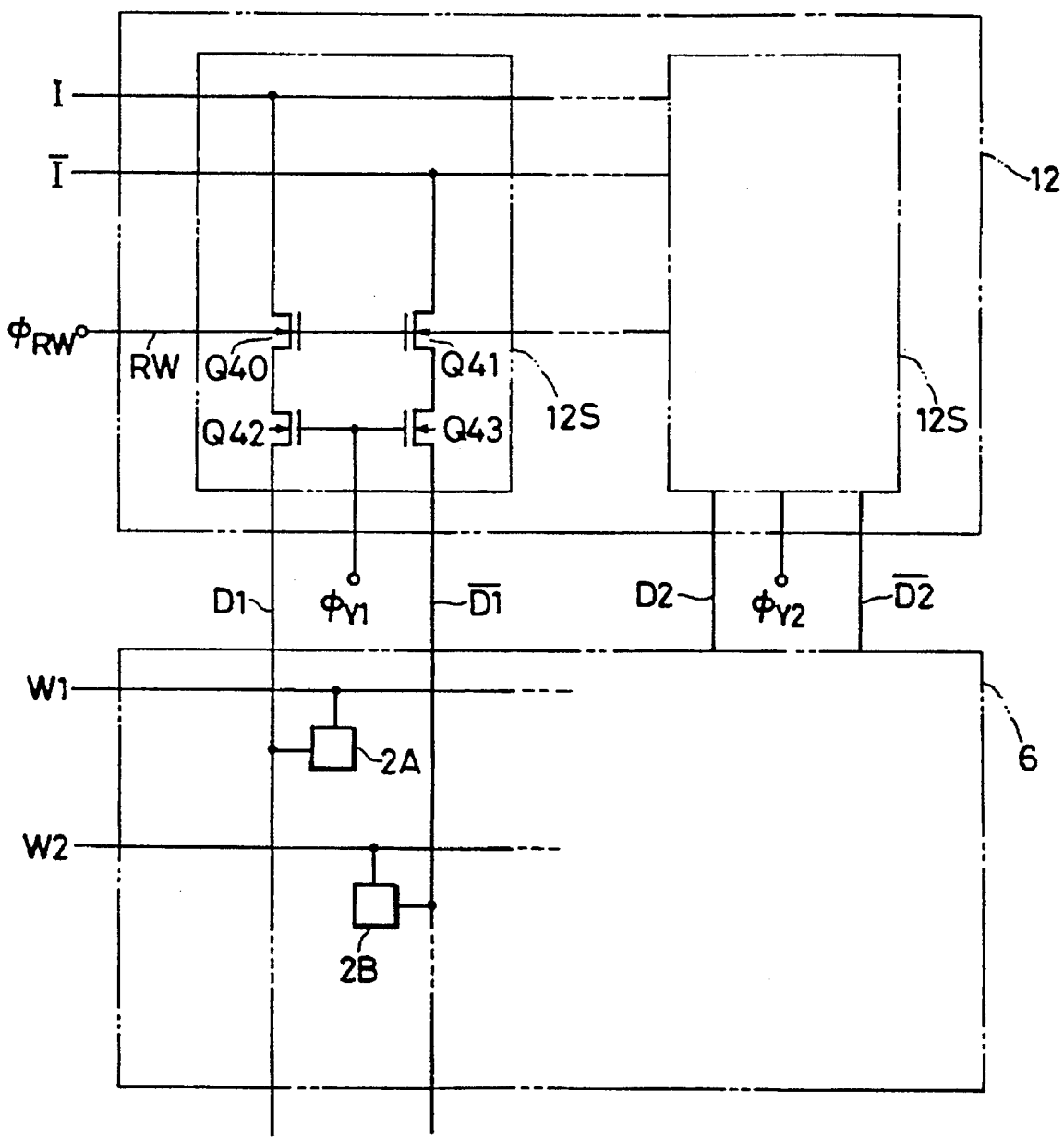
Figure 9:
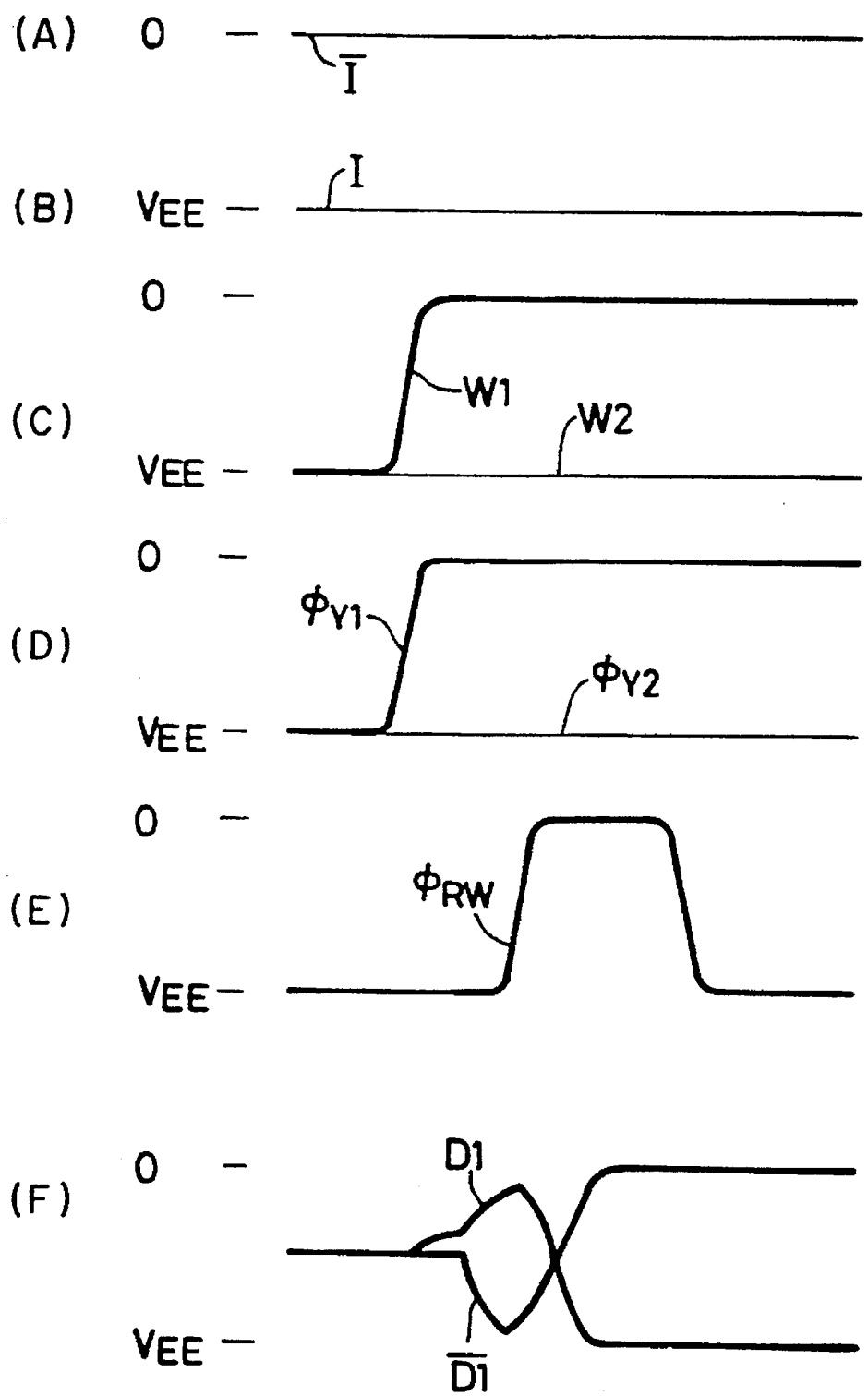

FIG. 8 shows a constitution example of the write circuit 12. The write circuit 12 is composed of a first input line I connected to the data lines D1, D2, a second input line $\overline{I}$ connected to the data lines $\overline{D1}$, $\overline{D2}$, and MIS transistors Q40–Q43 connected in series to a pair of data lines. When information stored in the memory cell 2A connected to the word line W1 and the data line D1 is rewritten from "1" into "0" operation of the write circuit 12 will be described referring to FIG. 9. When information "0" is written, potential of the write line I is made $V_{EE}$ and that of the line $\overline{I}$ is made 0 V. In this state, the read operation is started. If the read operation is started and potential of the word line W1 is transferred to high level, the voltage difference is produced between a pair of data lines and amplification of the voltage difference is started by the first differential amplifier. Then the write signal $\phi RW$ is transferred to high level. As a result, potential of the pair of data lines D1, $\overline{D1}$ is transferred through the write lines I, $\overline{I}$ to low level and high level respectively, and the potential of the data line D1 is transferred to the memory cell 2A thereby the low level, i.e., "0" is written in the memory. In above-mentioned operation, even if the write signal $\phi RW$ is transferred to high level, since the Y-select signal such as $\phi Y2$ for the pair of data lines D2, $\overline{D2}$ with the no-select memory cell connected thereto is at low level, transistors corresponding to the MIS transistors Q42, Q43 connected to the data lines are cut off and therefore information is not written into the non-select memory connected to the word line W1. The write signal $\phi RW$ is made by external control signal $\overline{WE}$ for write operation. The generating method of the signal φRW is known well and the description shall be omitted. In an example of write operation shown in FIG. 9, although operation of the first differential amplifier SA1 is started and then the write signal φRW is transferred to high level, timing of the signal φRW may be made earlier if necessary. Furthermore, if the write signal φRW and the selected word line remain to be at high level and the Y-select signal is changed, the write operation can be performed continuously to the memory cells connected to one word line. In this case, of course, the potential of the write lines I, $\bar{I}$ is changed corresponding to information to be written.

Figure 10:
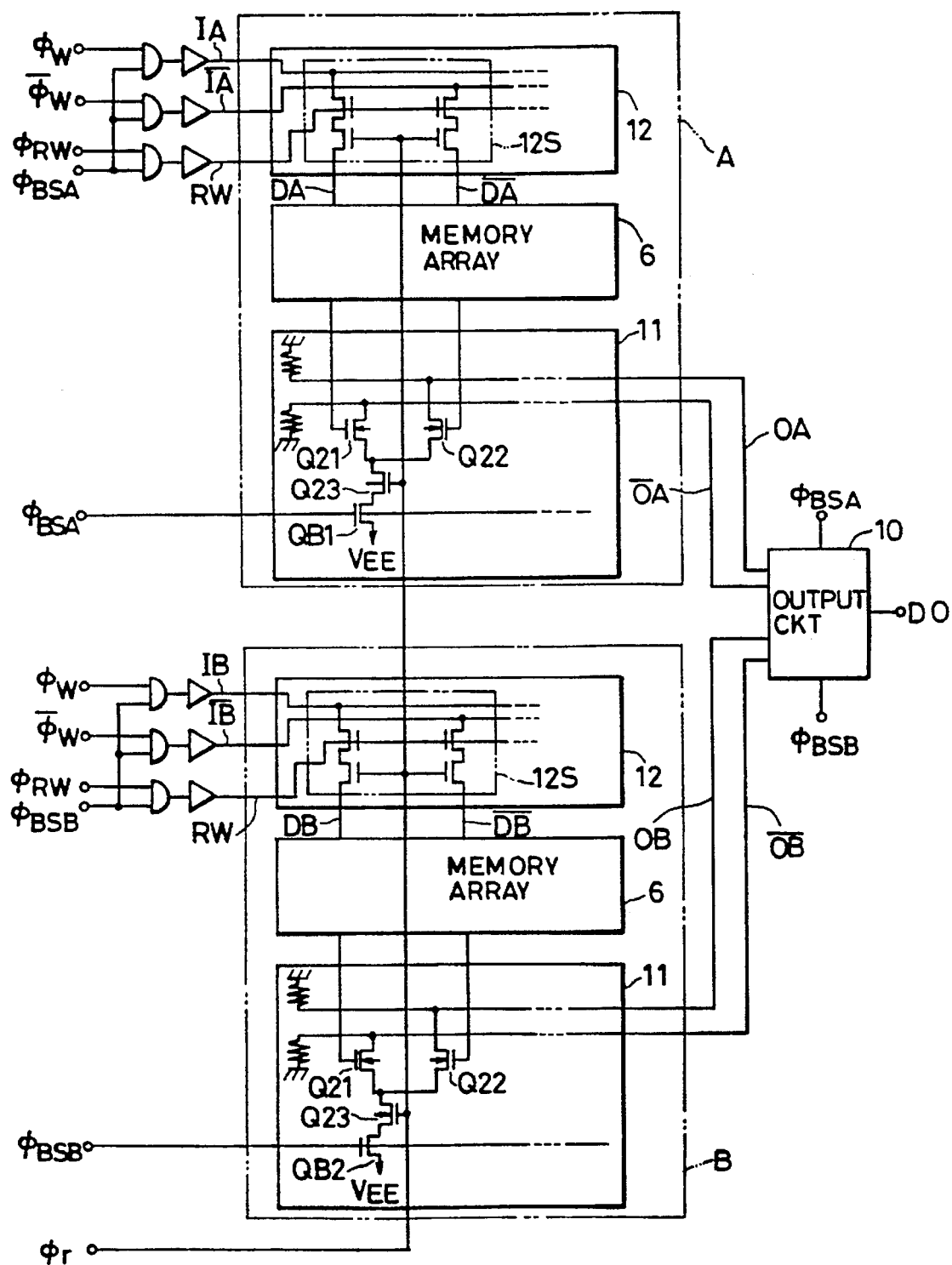
Figure 11:
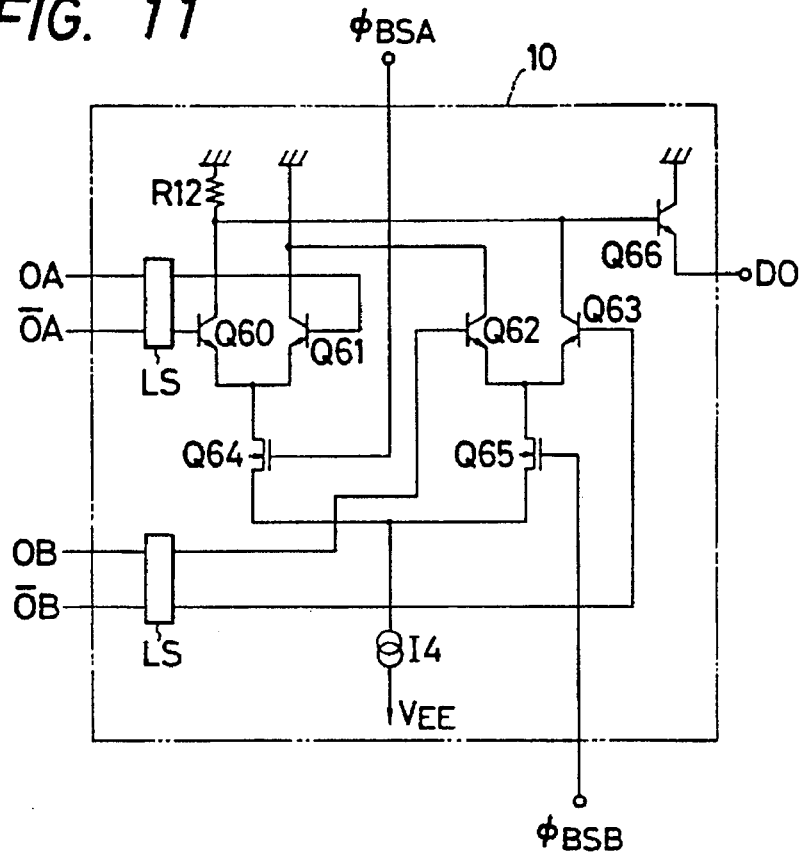

As above described, the dynamic memory cell constituted by MIS transistors is used as memory cell, and peripheral circuits in which signals are transmitted to or received from the memory cell are constituted to include bipolar transistors, thereby a semiconductor memory of large capacity and high speed can be achieved. However, if the storage capacity is made significantly large, the data line becomes long and therefore the data line parasitic capacitance increases. As known well, the signal voltage Vsig read into the data line immediately before the amplification is proportional to $C_S/(C_S+C_D)$, wherein the memory cell capacitance is made $C_S$ and the data line parasitic capacitance is made $C_D$. Enlargement of the memory cell capacitance $C_S$ to compensate the enlargement of the data line parasitic capacitance $C_D$ is usually limited from the viewpoint of the integration. Consequently, as the data line parasitic capacitance $C_D$ increases, the signal voltage Vsig decreases. If the signal voltage Vsig decreases, not only the reliability is deteriorated but also the initial voltage difference inputted to the second differential amplifier SA2 decreases and the read performance speed is degraded. Furthermore, increase of the data line parasitic capacitance $C_D$ may cause increase of the re-write operation time by the first differential amplifier SA1. Problems accompanied with the increase of the data line parasitic capacitance $C_D$ have been pointed out also in a conventional semiconductor memory. In order to solve the problems, an effective system is proposed wherein the memory cell arrays are separately installed in the data line direction and the data lines are shared. System to share the data lines can be applied also to the dynamic semiconductor memory including bipolar transistors in the peripheral circuits according to the invention. FIG. 10 and FIG. 11 show a constitution example. In FIG. 10, the memory cell array is divided into two sub-arrays in the data line direction, and each of the sub-arrays is provided with the write circuit 12 and the sense circuit 11 thereby two blocks A and B are constituted. The output lines OA, $\overline{OA}$, OB, $\overline{OB}$ from each block are inputted to the output circuit 10 shown in FIG. 11. When the write operation or the read operation is performed, the Y-select signal φY passing through the array is concurrently applied to the write circuits 12S and the first differential amplifiers SA1 in a pair of data limes of the block A and a pair of data lines of the block B respectively. Which block should be selected is controlled by the block select signals $\phi_{BSA}$ and $\phi_{BSB}$ generated from the address signals. In the write operation, the write signal $\phi_{RW}$ and the input line driving signals $\phi_W$, $\bar{\phi}_W$ are applied to the write circuit 12 after the AND logic with the block select signals $\phi_{BSA}$ and $\phi_{BSB}$. In order to perform the write operation to the memory cell of the pair of data lines in the block A among pairs of data lines to which the Y-select signal $\phi_Y$ is applied, the block select signal $\phi_{BSA}$ may be made high level and the signal $\phi_{BSB}$ be made low level. In order to select the block B, the signal $\phi_{BSB}$ may be made high level and the signal $\phi_{BSA}$ be made low level. In the read operation, the N-channel MIS transistor is installed between the MIS transistor Q23 of the second differential amplifier SA2 and the negative supply voltage $V_{EE}$, and either of the second differential amplifiers SA2 is operated by the block select signal. For example, if the block select signal $\phi_{BSA}$ is made high level and the signal $\phi_{BSB}$ is made low level, the differential amplifier SA2 in the block A only is operated among the two differential amplifiers SA2 selected by $\phi_Y$ and the voltage difference is read into the output lines OA, $\overline{OA}$. The voltage difference read into the output lines OA, $\overline{OA}$ or OB, $\overline{OB}$ is transferred to the output circuit 20 in FIG. 11. In the output circuit 20, either of pairs of output lines from the two blocks is selected by the N-channel MIS transistors Q64, Q65 and then outputted. For example, if the block select signal $\phi_{BSA}$ is made low level and the signal $\phi_{BSB}$ is made high level, the MIS transistor Q64 is turned off and the transistor Q65 is turned on, thereby the voltage difference of the output lines OB, $\overline{OB}$ is amplified by the bipolar transistors Q62, Q63. In FIG. 11, symbol LS designates a level shift circuit for preventing bipolar transistor saturation. The level shift circuit LS serves to lower the potential of the output lines OA, $\overline{OA}$ and OB, $\bar{B}$ without varying the voltage difference. The level shift circuit LS can be readily constituted using bipolar transistors in similar manner to the circuit of FIG. 3B that potential of the output lines O, $\overline{O}$ is lowered. Bipolar transistors may be used in place of the MIS transistors Q64, Q65. In this case, level of $\phi_{BSA}$, $\phi_{BSB}$ must be changed so as not to saturate the bipolar transistors.

In the embodiment as above described, the load resistor may be replaced by the MIS transistor, and other various modifications are possible. Also in the embodiment, potential of the data line is set to about half of the supply voltage, i.e., about ½ $V_{EE}$, before information is read into the data line. This system is effective to reduce the dissipation power. However, the invention can be applied also to system where potential of the data line is set to the positive supply voltage (0 Vin ECL, and Vcc in TTL) as used in a dynamic semiconductor memory in the prior art. It is understood that various modifications may be made without departing from the spirit and scope of the invention.

According to the invention as above described, among the dynamic memory cells which can be constituted by a small number of MIS transistors, a memory cell is used which does not have a large current flowing in through the word line,and peripheral circuits are constituted to include bipolar transistors, whereby the area of the memory array is reduced, the large capacity is easily achieved, and the high-speed operation is possible utilizing the high driving capability and small signal detecting capability of bipolar transistors.

Figure 12:
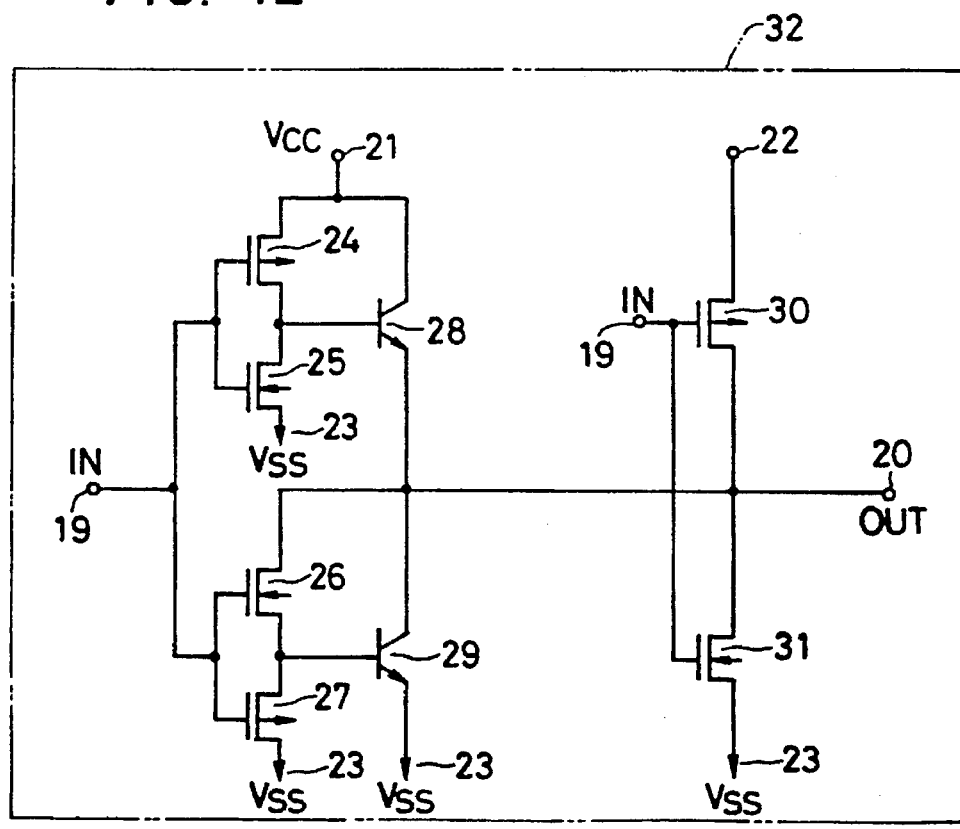
FIGS. 12–22 are diagrams illustrating driving circuits of the invention.

Driving circuits will now described referring to the accompanying drawings. FIG. 12 shows constitution of an example. In FIG. 12, collector of a first npn bipolar transistor 28 and source of a first P-channel insulated gate field-effect transistor 24 are connected to a positive voltage supply 21, drain of the first P-channel insulated gate field-effect transistor 24 and drain of a first N-channel insulated gate field-effect transistor 25 are connected to base of the first npn bipolar transistor 28, gate of the first P-channel insulation gate field-effect transistor 24 and gate of the first N-channel insulated gate field-effect transistor 25 are connected to an input terminal 19, source of the first N-channel insulated gate field-effect transistor 25 is connected to a negative voltage supply 23, collector of a second npn bipolar transistor 29 and drain of a second N-channel insulated gate field-effect transistor 26 are connected, source of the second N-channel insulated gate field-effect transistor 26 and source of a second P-channel insulated gate field-effect transistor 27 are connected to base of the second npn bipolar transistor 29, drain of the second P-channel insulated gate field-effect transistor 27 and emitter of the second npn bipolar transistor 29 are connected to the negative voltage supply 23, gate of the second N-channel insulated gate field-effect transistor 26 and gate of the second P-channel insulated gate field-effect transistor 27 are connected to the input terminal 19, drain of a third P-channel insulated gate field-effect transistor 30 and drain of a third N-channel insulated gate field-effect transistor 31 are connected, source of the third N-channel insulated gate field-effect transistor 31 is connected to the negative voltage supply 23, gate of the third P-channel insulated gate field-effect transistor 30 and gate of the third N-channel insulated gate field-effect transistor 31 are connected to the input terminal 19, input terminals of respective circuits are connected into the common input terminal 19, and emitter of the first npn bipolar transistor 28, collector of the second npn bipolar transistor 29, drain of the third P-channel insulated gate field-effect transistor 30 and drain of the third N-channel insulated gate field-effect transistor 31 are connected to a common output terminal 20.

Operation of the circuit in FIG. 12 will be described. To simplify the description, it is assumed that potential $V_{SS}$ of the voltage supply terminal 23 is 0 V and the terminal 22 is connected to the position voltage supply 21. When potential of the input terminal 19 is 0 V, the P-channel insulated gate field-effect transistors 24 and 27 are turned on, and the N-channel insulated gate field-effect transistors 25 and 26 are turned off. As a result, the first npn bipolar transistor 28 is turned on because current is supplied to base from the voltage supply 21, and the second npn bipolar transistor 29 is turned off because base charges flow to $V_{SS}$ through N-channel FET 26. On the other hand, since base charges flow to base of the second npn bipolar transistor 29 through the N-channel insulated gate field-effect transistor 26, the npn bipolar transistor 29 is turned on whereby the potential of the output terminal 20 is lowered. Then, since the third N-channel insulated gate field-effect transistor 30 is also turned on, the potential of the output terminal 20 is cooperatively raised by the first npn bipolar transistor 28 and the third P-channel insulated gate field-effect transistor 30, until it beocmes $V_{cc}$-$V_{BE}$. The potential of the output terminal 20 is subsequently raised to the voltage positive supply 21 subtracted by the base-emitter forward voltage $V_{BE}$ of the first npn bipolar transistor 28. And then it rises to the potential $V_{cc}$ of the terminal 22 by the P-channel insulated gate field-effect transistor 30.

Figure 13:
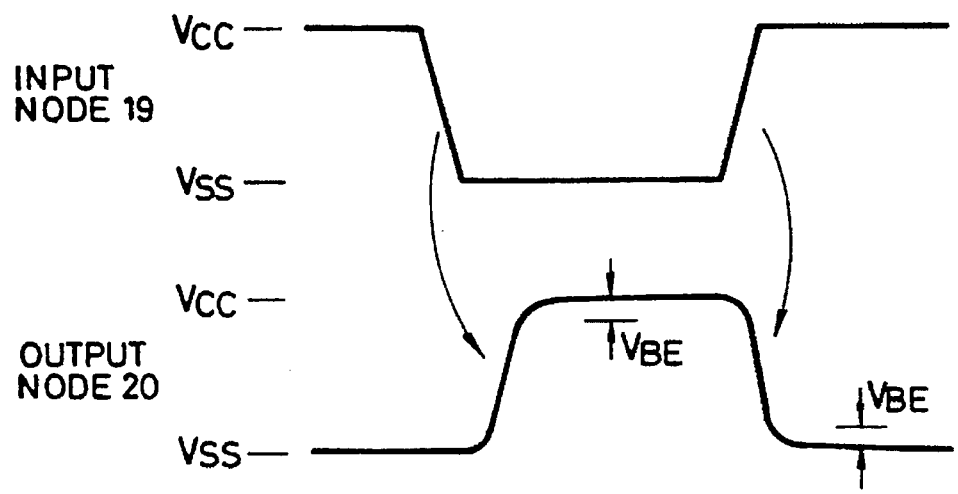

If the voltage of the input terminal 19 is changed to the positive supply voltage $V_{cc}$, the first, second and third P-channel insulated gate field-effect transistors 24, 27, 30 are turned off. The first, second and third N-channel insulated gate field-effect transistors 25, 26, 31 are turned on. As a result, base current of the first npn bipolar transistor 28 does not flow, and charge stored in the base is discharged by the N-channel insulated gate field-effect transistor 25, thereby the npn bipolar transistor 28 rapidly becomes cut-off. On the other hand, since base current flows to base of the second npn bipolar transistor 29 through the N-channel insulated gate field-effect transistor 26, the npn bipolar transistor 29 is turned on thereby the potential of the output terminal 20 is lowered. Then, since the third N-channel insulated gate field-effect transistor 31 is also turned on, the potential of the output terminal 20 is cooperatively lowered by the second npn bipolar transistor 29 and the second N-channel insulated gate field-effect transistor 31, until it becomes the base/emitter forward voltage $V_{BE}$ of the second npn bipolar transistor 29. The potential of the output terminal 20 is subsequently lowered by the third N-channel insulated gate field-effect transistor 31 until it attains to potential 0 V of the terminal 23. FIG. 13 shows input/output waveforms in the above-mentioned operation. When the potential of the output terminal 20 attains to potential of the terminal 22 or voltage $V_{SS}$ and becomes the steady state, either the P-channel insulated gate field-effect transistor 30 or the N-channel insulated gate field-effect transistor 31 is turned on. Consequently in this state, the potential of the output terminal 20 is immune from variation by noise. In this example, the same input signal is applied to gate of the N-channel and P-channel insulated gate field-effect transistors 24, 25, 26, 27, 30 and 31. However, input signals having the time difference may be applied if necessary. In this case, the time difference must be set so that voltage higher than the emitter-base breakdown voltage $BV_{EB}$ is not applied between emitter and base of the npn transistor 28 and large current does not flow from the terminal 21 or the terminal 22 to the negative voltage supply 23. Since the base emitter forward voltage $V_{BE}$ of the npn bipolar transistor 29 is applied to source of the P-channel insulated gate field-effect transistor 27, voltage applied between gate and source of the transistor 27 becomes about 0.8 V at most. When the high speed is required, in order that the P-channel insulated gate field-effect transistor 27 is sufficiently turned on, a depletion type insulated gate field-effect transistor may be used. When the P-channel insulated gate field-effect transistor 27 is made depletion type, however, the number of manufacturing processes may be increased resulting in the high cost. In this case, if it is allowed that the operation speed becomes slightly slow, the P-channel insulated gate field-effect transistor 27 may be omitted, thereby reduction of the number of used elements achieves the cost-down and the high density. Furthermore, in this example, although the npn bipolar transistors are used as bipolar transistors 28, 29 and the P-channel and N-channel transistors are used as insulated gate field-effect transistors 30, 31, type of these transistors may be changed by changing the circuit constitution if necessary without departing from the spirit of the invention.

Figure 14:
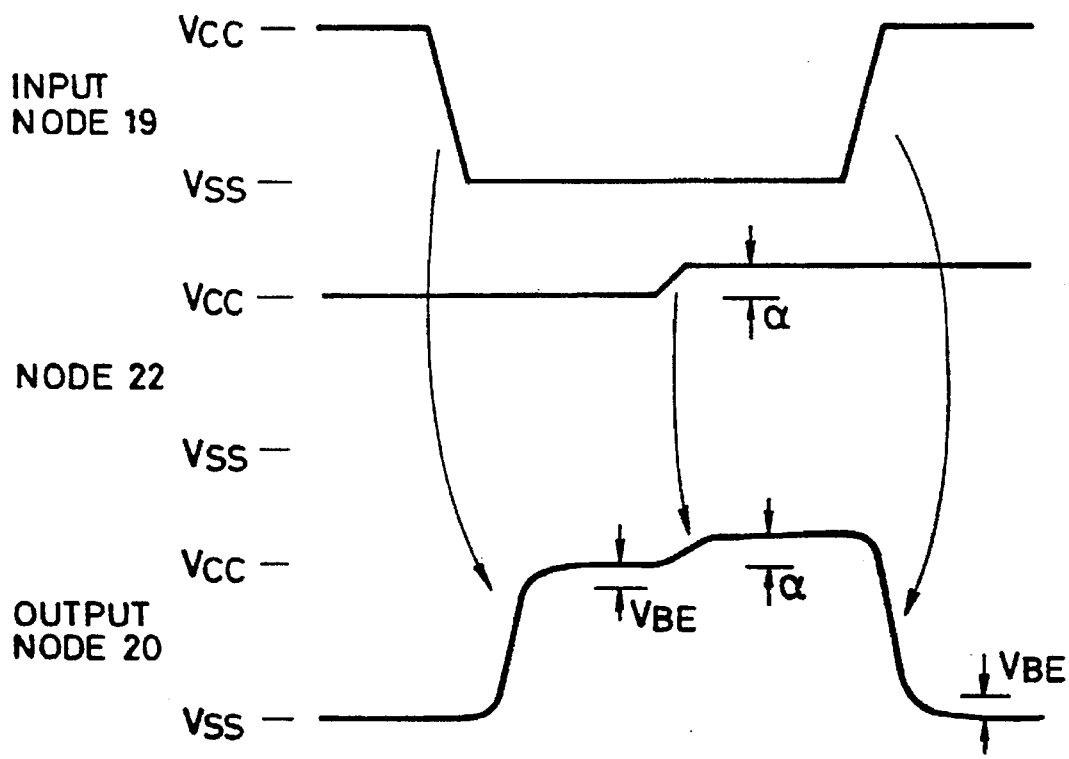

In the circuit of FIG. 12, although series circuit of the N-channel and P-channel insulated gate field-effect transistors is used in order to control the on/off state of the npn bipolar transistors 28, 29 and prevent the saturation thereof, various modifications of these elements are of course possible. Also in FIG. 12, source of the insulated gate field-effect transistor 20, i.e., the terminal 22 can be supplied with pulse signal with potential higher than $V_{cc}$ so as to raise the potential of the output terminal 20 to become higher than $V_{cc}$. A timing diagram in FIG. 14 illustrates an example of pulse signals to raise the potential of the output terminal 20 higher than $V_{cc}$. Without limitation to an example of FIG. 13, if amplitude of pulse signals applied to the terminal 22 and the applying timing are set so that voltage higher than the emitter-base breakdown voltage $BV_{EB}$ of the npn bipolar transistor is not applied between emitter and base of the npn bipolar transistor 28 and current is not returned to the terminal 22 through the insulated gate field-effect transistor 30, the potential of the output terminal 20 rises to that of the terminal 22 on the basis of the above-mentioned operation principle.

Figure 15:
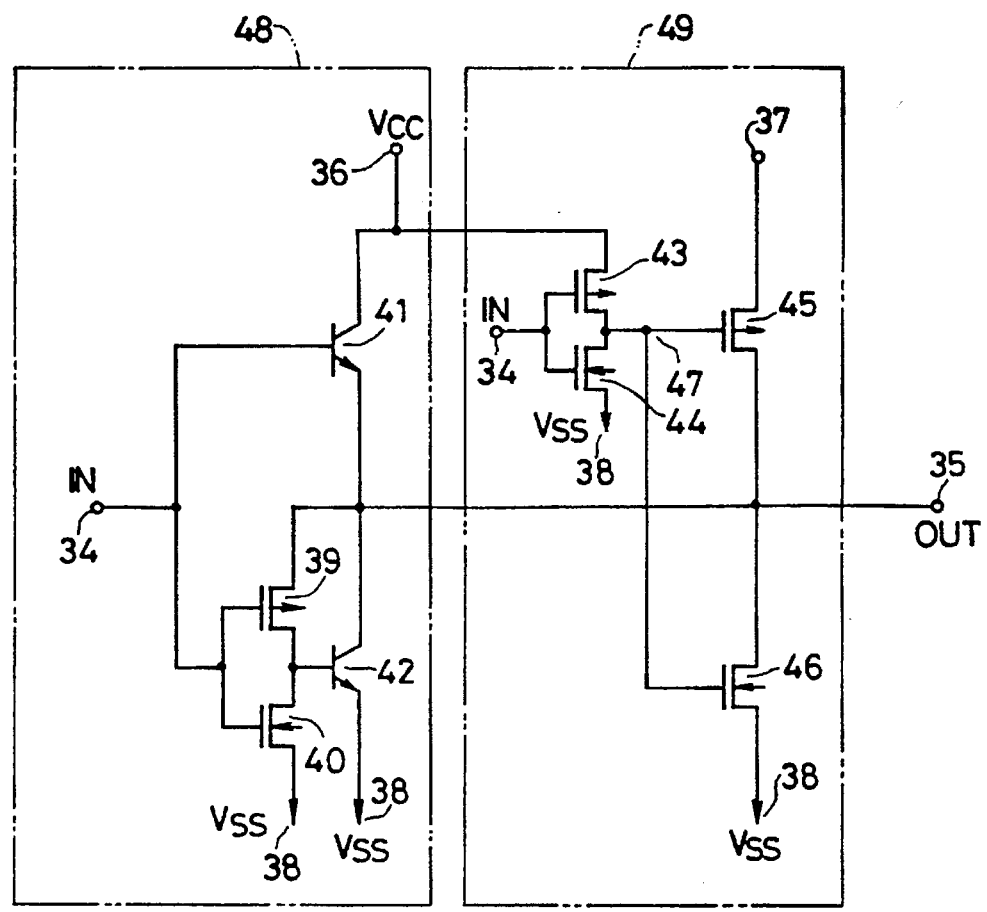

FIG. 15 shows a second example. In FIG. 15, collector of a first npn bipolar transistor 41 is connected to a positive voltage supply 36, emitter of the npn bipolar transistor 41 and collector of a second npn bipolar transistor 42 are connected, emitter of the second bipolar transistor 42 is connected to a negative voltage supply 38, source of a first P-channel insulated gate field-effect transistor 39 is connected to the joint of collector of the second npn bipolar transistor 42 and emitter of the first npn bipolar transistor 41 so as to form an output terminal, drain of the first P-channel insulated gate field-effect transistor 39 and drain of a first N-channel insulated gate field-effect transistor 40 are connected to base of the second npn bipolar transistor 42, source of the first N-channel insulated gate field-effect transistor 40 is connected to the negative voltage supply 38, base of the first npn bipolar transistor 41, gate of the first P-channel insulated gate field-effect transistor 39 and gate of the first N-channel insulated gate field-effect transistor 40 are connected so as to form an input terminal, source of a second P-channel insulated gate field-effect transistor 43 is connected to the positive voltage supply 36, source of a second N-channel insulated gate field-effect transistor 44 is connected to the negative voltage supply $V_{SS}$, drain of the second N-channel insulated gate field-effect transistor 44 and drain of the second P-channel insulated gate field-effect transistor 44 are connected, gate of the second N-channel insulated gate field-effect transistor 44 and gate of the second P-channel insulated gate field-effect transistor 43 are connected so as to form an input terminal, drain of a third P-channel insulated gate field-effect transistor 45 and drain of a third N-channel insulated gate field-effect transistor 46 are connected so as to form an output terminal, source of the N-channel insulated gate field-effect transistor 46 is connected to the negative voltage supply 38, gate of the P-channel insulated gate field-effect transistor 45, gate of the third N-channel insulated gate field-effect transistor 46, drain of the second P-channel insulated gate field-effect transistor 43 and drain of the second N-channel insulated gate field-effect transistor 44 are connected, input terminals of respective circuits are connected into a common input terminal 34, and output terminals of respective circuits are connected into a common output terminal 35.

Operation of the circuit in FIG. 15 will be described. To simplify the description, it is assumed that potential of the voltage supply terminal 38 is 0 V and the terminal 37 is connected to the positive voltage supply 36. If voltage of the input terminal 34 is made the positive supply voltage $V_{cc}$, the first npn bipolar transistor 41 is turned on, and the second npn bipolar transistor 42 becomes cut-off because the first P-channel insulated gate field-effect transistor 39 is turned off and the first N-channel insulated gate field-effect transistor 40 is turned on. Since the second P-channel insulated gate field-effect transistor 43 is turned off and the second N-channel insulated gate field-effect transistor 44 is turned on, potential of the terminal 47 is lowered thereby the third P-channel insulated gate field-effect transistor 45 is turned on and the third N-channel insulated gate field-effect transistor 46 is turned off. As a result, current flows through the first npn bipolar transistor 41 and the third P-channel insulated gate field-effect transistor 45, thereby potential of the output terminal 35 rises to that of the terminal 37. Since the terminal 37 is assumed to be connected to the positive voltage supply 36 here, the potential of the output terminal 35 attains to $V_{cc}$. The first npn bipolar transistor 51 and the third P-channel insulated gate field-effect transistor 45 contribute to the potential rising of the output terminal 35, until the potential of the output terminal 35 becomes value of the potential Vcc of the positive voltage supply 36 subtracted by the base emitter forward voltage $V_{BE}$ of the first npn bipolar transistor 41. And then the potential of the output terminal 35 rises by the third P-channel insulated gate field-effect transistor 45.

As voltage of the input terminal 34 is lowered from $V_{cc}$ to 0 V, the first npn bipolar transistor 41 is turned off. Since the first P-channel insulated gate field-effect transistor 39 is turned on and the first N-channel insulated gate field-effect transistor 40 is turned off, current flows to base of the second npn bipolar transistor 42 thereby the second npn bipolar transistor 42 is turned on. Since the second P-channel insulated gate field-effect transistor 43 is turned on and the second N-channel insulated gate field-effect transistor 44 is turned off, the potential of the terminal 47 rises. Consequently, the third P-channel insulated gate field-effect transistor 45 is turned off and the third N-channel insulated gate field-effect transistor 46 is turned on. As a result, the potential of the output terminal 35 is lowered to 0 V by the second npn bipolar transistor 42 and the third N-channel insulated gate field-effect transistor 46. The second npn bipolar transistor 42 and the third N-channel insulated gate field-effect transistor 46 contribute to the lowering of the potential of the output terminal 35, until the potential of the output terminal 35 becomes the base-emitter forward voltage $V_{BE}$ of the second npn bipolar transistor 42. And then the potential of the output terminal 35 is lowered by the third N-channel insulated gate field-effect transistor 46. When the potential of the output terminal 35 attains to potential of the terminal 37 or $V_{ss}$ and becomes the steady state, the P-channel insulated gate field-effect transistor 45 or the N-channel insulated gate field-effect transistor 46 is turned on. Consequently, potential of the output terminal 35 is not liable to variation in this state. In this example, pulse signal with potential higher than $V_{cc}$ can be applied to the terminal 37 so as to raise the potential of the output terminal 35 higher than $V_{cc}$ in similar manner to the circuit of FIG. 12. The circuit of FIG. 15 is similar to FIG. 12 also in that time difference may be provided in input signals applied to base of the npn bipolar transistor 41, the insulated gate field-effect transistors 39, 40, 43, 44 if necessary, and that type of transistors may be changed by changing the circuit constitution without departing from the spirit of the invention. In this example, input signal is applied directly to base of the bipolar transistor 41. Consequently, if the output terminal is at high level and the input terminal 34 is transferred to low level, voltage higher than the base-emitter breakdown voltage $BV_{EB}$ may be applied between base and emitter of the bipolar transistor 41. In this case, constant of the insulated gate field-effect transistors 39, 41 must be adjusted so that voltage higher than $BV_{BE}$ is not applied between base and emitter of the bipolar transistor 41.

In the example shown in FIG. 15, the circuit 49 has function to enable the output amplitude to be higher than the supply voltage and to suppress variation of the output voltage when the output terminal becomes the steady state as above described. In FIG. 15, since the circuit 49 receives input signals common thereto, the layout may become difficult depending on constitution of the circuit 49. In this case, a circuit 59 of FIG. 16 can be used in place of the circuit 49 of FIG. 15. The circuit in FIG. 16 comprises flip-flop where gate and drain of a pair of insulated gate field-effect transistors are cross-coupled, and corresponds to constitution that the terminal 34 is connected to the output terminal 35 in the circuit 49 of FIG. 15.

Operation of FIG. 16 will be described. If potential of a terminal 50 rises by a circuit at forward stage including bipolar transistors, a first P-channel insulated gate field-effect transistor 54 is turned off and a first N-channel insulated gate field-effect transistor 55 is turned on. As a result, since potential of a terminal 58 is lowered, a second P-channel insulated gate field-effect transistor 56 is turned on and a second N-channel insulated gate field-effect transistor 57 is turned off, thereby potential of an output terminal 50 rises to that of a terminal 52. If potential of the output terminal 50 becomes high level, since potential of the terminal 58 is held to $V_{ss}$, the potential of the output terminal 50 is held stably and not liable to variation. If input signal of the circuit at forward stage including bipolar transistors is changed and the potential of the output terminal 50 is lowered by the circuit at forward stage, the first P-channel insulated gate field-effect transistor 54 is turned on and the first N-channel insulated gate field-effect transistor 55 is turned off. As a result, since potential of the terminal 58 rises, the second P-channel insulated gate field-effect transistor 56 is turned off and the second N-channel insulated gate field-effect transistor 57 is turned on, thereby the potential of the output terminal 50 is lowered to voltage $V_{ss}$ of the terminal 52. If the potential of the output terminal 50 becomes low level, since the potential of the terminal 58 is held to $V_{cc}$, the potential of the output terminal 50 is held stably and not liable to variation in similar manner to the above-mentioned high level state. Since this circuit comprises the flip-flop circuit, once the circuit becomes steady state, the state is held. Moreover, the bipolar transistors are used at the forward stage, the circuit can be easily inverted during the input changing. As clearly understood from above-mentioned operation, the circuit 59 can be used not only in the example of FIG. 15 but also in various driving circuits including bipolar transistors in additive use. Also in this circuit, pulse signals higher than the positive supply voltage $V_{cc}$ can be applied to the terminal 52 so as to raise the potential of the output terminal 50 higher than $V_{cc}$ in similar manner to the above example.

Figure 16:
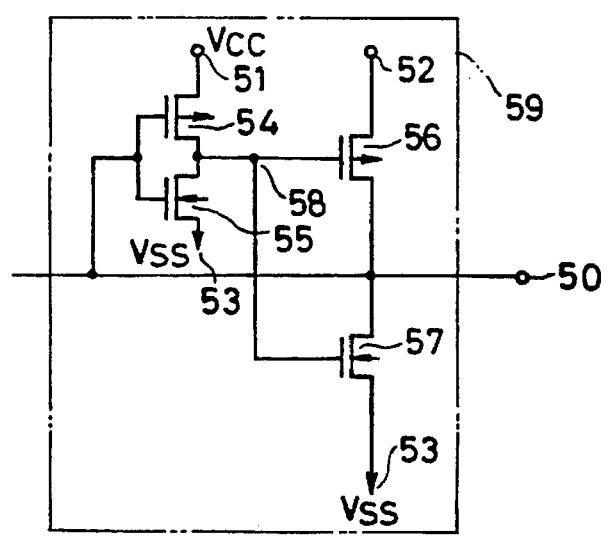
Figure 17:
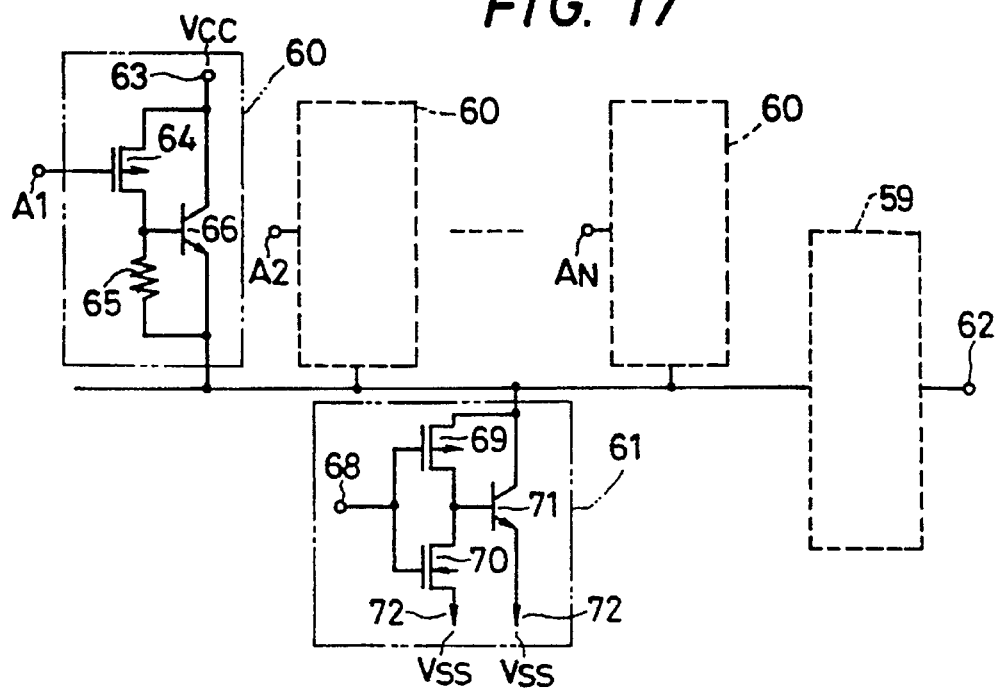

FIG. 17 shows an example where the circuit of FIG. 16 is applied to a multi-input logic circuit. In FIG. 17, collector of an npn bipolar transistor 66 and source of a P-channel insulated gate field-effect transistor 64 are connected to a positive voltage supply 63, drain of the P-channel insulated gate field-effect transistor 64 and one end of a resistor 65 are connected to base of the npn bipolar transistor 66, gate of the P-channel insulated gate field-effect transistor 64 is made an input terminal, emitter of the npn bipolar transistor 66 and other end of the resistor 65 are connected so as to form an output terminal, thus N circuits are constituted in above-mentioned manner. Collector of an npn bipolar transistor 71 and source of a P-channel insulated gate field-effect transistor 69 are connected so as to form an output terminal, drain of the P-channel insulated gate field-effect transistor 69 and drain of an N-channel insulated gate field-effect transistor 70 are connected to base of the npn bipolar transistor 71, gate of the P-channel insulated gate field-effect transistor 69 and gate of the N-channel insulated gate field-effect transistor 70 are connected so as to form an input terminal, source of the N-channel insulated gate field-effect transistor 70 and emitter of the npn bipolar transistor 71 are connected to a negative voltage supply 72 thus one circuit is constituted, the circuit 59 in FIG. 16 is used, and output terminals of respective circuits are connected into a common output terminal 62. In this example, the circuit 60 serves to supply current flowing into the output terminal 62 and raise potential of the output terminal, and the circuit 61 serves to take current flowing out of the output terminal 62 and lower the potential of the output terminal 62. The circuit 59 serves to hold the output terminal 62 to low impedance state and prevent the voltage variation when potential of the output terminal 62 rises or is lowered and becomes the steady value and to enlarge the output amplitude higher than the supply voltage if necessary.

Operation of this example will be described. First, signals of high level are applied to input terminals $A_1$, through $A_N$, the P-channel insulated gate field-effect transistor 64 is turned off, and base current of the npn bipolar transistor 66 is cut off so as to turn the transistor off. Next, signal of low level is applied to the terminal 68, thereby the npn bipolar transistor 71 is turned on and potential of the output terminal 62 is raised. The potential of the output terminal 62 is lowered to the negative supply voltage $V_{ss}$ by action of the circuit 59. After the potential of the output terminal 62 becomes steady state, the terminal 68 is transferred to high level and the npn bipolar transistor 71 is turned off. As long as the input signals $A_1$ through $A_N$ are at high level, potential of the output terminal 62 is held to voltage $V_{ss}$ of the voltage supply 72 by the circuit 59. In this state, if at least one of the input signals $A_1$ through $A_N$ becomes low level, potential of the output terminal 62 rises by the circuit 60 to which input signals are applied. Then collector current of the npn bipolar transistor and current flowing through the resistor 65 together flow into the output terminal 62. At the same time, the circuit 59 also contributes to the voltage increase of the output terminal 62, and the potential of the output terminal 62 attains to $V_{cc}$. After attaining to $V_{cc}$, the potential of the output terminal 62 is held stably by the circuit 59. Further, the potential of the output terminal 62 can be increased higher than $V_{cc}$ by the circuit 59 in similar manner to the above example. Thus an example of logic circuit according to the invention has been disclosed. Also in the case of current flowing out of the output terminal, various logic circuits of course can be constituted by use of bipolar transistors in parallel. Although the npn bipolar transistors are used here, it is clear that similar circuit can be constituted using pnp bipolar transistors. In the circuit 60 of FIG. 17, the resistor 65 is connected between base and emitter of the npn bipolar transistor 66. Use of the resistor 65 can prevent the rearward voltage from being applied between base and emitter of the bipolar transistor 66, even if the P-channel insulated gate field-effect transistor 64 is turned off and the potential of the output terminal 62 is transferred to high level. The layout may become difficult depending on use of the resistor. In this case, the resistor 65 can be omitted in constitution that an N-channel insulated gate field-effect transistor is used, drain of the N-channel insulated gate field-effect transistor is connected to base of the npn bipolar transistor, source there of is connected to emitter of the npn bipolar transistor, and gate thereof is connected to gate of the P-channel insulated gate field-effect transistor 64.

Figure 18:
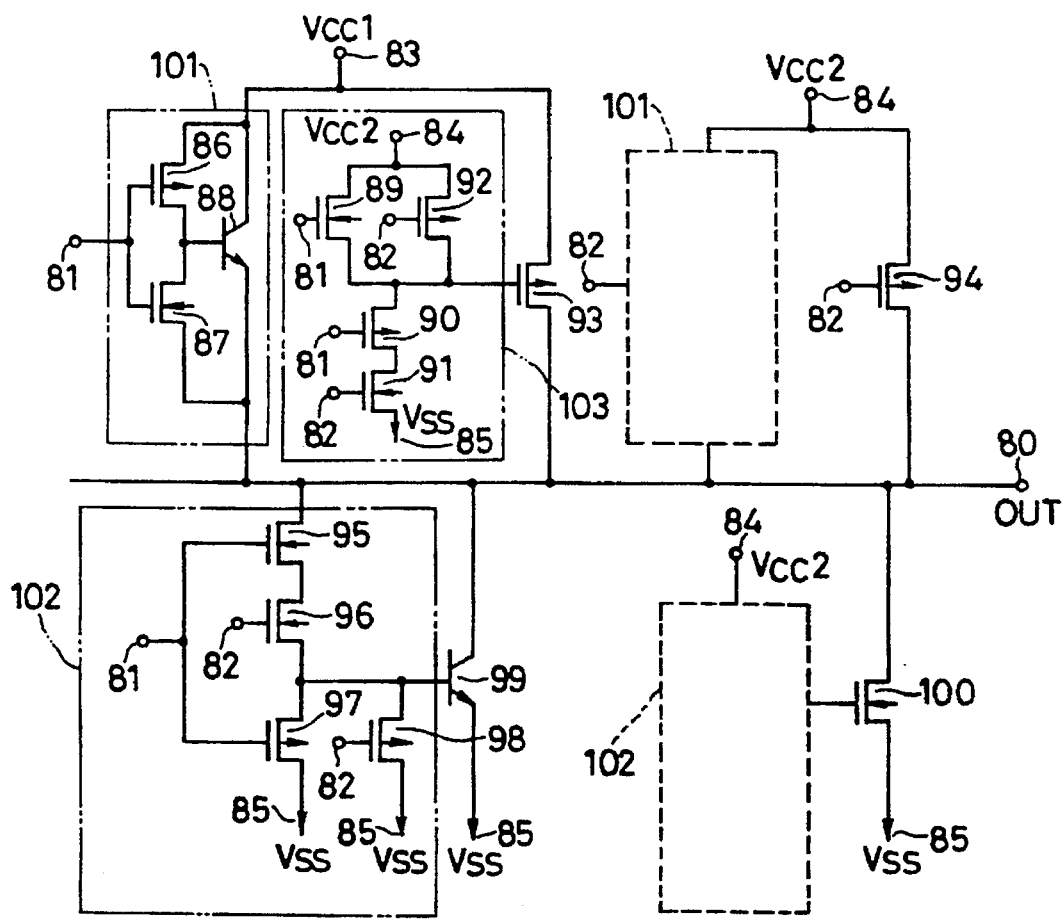

FIG. 18 shows a fourth example. In FIG. 18, a circuit 101 makes current flow in through an npn bipolar transistor 88. In the circuit 101, gate of a P-channel insulated gate field-effect transistor 86 and gate of an N-channel insulated gate field-effect transistor 87 are connected so as to form an input terminal, each drain thereof is connected to base of an npn bipolar transistor 88, collector of the npn bipolar transistor 88 and source of the P-channel insulated gate field-effect transistor 86 are connected so as to form a voltage supply terminal, and emitter of the npn bipolar transistor 88 and source of the N-channel insulated gate field-effect transistor 87 are connected so as to form an output terminal. A circuit 102 is a two-input AND circuit constituted by insulated gate field-effect transistors 95–98. Two circuits 102 are used, and output of the first circuit 102 is connected to base of an npn bipolar transistor 99 and output of the second circuit 102 is connected to gate of an N-channel insulated gate field-effect transistor 100. A circuit 103 controls gate voltage of a P-channel insulated gate field-effect transistor 93 according signals applied to terminals 81, 82. In the circuit 103, drain of a first N-channel insulated gate field-effect transistor 89 and source of a first P-channel insulated gate field-effect transistor 92 are connected so as to form a positive voltage supply terminal, source of the N-channel insulated gate field-effect transistor 89, drain of the P-channel insulated gate field-effect transistor 92 and source of a second P-channel insulated gate field-effect transistor 90 are connected so as to form an output terminal, drain of the P-channel insulated gate field-effect transistor 90 and drain of a second N-channel insulated gate field-effect transistor 91 are connected, and source of the second N-channel insulated gate field-effect transistor 91 is connected to a negative voltage supply 85. In FIG. 18, the two circuits 101, the two circuits 102, the circuit 103, the P-channel insulated gate field-effect transistor 93, 94, the N-channel insulated gate field-effect transistor 100 and the npn bipolar transistor 99 are used. Collector of the bipolar transistor 88 of the first circuit 101, source of the P-channel insulated gate field-effect transistor 86 and source of the P-channel insulated gate field-efect transistor 93 are connected to a first positive voltage supply 83, the positive voltage supply terminal of the circuit 103, source of the P-channel insulated gate field-effect transistor 86 of the second circuit 102, collector of the npn bipolar transistor 88, drain of the N-channel insulated gate field-effect transistor 95 of the second circuit 102 and source of the P-channel insulated gate field-effect transistor 94 are connected to a second positive voltage supply 84, source of the N-channel insulated gate field-effect transistor 91 of the circuit 103, drain of the P-channel insulated gate field-effect transistors 97, 98 of the first and second circuits 102, emitter of the npn bipolar transistor 99 and source of the N-channel insulated gate field-effect transistor 100 are connected to a negative voltage supply 85, input terminal of the first circuit 101 and gate of the N-channel and P-channel insulated gate field-effect transistors 95, 97 of the first and second circuits 102 are connected so as to form an input terminal 81, gate of the P-channel and N-channel insulated gate field-effect transistors 92, 91 of the circuit 103, input terminal of the second circuit 101 and gate of the N-channel and P-channel insulated gate field-effect transistors 96, 98 of the second circuit 102 are connected so as to form a second input terminal 82, and output terminal of the first and second circuits 101, drain of the P-channel insulated gate field-effect transistors 93, 94, drain of the N-channel insulated gate field-effect transistor 95 of the first circuit 102, collector of the npn bipolar transistor 99 and drain of the N-channel insulated gate field-effect transistor 100 are connected so as to form an output terminal. Voltage $V_{cc}1$ of the first positive voltage supply 83 is set lower than voltage $V_{cc}2$ of the second positive voltage supply 84.

In above-mentioned constitution, if signal of high level is applied to the first and second input terminals 81, 82, potential of the output terminal 80 becomes voltage $V_{ss}$ of the negative voltage supply 85. Next, if signal applied to the first input terminal 81 is transferred to low level, potential of the output terminal 80 rapidly rises to voltage $V_{cc}1$ of the first positive voltage supply. Further, if signal applied to the second input terminal 82 is transferred to low level, potential of the output terminal 80 rapidly rises to voltage $V_{cc}2$ of the second positive voltage supply. In these three sorts of the output level, the output terminal 80 is put to low impedance state by the insulated gate field-effect transistors 100, 93, 94 respectively, and therefore not liable to the voltage variation. Above-mentioned operation will now be described. If input signal of high level is applied to the first and second input terminals 81, 82, the P-channel insulated gate field-effect transistor 86 in the circuit 101 is turned off, and the N-channel insulated gate field-effect transistor 87 is turned on. As a result, base current of the npn bipolar transistor 88 does not flow, thereby the npn bipolar transistor 88 is turned off. In the circuit 103, the P-channel insulated gate field-effect transistors 90, 92 are turned off, and the N-channel insulated gate field-effect transistors 89, 91 are turned on. Consequently, gate voltage of the P-channel insulated gate field-effect transistor 93 becomes high level $½ V_{cc}$, thereby the P-channel insulated gate field-effect transistor 93 is turned off. The P-channel insulated gate field-effect transistor 94 also is turned off. In the circuit 102, the N-channel insulated gate field-effect transistors 95, 96 are turned on, and the P-channel insulated gate field-effect transistors 97, 98 are turned off. Consequently, both the npn bipolar transistor 99 and the N-channel insulated gate field-effect transistor 100 are turned on, and potential of the output terminal 80 is lowered to $V_{ss}$. Then since the N-channel insulated gate field-effect transistor 100 is turned on, the output terminal 80 is held to low impedance state. Next, if potential of the first input terminal 81 is transferred to low level, the npn bipolar transistor 88 of the first circuit 101 is turned on. Since the insulated gate field-effect transistors 81, 92 in the circuit 103 are turned off and the transistors 90, 91 are turned on, the P-channel insulated gate field-effect transistor 93 is turned on. In the second circuit 102, the bipolar transistor 88 and the P-channel insulated gate field-effect transistor 94 remain to be cut-off. The npn bipolar transistor 99 and the N-channel insulated gate field-effect transistor 100 are turned off by the AND circuit 102. As a result, potential of the output terminal 80 rises to $V_{cc}1$. Then since the P-channel insulated gate field-effect transistor 93 is turned on, the output terminal 80 is held to low impedance state. Further, if potential of the second input terminal 82 is transferred to low level, the insulated gate field-effect transistors 89, 91 in the circuit 103 are turned off, and the transistors 92, 90 are turned on. consequently, gate potential of the P-channel insulated gate field-effect transistor 93 becomes high level $V_{cc}^2$, thereby the P-channel insulated gate field-effect transistor 93 is turned off. In addition to the npn bipolar transistor 88 of the first circuit 101, the npn bipolar transistor 88 of the second circuit 101 and the P-channel insulated gate field-effect transistor 94 are turned on. The npn bipolar transistor 99 and the N-channel insulated gate field-effect transistor 100 remain to be cut-off. As a result, potential of the output terminal 80 rises to voltage $V_{cc}2$ of the second positive voltage supply. Then since the P-channel insulated gate field-effect transistor 94 is turned on, the output terminal 80 is held to low impedance state.

According to the example shown in FIG. 18, three stages of output level, $V_{ss}$, $V_{cc}1$, $V_{cc}2$ are provided, voltage variation in each output level does not easily occur, and the driving circuit having high driving capability can be achieved. Although the circuit has two inputs and three stages of output level, $V_{ss}$, $V_{cc}1$, $V_{cc}2$ in this example, the number of inputs, logic relation of input/output and the number of output level may be set without limited by this example. It is clear that similar circuit can be constituted when pnp bipolar transistors are used. In FIG. 18, although source of the insulated gate field-effect transistors 93, 94 is connected to the voltage supply, potential of the output terminal 80 can be made value other than the supply voltage by applying the signal pulse in similar manner to the above example.

As clearly understood from above-mentioned examples, according to the invention, the load driving is performed cooperatively by the bipolar transistors and the insulated gate field-effect transistors, thereby the driving circuit has high driving capability of the bipolar transistor, the output amplitude becomes the supply voltage or more, and the output member is not liable to the voltage variation. The driving circuit having such characteristics can be used widely, and particularly it is most suitable for the word driver of the semiconductor memory. Application of the circuit of FIG. 12 as a first example to the word driver of the dynamic memory and the static memory will be described.

Figure 19:
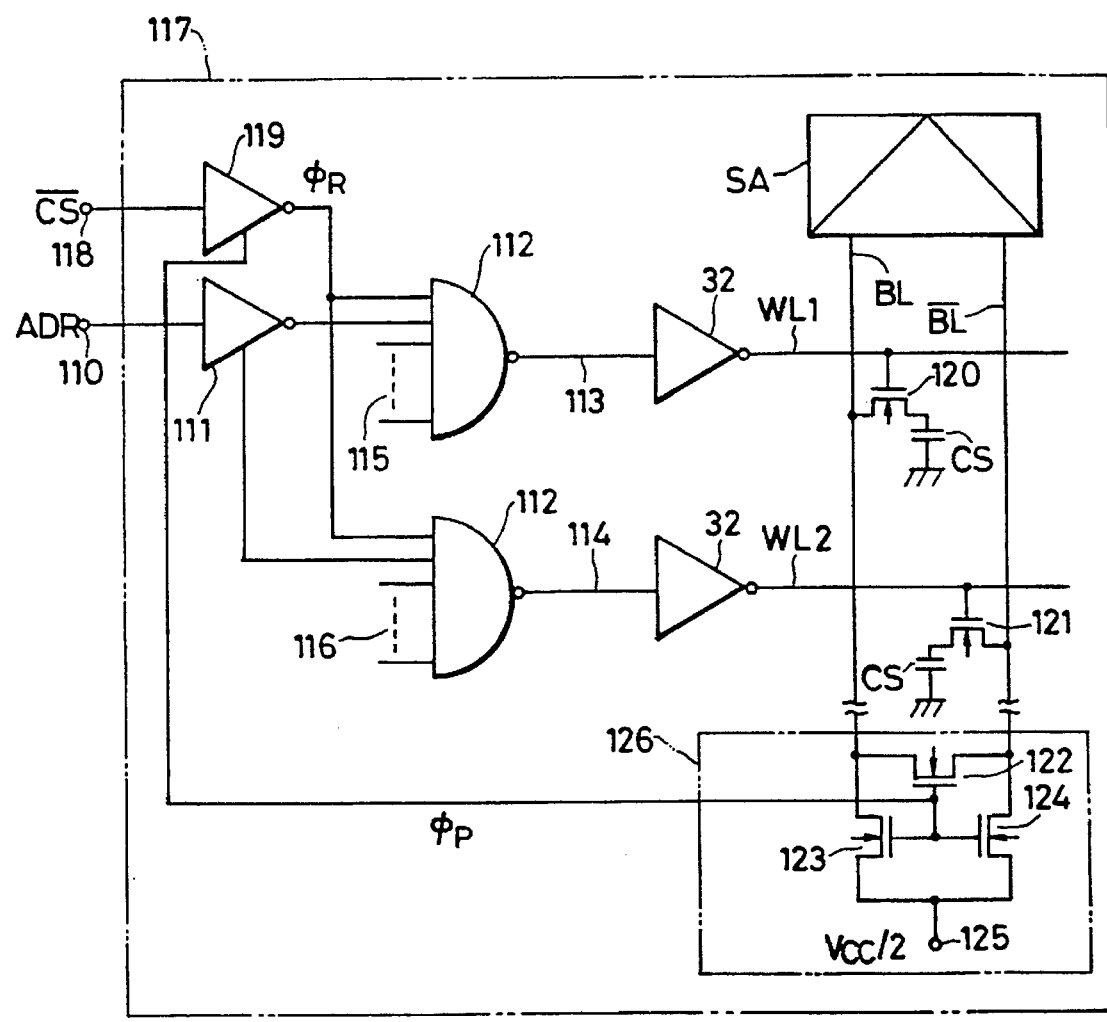
Figure 20:
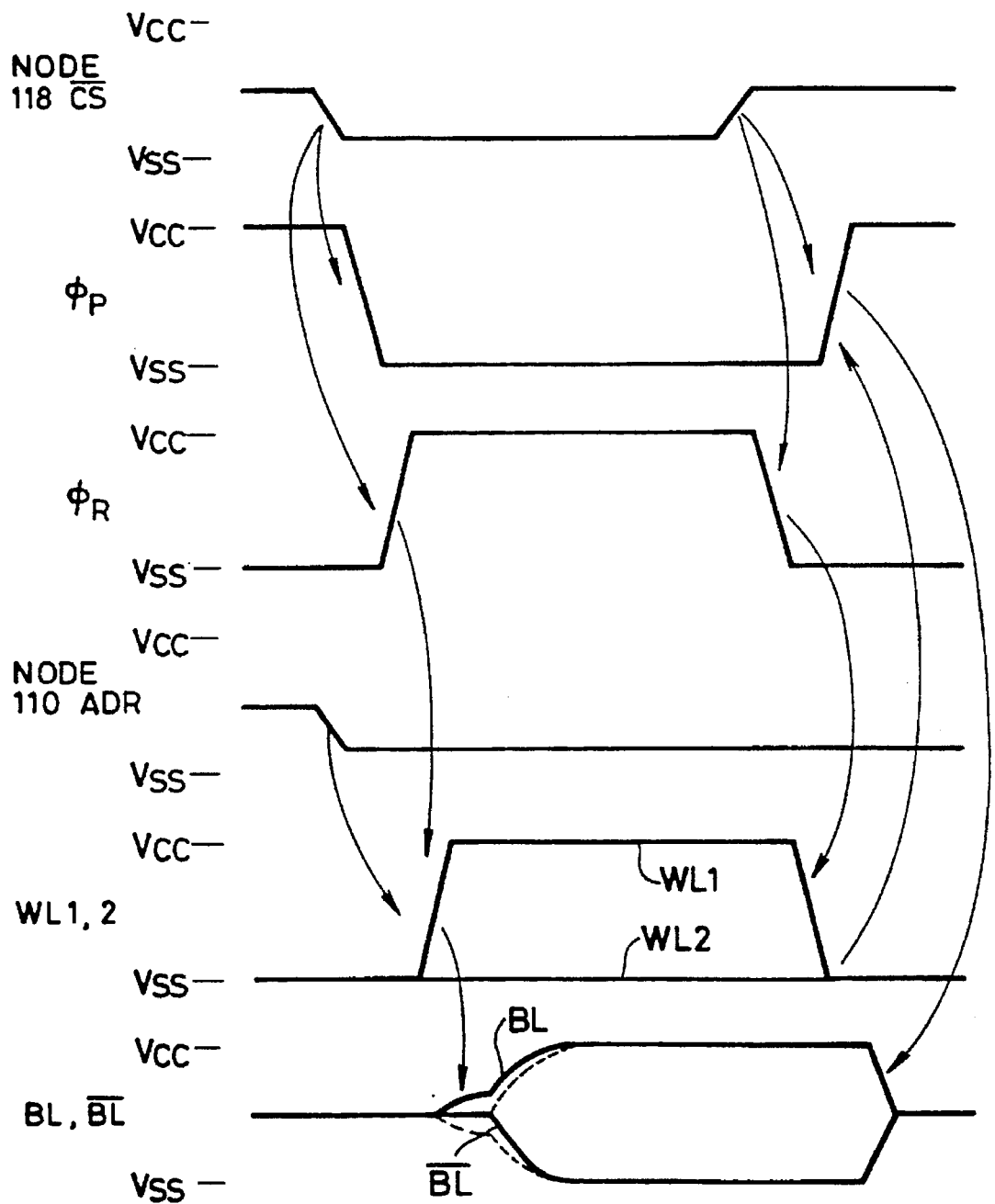
Figure 21:
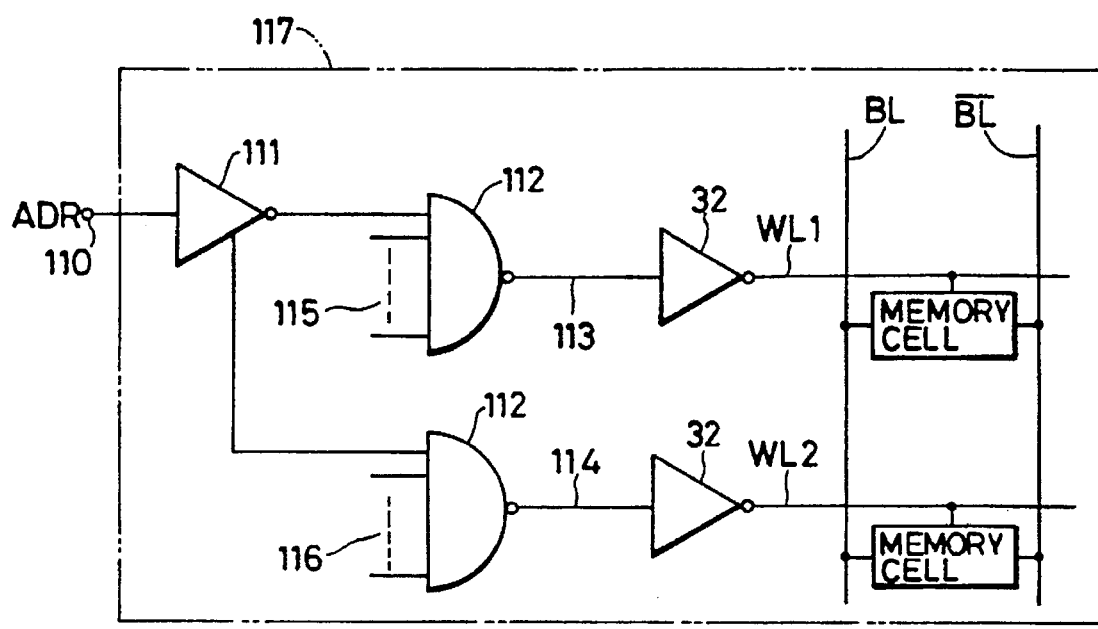

FIG. 19 shows a constitution example where the circuit 32 of FIG. 12 is used in a word driver of a dynamic semiconductor memory having a memory cell constituted by insulated gate field-effect transistors. FIG. 21 shows a constitution example where the circuit 32 is used in a word driver of a static semiconductor memory using flip-flop memory cells. In FIG. 19 and FIG. 21, numeral 110 designates an address input terminal, symbol ADR an address input signal, numeral 111 an address buffer, numeral 112 a decoder, numerals 113, 114 decoder output lines, numeral 115, 116 decoder input lines, numeral 126 a bit line precharge circuit, numeral 32 a word driver, numerals WL1, WL2 word lines, symbols BL, $\overline{BL}$ lit lines, and numeral 117 a chip being semiconductor memory. In FIG. 19, symbol $\overline{CS}$ designates a chip select signal, symbol $\phi_R$ a word reset signal, symbol $\phi p$ a precharge signal, symbol SA a sense amplifier, and symbol $C_s$ a storage capacitance. The read operation of the dynamic semiconductor memory shown in FIG. 19 will now be described referring to a timing diagram of FIG. 20. The chip select signal CS is at high level before starting the read operation. Consequently, the word reset signal $\phi_R$ and the precharge signal $\phi p$ both generated using the signal CS are at low level and high level. In this state, output of the decoder 112 is held to high level by the word reset signal $\phi_R$, thereby all word lines are held to low level. The N-channel insulation gate field-effect transistors 122, 123, 124 are turned on by the precharge signal $\phi p$, and potential of the bit lines BL, $\overline{BL}$ becomes the reference voltage being about a half of the supply voltage $V_{cc}$. The chip select signal CS is transferred to low level, thereby the read operation is started and at the same time the address input signal ADR is applied. And then the precharge signal $\phi p$ is transferred to low level in response to the chip select signal $\overline{CS}$, and subsequently the word reset signal $\phi_R$ is transferred to high level. As a result, the decoder 112 acts corresponding to the address buffer output, and potential of only the selected word line rises. Assume that the word line WL1 in FIG. 21 is selected. Then potential of non-select word lines such as WL2 is held to low level. If potential of the word line WL1 rises, the N-channel insulated gate field-effect transistor 120 is turned on. As a result, potential of the bit line BL is slightly raised or lowered with respect to the reference voltage depending on whether or not the charge is stored in the storage capacitance $C_S$. On the other hand, since potential of the bit line $\overline{BL}$ remains to be the reference voltage, small difference is produced in potential of the bit lines BL, $\overline{BL}$. The difference is amplified by the sense amplifier SA. The voltage difference in the pair of bit lines BL, $\overline{BL}$ is amplified to amount being necessary and sufficient, and the amplified value is transferred to a rearward output circuit (not shown) and read out of the chip 117. In above-mentioned process, the amplified voltage of the bit line BL passes through the N-channel insulated gate field-effect transistor 120 and is rewritten to the storage capacitance $C_s$. And then the chip select signal is transferred to high level, and the word reset signal $\phi_R$ becomes low level. As a result, potential of all word lines becomes low level, and all N-channel insulation gate field-effect transistors connected to the storage capacitance are turned off. If the precharge signal $\phi p$ is subsequently transferred to high level, potential of the pair of bit lines BL, $\overline{BL}$ is transferred to the reference voltage and again becomes the state before the read operation.

As above described, in the read operation, all word lines before and after the operation or non-select word lines during the operation must be held to low level. If potential of the word lines is varied by any cause, the N-channel insulated gate field-effect transistors are turned on, resulting in the error or destruction of information of the memory cell. The voltage variation of the word line is apt to occur particularly when the voltage difference of the pair of bit lines is amplified by the sense amplifier SA. That is because potential of the bit line is varied at high speed and large amplitude by the sense amplifier SA, and relatively high voltage is coupled to the word line through the capacitance between the bit line and the word line due to the voltage variation. In FIG. 19, a part of bit lines are only shown. However, since the amplification is performed simultaneously at all bit lines in the chip, the voltage of the induced signal cannot be neglected.

Figure 22:
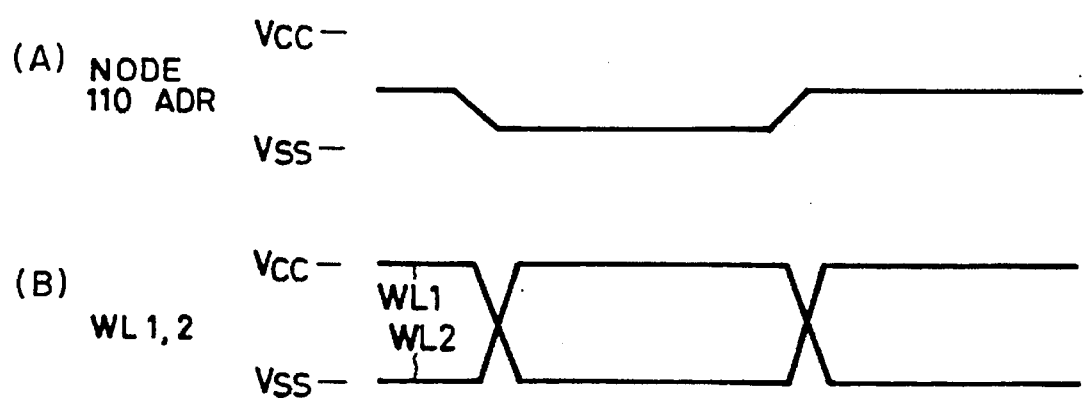

This phenomenon becomes problems particularly from the viewpoint of noise when the dynamic semiconductor memory of high density and high speed is achieved. Above circumstances are described in detail in "ITOH, K. and SUNAMI, H.: "High-density one-device dynamic MOS memory cells", IEE PROC., vol. 130, Pt. I. No. 3, JUNE 1983, pp 127–135". If the selected word line cannot be driven at high speed and high amplitude, signal level of information read to the bit line becomes small thereby the unstable operation may be caused. Furthermore, since signal level of information rewritten in the memory cell also becomes small, the soft error by $\alpha$-ray becomes problems. Consequently, in order to achieve the dynamic semiconductor memory of high speed, the word line must be driven at high speed and high amplitude and potential of the word line must be held stably. Next, operation of the static semiconductor memory shown in FIG. 21 will be described referring to a timing diagram of FIG. 22. In the static semiconductor memory, potential of all word lines need not be previously made low level and potential of the bit line need not be set to the reference level, although necessary in the case of the dynamic semiconductor memory. As shown in FIG. 21, in usual, the word line selected corresponding to the address input signal and the non-select word line are simultaneously changed in the potential. Because the static semiconductor memory has the capability of holding the information and the capability of supplying the current in the memory cell, and the stable operation can be achieved in the above-mentioned system. Thus in the static semiconductor memory, potential of all word lines need not be previously set to low level. However, the word line is liable to voltage variation also in the static semiconductor memory, although the degree is not so much as in the dynamic semiconductor memory. Furthermore, in order to achieve high-speed operation of the semiconductor memory, the word line must be driven at high speed and high amplitude.

As above described, since the driving circuit of the invention has high driving capability and is not liable to voltage variation and can obtain the large output amplitude, if the driving circuit of the invention is used as the word driver of the semiconductor memory, the semiconductor memory of high speed and stable operation can be achieved. Although above description is performed regarding the read operation only, situation is similar also regarding the write operation. In FIG. 19 and FIG. 20, the driving circuit in FIG. 12 is used. However, various modified circuits, such as the circuit in FIG. 15, may be used if necessary without departing from the spirit of the invention.

Although various examples have been shown, the invention is not limited to the examples but various modifications may be used without departing from the spirit of the invention.

As above described, according to the invention, since the same load is controlled cooperatively by the bipolar transistor and the insulated gate field-effect transistor, the large driving capability of the bipolar transistor acts well at transient state, and the output terminal can be held to low impedance state by the insulated gate field-effect transistor at the steady state. Furthermore, the output level can be set by the insulated gate field-effect transistor without limited by the base-emitter forward voltage $V_{BE}$ of the bipolar transistor. Accordingly, the driving circuit which has high speed, and is immune from noise and has the output amplitude higher than the supply voltage can be obtained.

Embodiment 2 Control of the foregoing circuit

Figure 23:
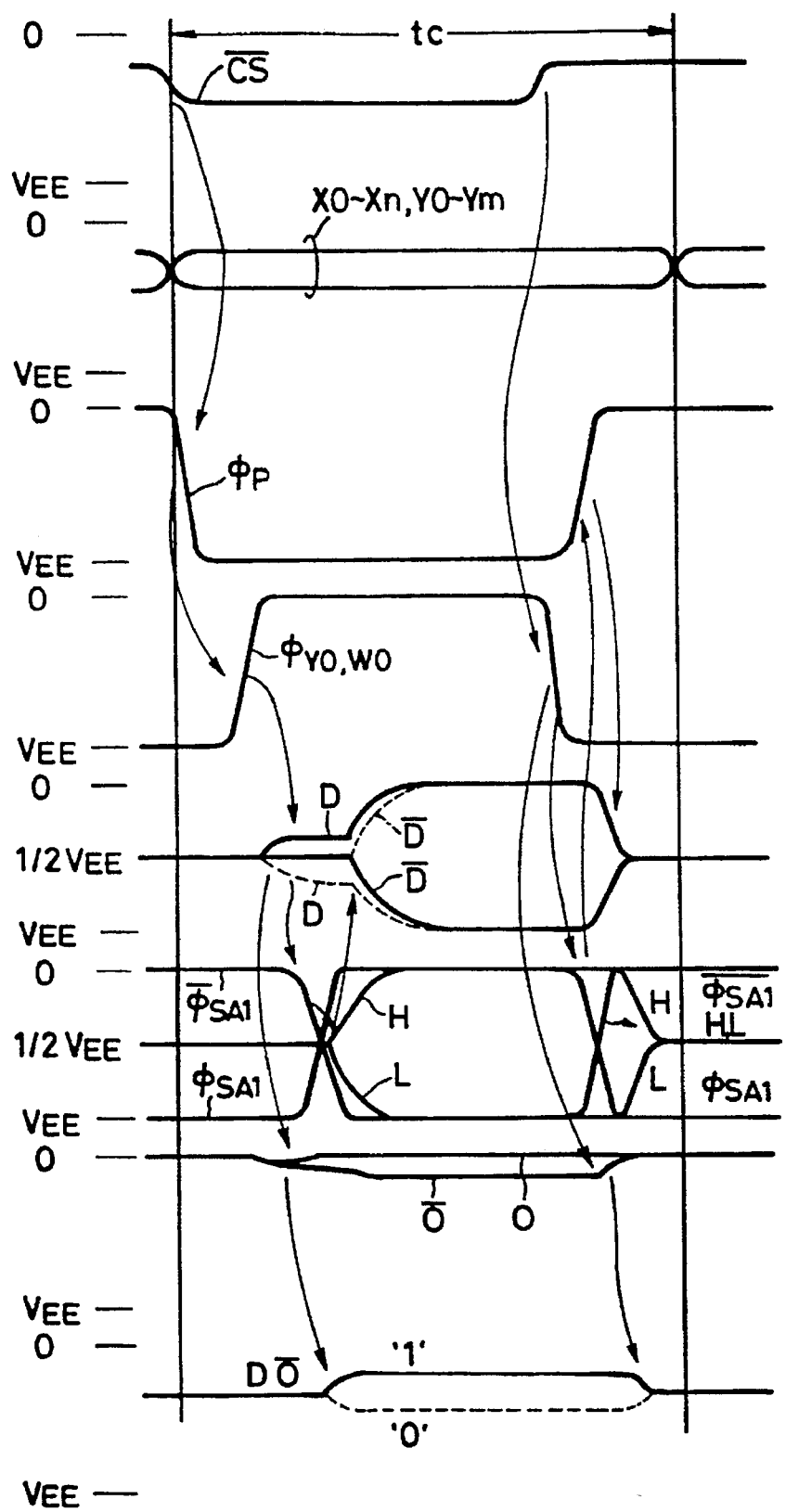
FIGS. 23–71 are diagrams illustrating a second embodiment of the invention.

FIG. 23 shows the waveforms of the memory cell drive signal and memory output signal observed in the read operation of the semiconductor dynamic memory shown in FIG. 3A. An endless operational cycle has been shown in FIG. 4. In actual, however, a finite operational cycle time $t_c$ has a high level period and low level period for the $\overline{CS}$ input, and in the high $\overline{CS}$ period, the data line is precharged for the next operational cycle. Namely, the selected word line ($W_0$) is placed low so that all words are unselected, the first differential amplifier SA1 is deactivated by $\phi_{SA1}$ and $\overline{\phi_{SA1}}$, and the precharging circuit is operated by $\phi_p$ to precharge the data line. The signals $W_0$, $\phi_p$, $\phi_{SA1}$ and $\overline{\phi_{SA1}}$ need to be switched sequentially in response to the rise of the $\overline{CS}$ input as shown in FIG. 23. Although in FIG. 23 the memory output DO is shown to have an intermediate level during the precharge period, in many cases it is set to a low level for the ECL interface or to a high-impedance state for the TTL interface, and the output circuit also needs to be controlled to match the memory output condition.

Figure 24:
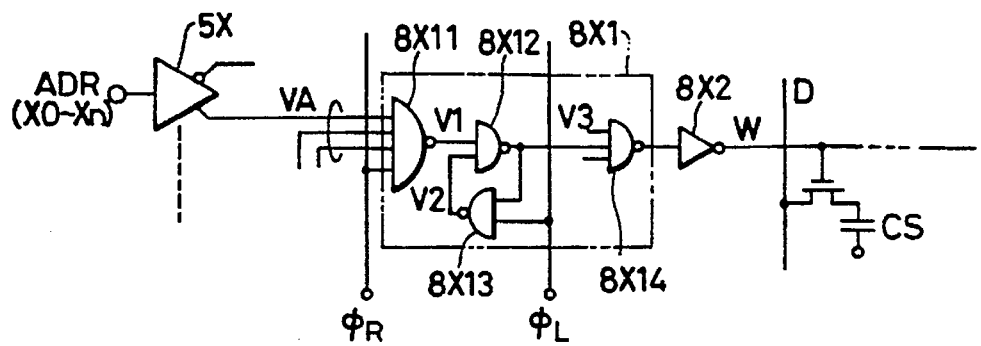

An embodiment for generating these control signals will be described in detail. First, the word line signal Wo shown in FIG. 23 is generated in the following way. During the period when the external input signal $\overline{CS}$ is high, all word lines are unselected for maintaining the precharged state, and when the $\overline{CS}$ goes low, the address signals $X_0$-$X_n$ select a certain word line to bring it to a high level. In this state, the memory cell is read and written. At the end of the operational cycle when the $\overline{CS}$ input goes high, all word lines are made unselected, and precharge operation takes place preparatory to the next operational cycle. On this account, the memory system needs to incorporate a function (reset function) for disabling all word lines and a function (latch function) for establishing the selected or unselected states of the word lines after a word line has been selected until rewriting operation completes. An example of these functions incorporated in the decoder circuit will be described with reference to FIGS. 24 and 27. In FIG. 24, the word lines are decoded using a cascade of AND gates (8X11 and 8X14). Other circuit elements included are an address buffer 5X, a decoder 8X1 and a word drive 8X2, where the 8X1 and 8X2 constitute the decoder-driver 8X shown in FIG. 2. The circuit receives a reset signal $\phi_R$ for making all word lines unselected and latch signal $\phi_L$ for setting a word line to a selected state. These signals $\phi_R$ and $\phi_L$ are generated in response to the $\overline{CS}$ input as will be described later.

Figure 25:
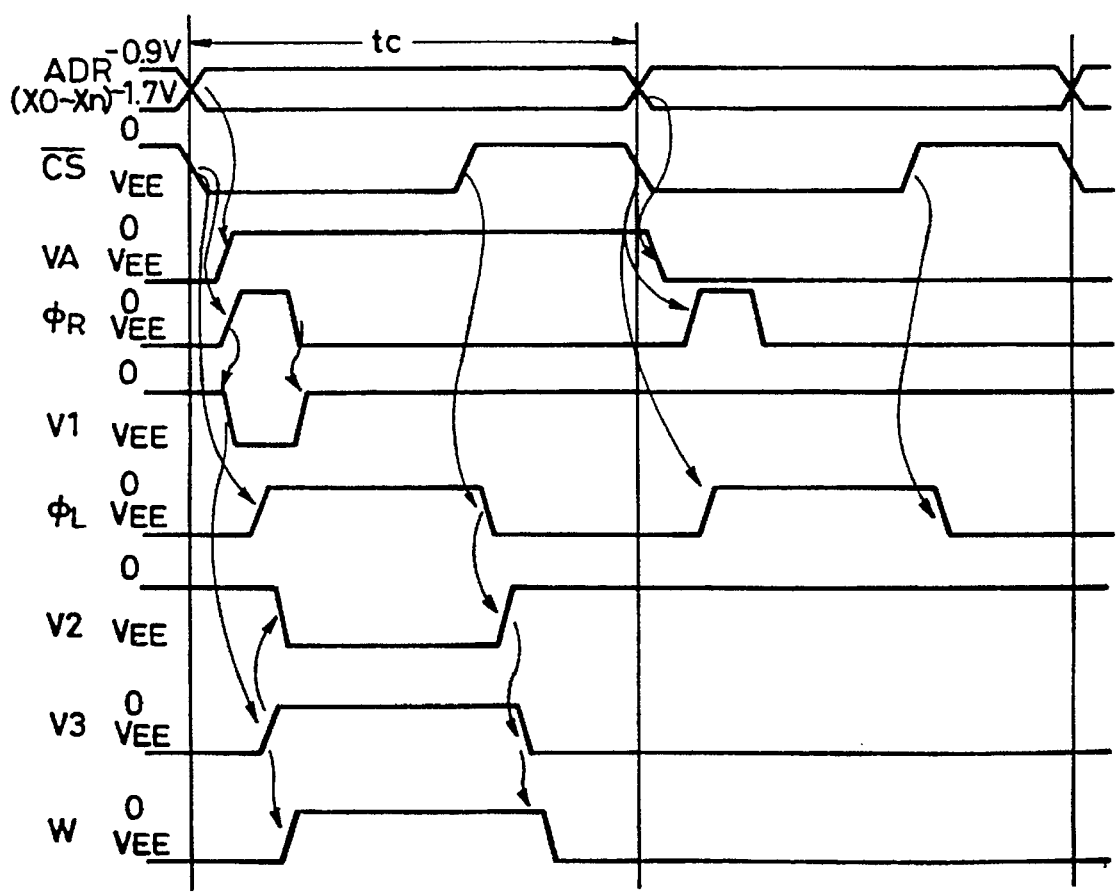

FIG. 25 is a waveform diagram for the signals shown in FIG. 24. Among the four inputs of the decoder 8X11 when all of three address buffer outputs $V_A$ are high and a high $\phi_R$ signal as shown is applied, the decoder produces a low output $V_1$ causing the 8X12 to produce a high output $V_3$. At this time if the $\phi_L$ is high, the $V_3$ level is held by the latch circuit made up of 8X12 and 8X13. In the subsequent period with a low $\phi_R$ and high $\phi_L$, the $V_3$ level is retained without being affected by changes in the address input signals. During the period with a low $\phi_R$ and $\phi_L$, all word lines are unselected irrespective of the $V_A$ inputs. Precharging of the data lines takes place in the period when all word lines are unselected.

In the next operational cycle when the ADR ($X_0$-$X_n$) input varies, causing any of the $V_A$ inputs of the 8X11 to go low, the word line W shown in FIG. 24 is no more selected even if the $\phi_R$ and $\phi_L$ are the same as the previous cycle, and other word will be selected. In the stand-by mode, the $\overline{CS}$ input is kept high so that all word lines are unselected, thereby holding the data lines in the precharge state.

Although in all timing diagrams including those of FIGS. 23 and 25 the ADR input and $\overline{CS}$ input are shown to be in-phase, if the $\overline{CS}$ input goes low faster than ADR input, a word line determined by the ADR input of the previous cycle can possibly be selected. Conversely, if the transition of the $\overline{CS}$ input has a time lag, the memory access time will increase by the length of delay. Generally, the $\overline{CS}$ input and ADR input are switched in-phase, or the former is slightly delayed behind the latter. In this case the $\phi_R$ and $\phi_L$ are produced from the $\overline{CS}$ input, and therefore the memory access time is determined to be the period from the transition of the $\overline{CS}$ input to the settlement of the memory output DO.

Next, the influence of the word line reset function and latch function attached to the decoder circuit to the memory access time will be described. In the general arrangement of the decoder circuit, the 8X11 is located in the outer section of a chip, while the 8X14 is disposed in the immediate periphery of the memory cell array, resulting in a long wiring between the 8X11 and 8X12 and thus in a greater parasitic papacitance. On this account, it is advantageous for the driver 8X12 to be constructed as a composite driver circuit consisting of bipolar transistors with high driving ability and MIS transistors, rather than being constructed solely using MIS transistor. The arrangement of FIG. 24 employs a driver 8X12 with gate inputs, and the number of logic steps from the ADR input to the word line does not increase. The delay from a fall of $\overline{CS}$ input to a rise of $\phi_R$ can be made substantially equal to the delay from a transition of ADR input ($X_0$-$X_n$) to a change of $V_A$. Accordingly, the increase in the delay time due to the attachment of the reset function and latch function is not significant.

Figure 26:
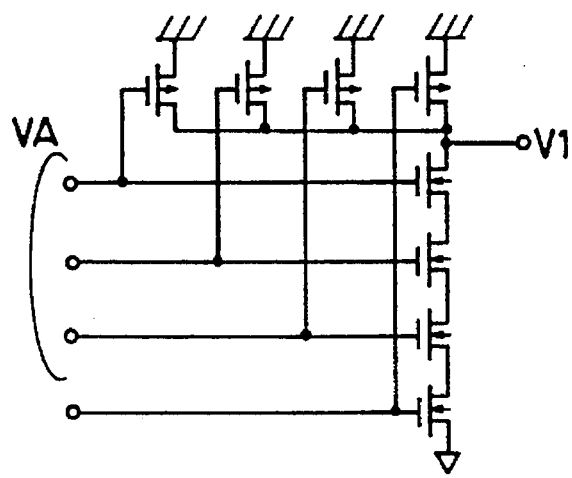
Figure 27:
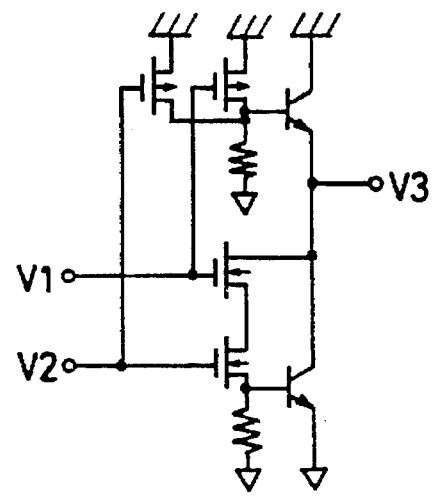
Figure 28:
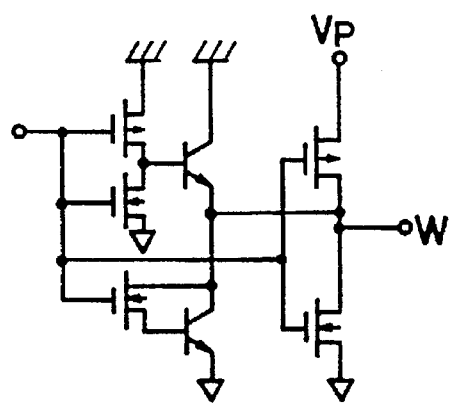
Figure 29:
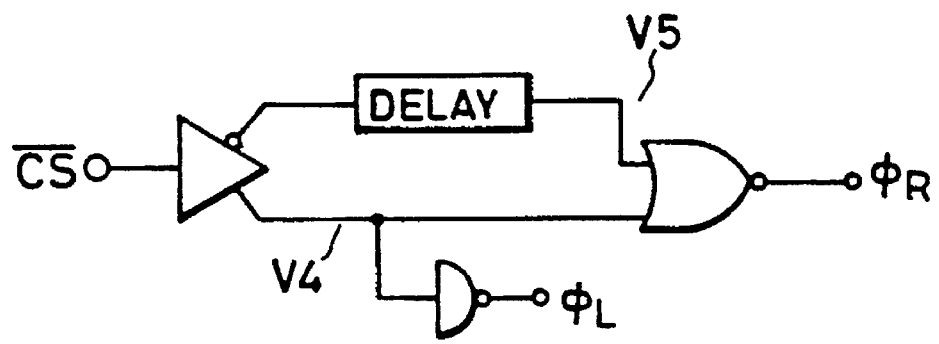
Figure 30:
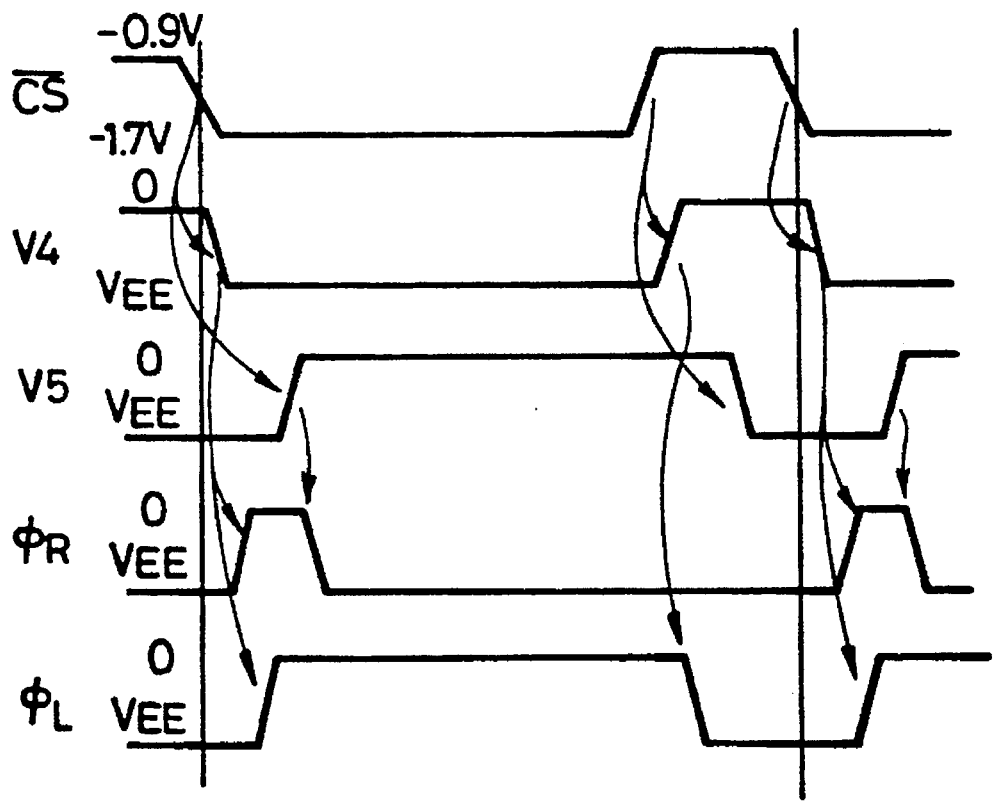

The elements 8X11 and 8X12 used in FIG. 24 can be constructed using conventional CMOS circuits and bipolar-MIS composite gate/driver circuits as shown in FIGS. 26 and 27, respectively. The word line driver can be constructed as a parallel connection of bipolar and MIS transistors as has been shown in FIG. 12 of the previous embodiment, and it operates fast and is immune to noises. The $V_p$ may be a GND level, or may be a positive level so as to work as a bootstrap circuit. The internal control signals $\phi_R$ and $\phi_L$ shown in FIG. 25 are generated as shown in FIG. 30 using a simple logic circuit as shown in FIG. 29.

Figure 31:
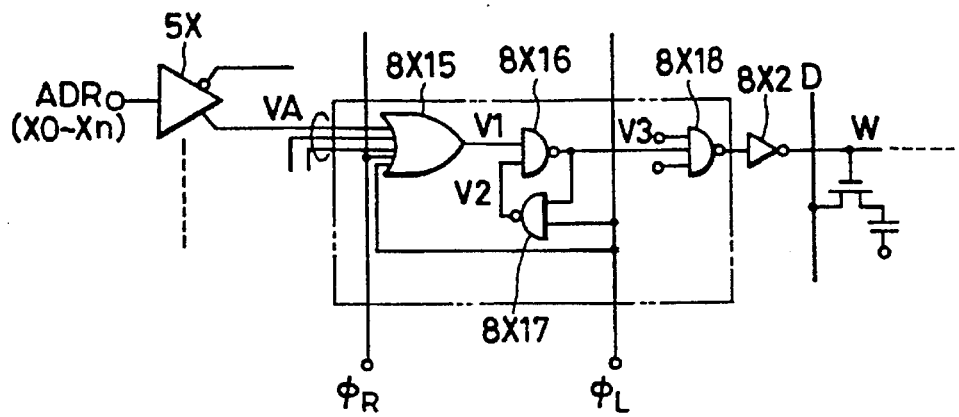
Figure 32:
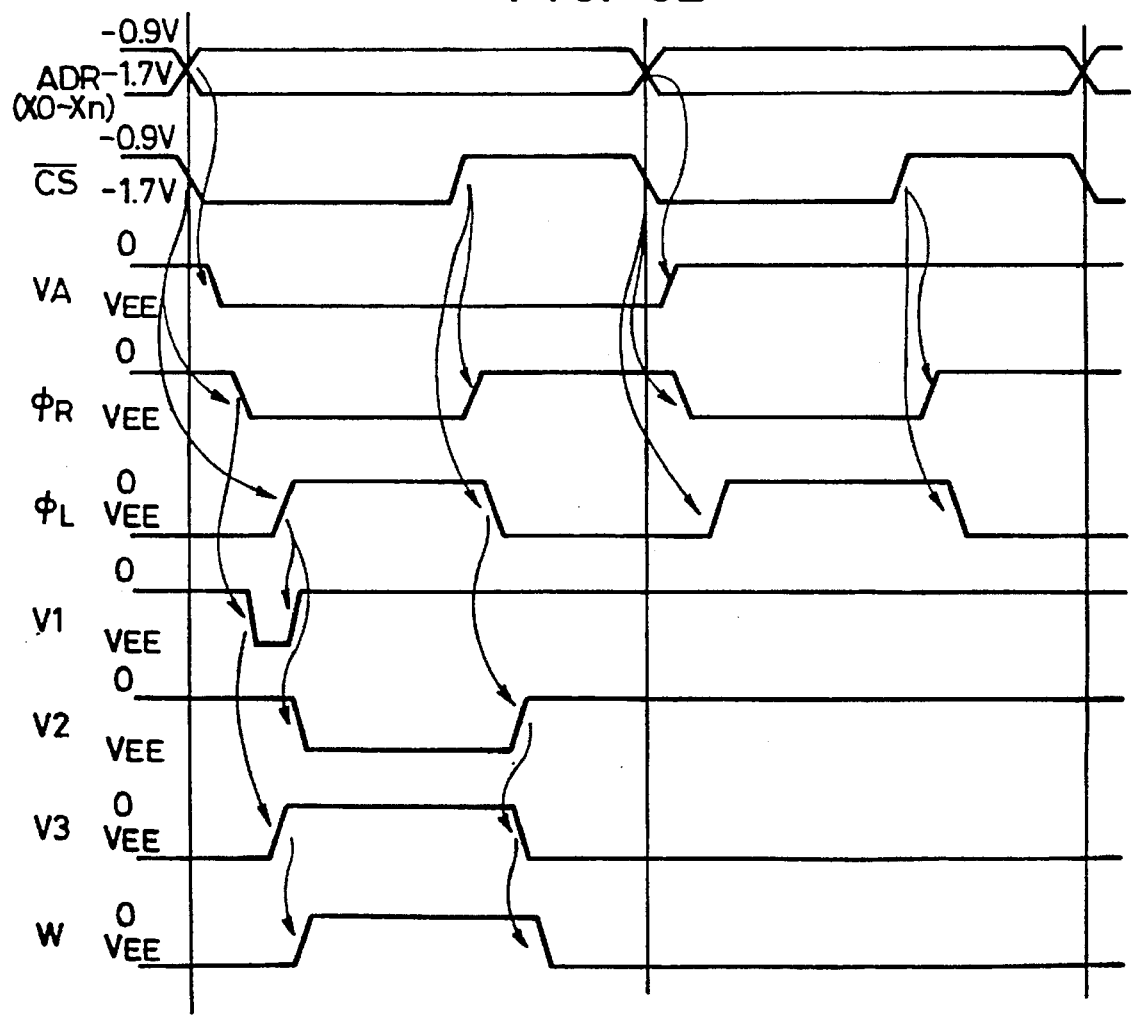

Next, the second embodiment of providing the word line signal reset function and latch function for the decoder circuit will be described in connection with FIG. 31. This circuit arrangement, as opposed to the case of FIG. 24, employs an OR gate for the front end of the decoder, with the latch section 8X16 and 8X17 being identical to the arrangement of FIG. 24. The circuit operates in response to pulses $\phi_R$ and $\phi_L$ having different waveshapes from those of FIG. 24. FIG. 32 shows the signal waveforms of the circuit shown in FIG. 31. The 8X15 produces a low output V1 only when all of three address buffer outputs $V_A$ are low and the $\phi_R$ and $\phi_L$ are low, causing the word line W to become in a selected state. When the $\phi_L$ goes low, the 8X15 makes the V1 high irrespective of the states of $\phi_R$ and $V_A$, and the latch circuit made up of 8X16 and 8X17 sets up the $V_3$ to be high (selected) or low (unselected). With the $\phi_R$ and $\phi_L$ being high and low, respectively, all word lines are brought to the unselected state in correspondence to the precharge operation for the data lines. The 5-input OR gate 8X15 in FIG. 31 can readily be arranged in the form of wired-OR connection of emitter followers. The circuit arrangement of FIG. 31 is shown more practically in FIG. 33. The circuit is an input buffer/decoder for selecting one of 512 words using the ECL-compatible address signals $X_0$–$X_n$, and it employs level converters for the address buffer 5X and gate circuit 8X16 so as to produce MOS-level signals (amplitude of approx. 5 volts) from ECL-level input signals (amplitude of 0.8 volt). The 0.8-volt input amplitude is amplified to 2.8 volts by the 5X, and it is further amplified to 5 volts by the 8X16. Element LS used in the address buffer 5X serves as a level shift circuit. Corresponding outputs $V_1$ of three 5X circuit blocks are connected together for wired-OR, and only one of eight output lines is made low representing the selected state. Both the $\phi_R$ and $\phi_L$ are applied to the base of each emitter follower, and the $\phi_L$ is further applied to the 2-input CMOS NAND gate 8X17. The $V_2$, $V_3$ and $V_3'$ are MOS-level signals having amplitudes of about 4–5 volts.

Figure 33:
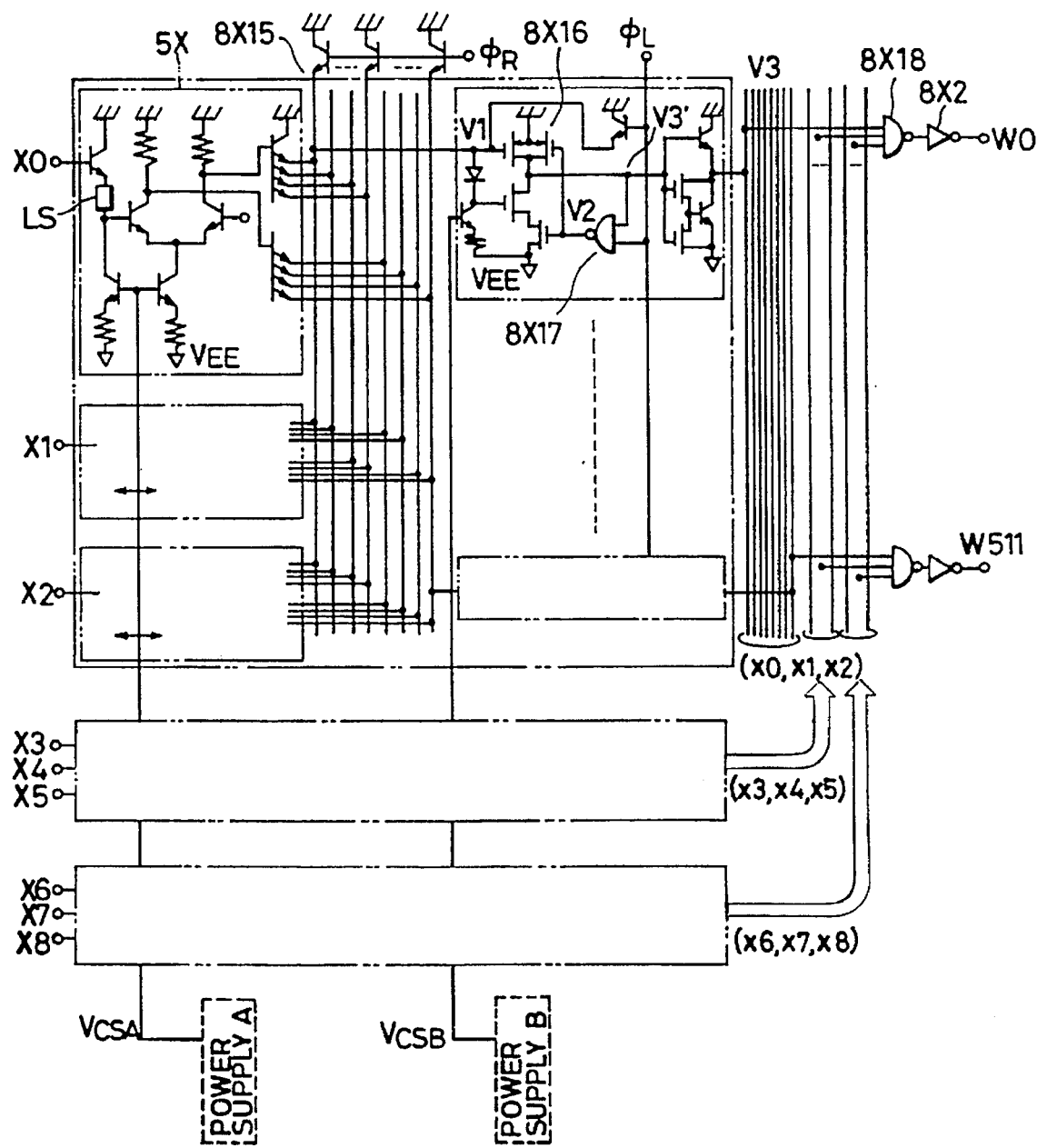
Figure 34:
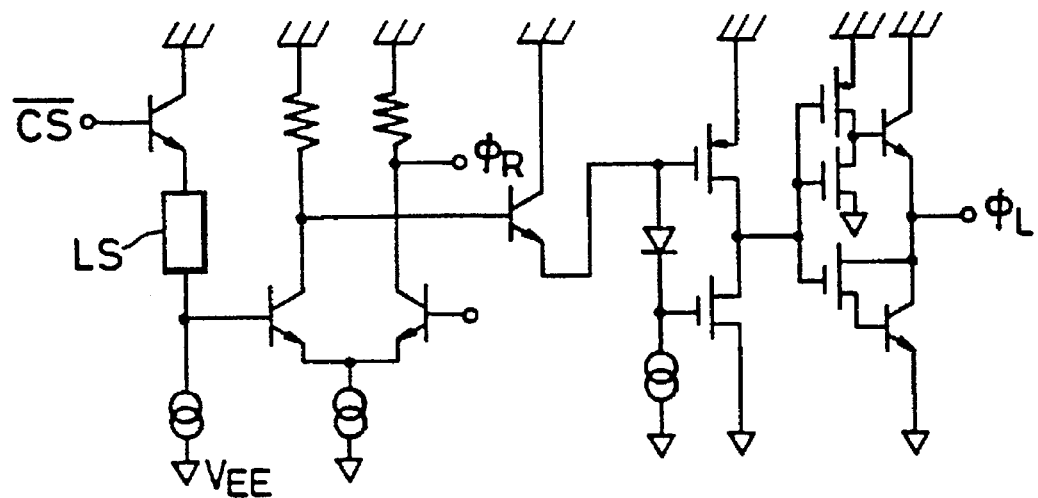
Figure 35:
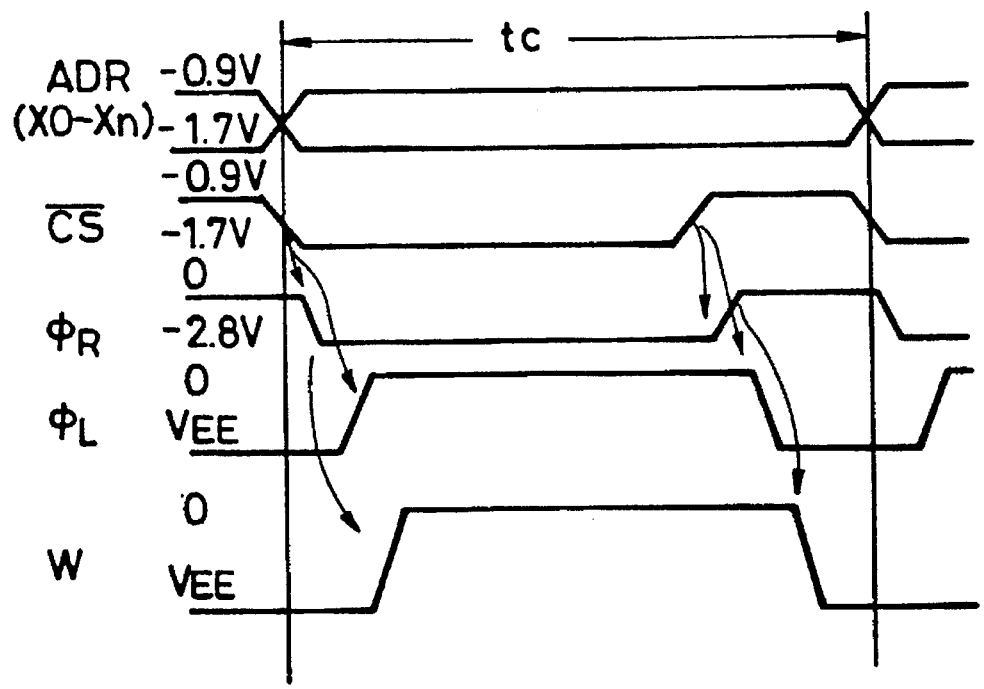

FIG. 34 shows the circuit for generating the $\phi_R$ and $\phi_L$. The signal levels and timing relationship of FIGS. 33 and 34 are shown in FIG. 35. By lowering the level of $\phi_R$ sharply in response to the fall of the $\overline{CS}$ input, the memory access time are not virtually increased by the attachment of the reset and latch functions for the word line signal incorporated in the decoder circuit.

Figure 36:
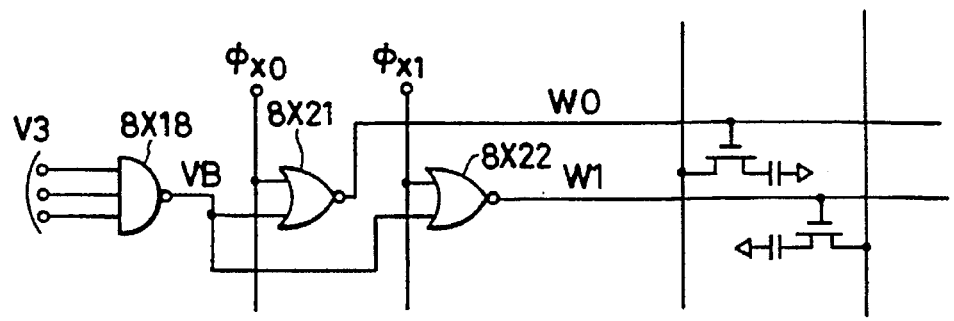
Figure 37:
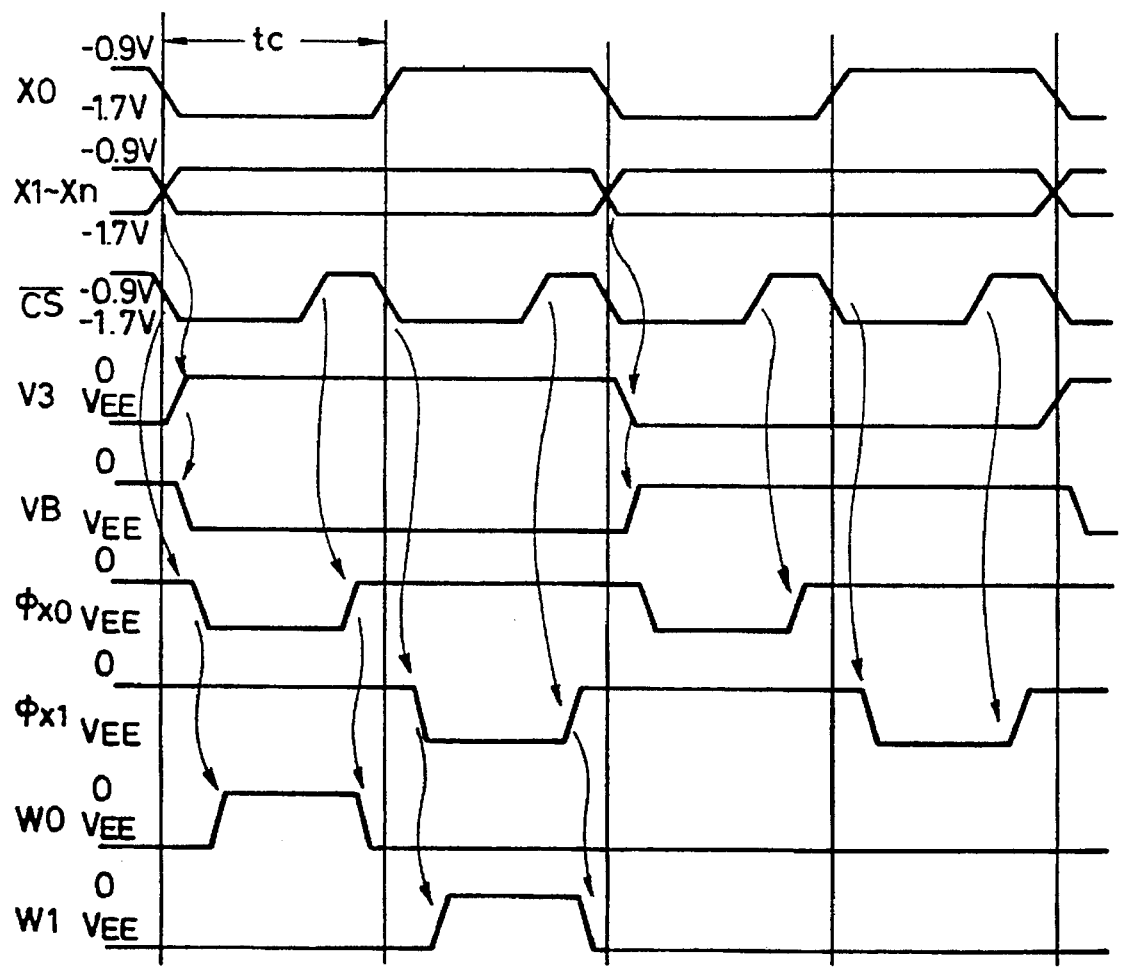

The following describes an embodiment of building the word line reset function (all word unselection function) in the word driver including bipolar transistors. FIG. 36 shows the logic circuit of this embodiment, in which a pair of word drivers 8X21 and 8X22 receive commonly the output $V_B$ of the X decoder 8X18 in accordance with the reset signals $\phi_{x0}$ and $\phi_{x1}$, respectively. FIG. 37 shows the timing relationship of the signals. The presence or absence of the $\phi_{x0}$ and $\phi_{x1}$ pulses is determined by the $X_0$ input and their phase and width are determined from the $\overline{CS}$ input. A certain word line is brought to a high selected state during a period when the X decoder output $V_B$ is low and the $\phi_{x0}$ and $\phi_{x1}$ are also low. When both of the $\phi_{x0}$ and $\phi_{x1}$ are high, all word lines are in the low unselected state regardless of the address signal (resulting in $V_B$), thereby providing a precharge period for the data lines. Although in FIG. 36 the output $V_B$ of the X decoder is used commonly for the inputs of the word drivers 8X21 and 8X22, it is of course possible to use the output of one decoder for one driver as in the cases of FIGS. 24 and 31. Conversely, it is also possible to use the output of one decoder commonly for three or more drivers as will be described later.

Figure 38:
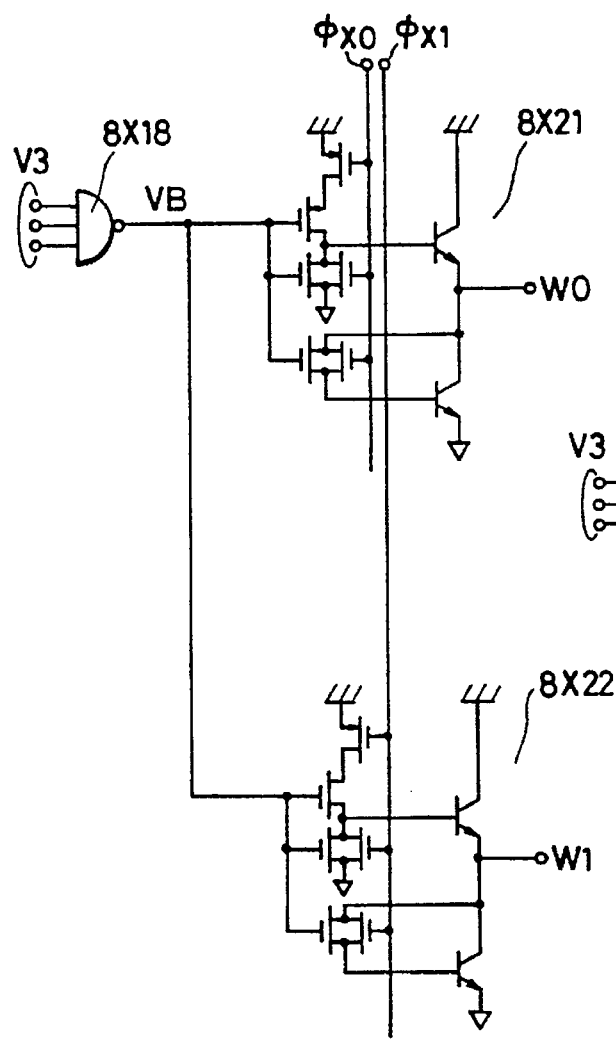
Figure 39:
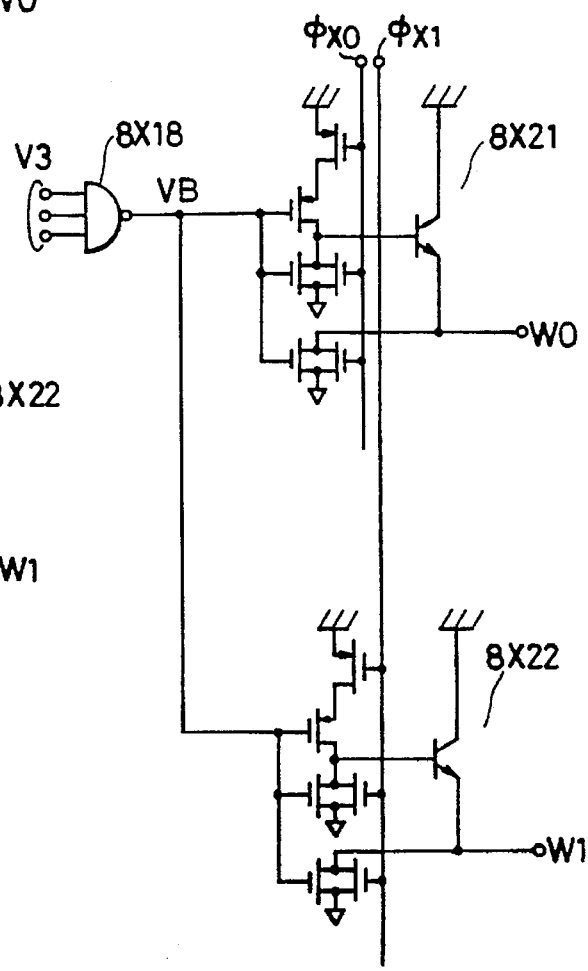
Figure 40:
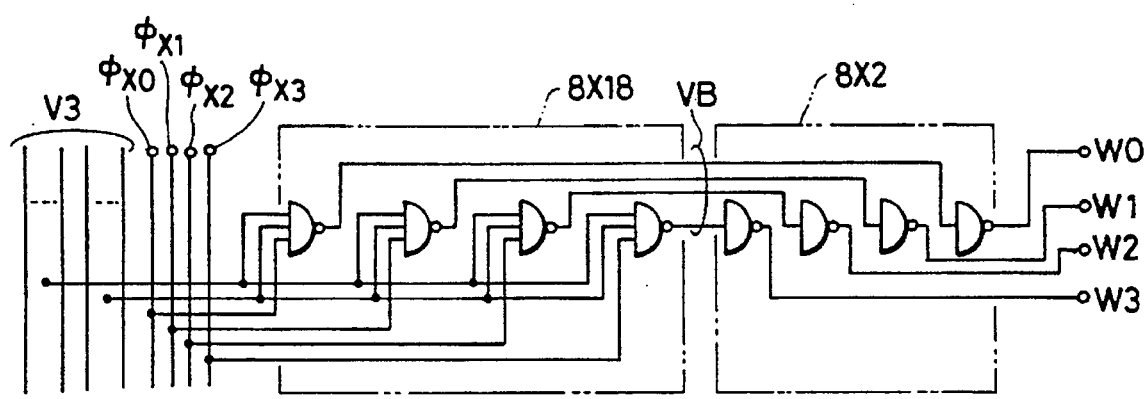
Figure 41:
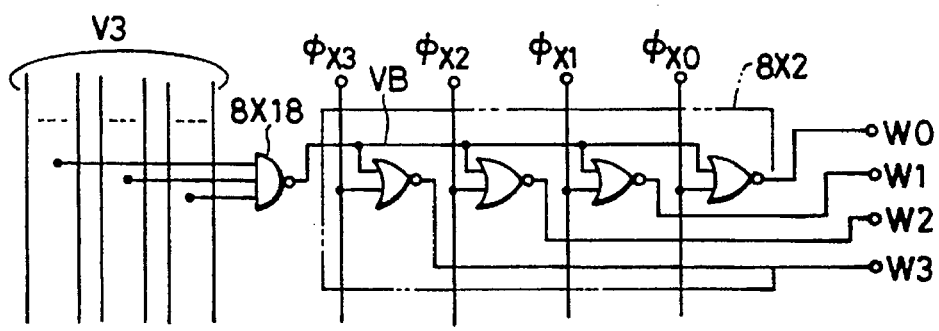

FIGS. 38 and 39 show practical logic circuit arrangements for the word driver in FIG. 36 in the form of composite gate/driver consisting of bipolar and MIS transistors. In the arrangement of FIG. 38, the word line is driven by two vertically connected bipolar transistors, and the load capacitance can be charged and discharged quickly. In the arrangement of FIG. 39, the lower bipolar transistor is eliminated, and the load capacitance is charged by the bipolar transistor and discharged by the n-channel MIS transistor. This arrangement does not need isolation of bipolar transistors for each word. The reason is that the upper bipolar transistors have a common collector voltage of 0 volt for all words, allowing themselves to be constructed on a common n-type buried layer (collector region). Accordingly, the area of the word driver circuit can be reduced. The dimensions of usual dynamic memory cells are so small as to allow the layout of the bipolar-MIS composite driver circuit or decoder circuit in the same pitch as of the memory cells. On this account, the circuit arrangements of FIGS. 38 and 39 share an X decoder for two word lines. This design scheme is further expanded in the arrangement of FIG. 40, in which four X decoders and word drivers for four word lines $W_0$, $W_1$, $W_2$ and $W_3$ are aligned in parallel to the word lines. By using two of three decoder inputs commonly for the four decoders, the number of word lines and the vertical dimension are prevented from increasing. With the two inputs from the preceding decoder output $V_3$ being high and any of $\phi_{x0}$–$\phi_{x3}$ becoming high, a corresponding $V_B$ output goes low, resulting in a high selection state of the respective word line among $W_0$–$W_3$. In the precharge mode or stand-by mode, all of $\phi_{x0}$–$\phi_{x3}$ are made low. Although in this embodiment the X decoders and word drivers for four word lines are grouped, word lines of a group are not limited to four, but any number of word lines may be grouped. The arrangement of FIG. 41 uses a common X decoder as in the cases of FIGS. 38 and 39, and has a plurality of (four) word drivers aligned in parallel to the word lines. In this embodiment, when three inputs from $V_3$ are high and any of $\phi_{x0}$–$\phi_{x3}$ goes low, a corresponding word line among $W_0$–$W_3$ becomes a high selected state.

Figure 42:
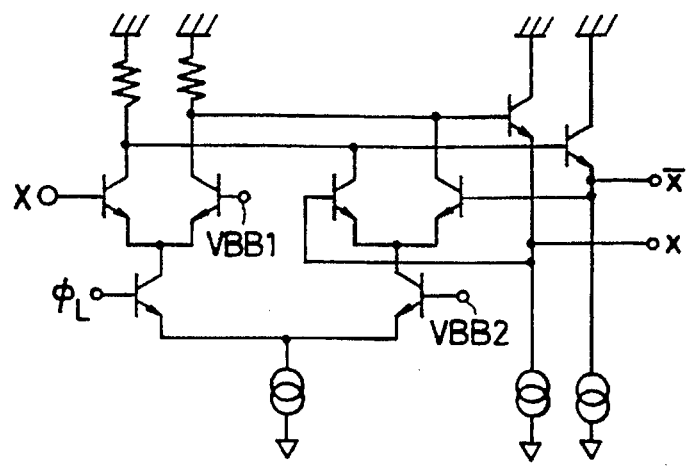
Figure 43:
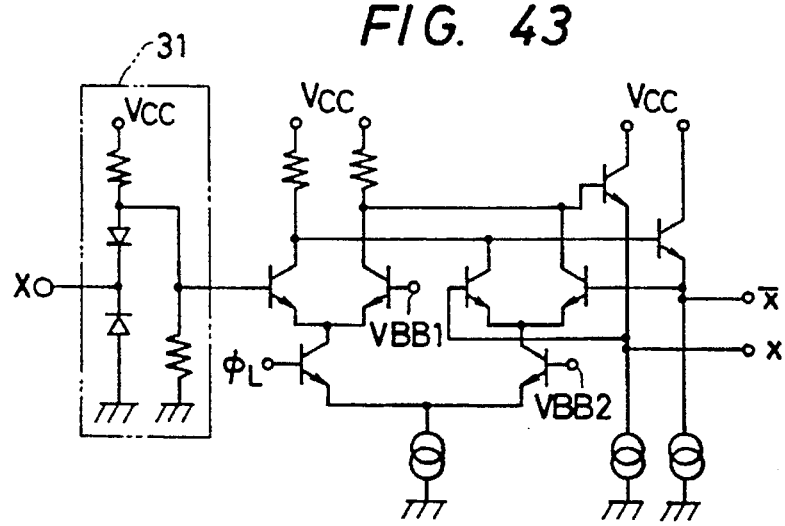
Figure 44:
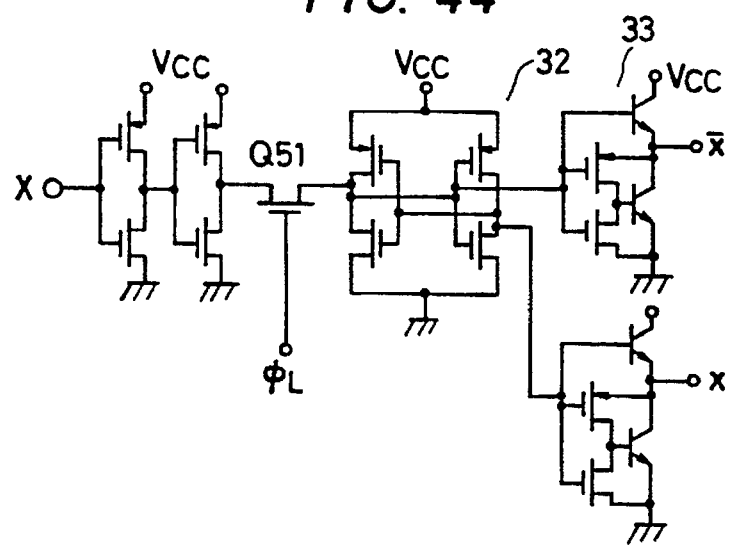
Figure 45:
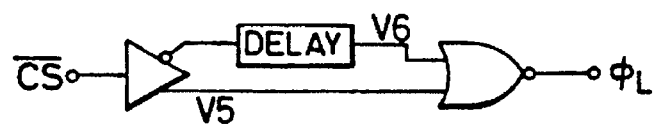
Figure 46:
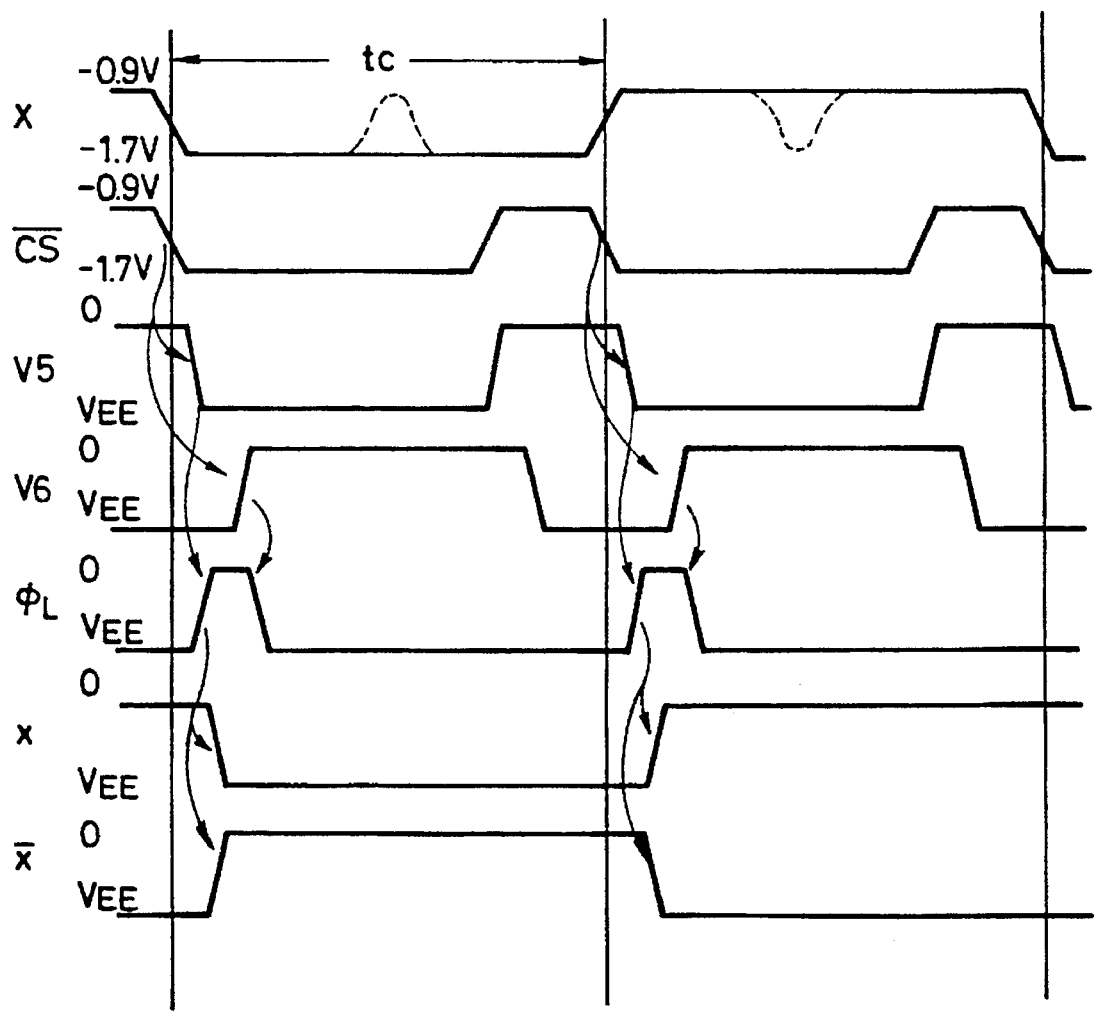

It is possible for the arrangements of FIGS. 36 through 41 to incorporate the all-word unselection function by the control of $\phi_{x0}$–$\phi_{x3}$, but in this case the arrangement further needs a latch function for holding the selected and unselected states of word lines after memory cell reading until rewriting is completed to be attached to the front decoder of the word driver circuit and the address buffer circuit. Embodiments of constructing the latch function in the decoder circuit have already been shown in FIGS. 24, 31 and 33. Different embodiments of building the latch function in the input buffer circuit will be described with reference to FIGS. 42 through 44. Shown in FIG. 42 is an address buffer circuit with the latch function accomplished using bipolar transistors, and it is suitable for handling ECL input signals. The circuit operates such that when the latch signal $\phi_L$ is at a high level with respect to the reference voltage $V_{BB2}$, the address input X is compared with the reference voltage $V_{BB1}$, and buffer outputs x and $\overline{x}$ are produced through the level conversion. When the $\phi_L$ goes below the $V_{BB2}$, the output reflecting the input are retained by the feedback of the outputs x and $\overline{x}$. The circuit arrangement of FIG. 42 suitable for the ECL input can readily be modified to suit the TTL input. The circuit arrangement of FIG. 43 has a level shift circuit 31 attached to the front end of the arrangement shown in FIG. 42. The operation of the latch circuit is exactly the same as of FIG. 42. By combination of the latch circuit shown in FIGS. 42 and 43 with the high-amplitude converter shown in FIG. 34, the circuit becomes capable of driving a CMOS decoder or the like. A latch circuit shown in FIG. 44 is suitable for the TTL input, and in this case the steady state current is nullified through the use of CMOS circuits and bipolar-MIS transistors. The 2-stage CMOS circuits provided at the front end converts the TTL input to a high-amplitude MOS level signal. The number of stages, which is two in FIG. 44, may be determined in consideration of the feed-through current and operating speed. With the $\phi_L$ being high, the address input X produces buffer outputs x and x̄ by way of a transfer MOS transistor Q51, flip-flop 32 and bipolar-MIS composite drivers 33. When the $\phi_L$ goes low, the Q51 is cut off and the flip-flop 32 memorizing the address input holds the outputs x and x̄. The latch drive signal $\phi_L$ can readily be generated using a circuit made up of bipolar or MIS transistors, or combination thereof as shown in FIG. 45. FIG. 46 shows the waveforms of signals in the circuit arrangements of FIGS. 42 and 45. Noises entered in the X input during periods of low $\phi_L$ as shown by the dashed waveform in FIG. 46 do not affect the outputs x and x̄.

Figure 47:
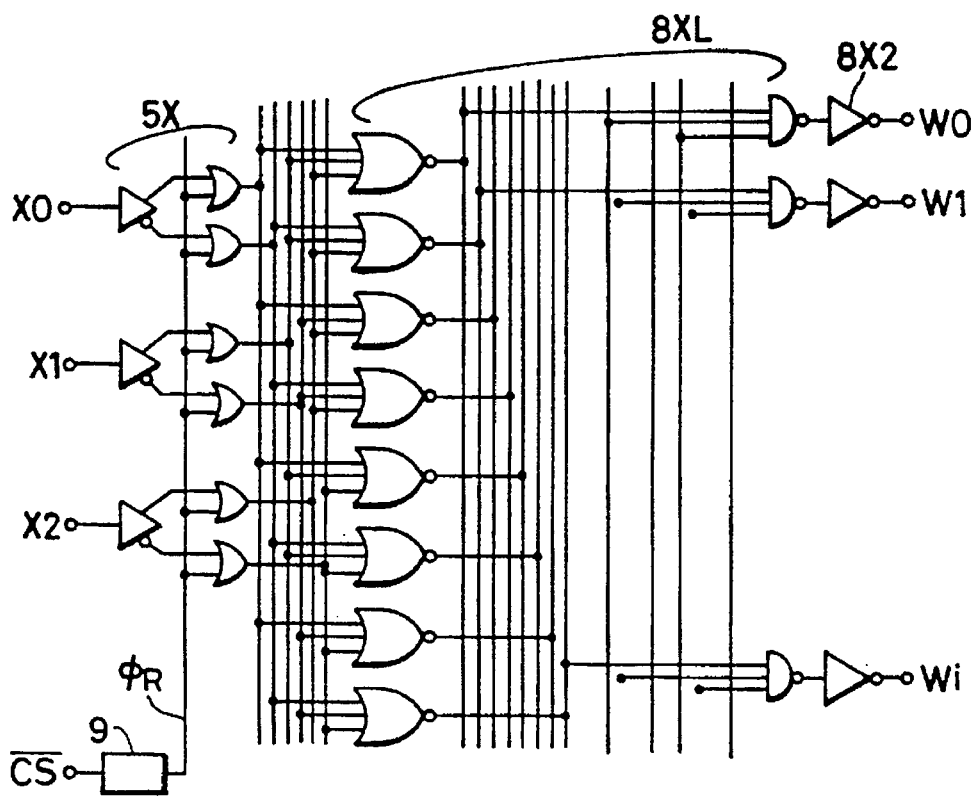
Figure 48:
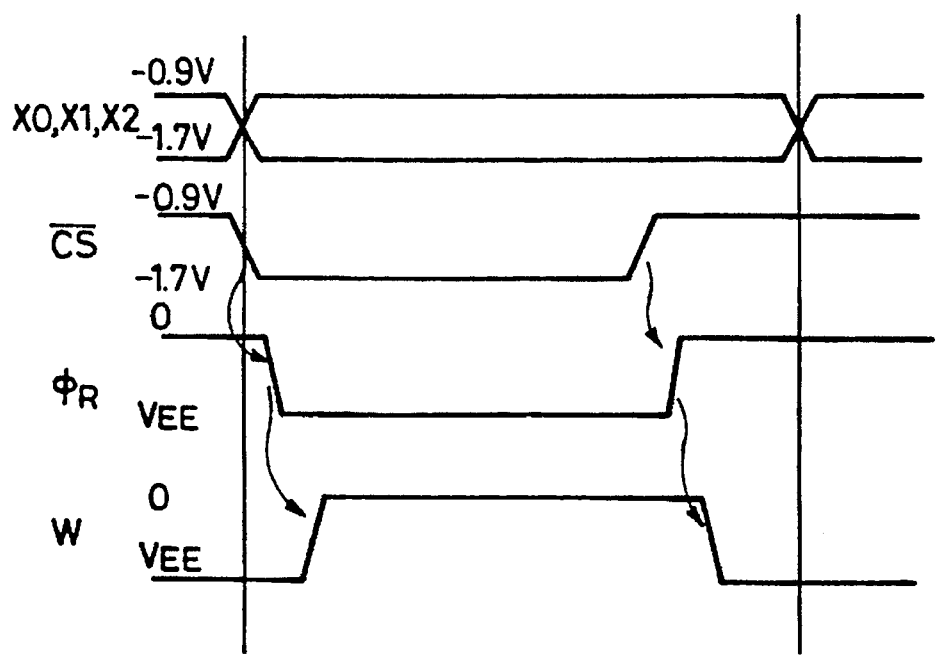
Figure 49:
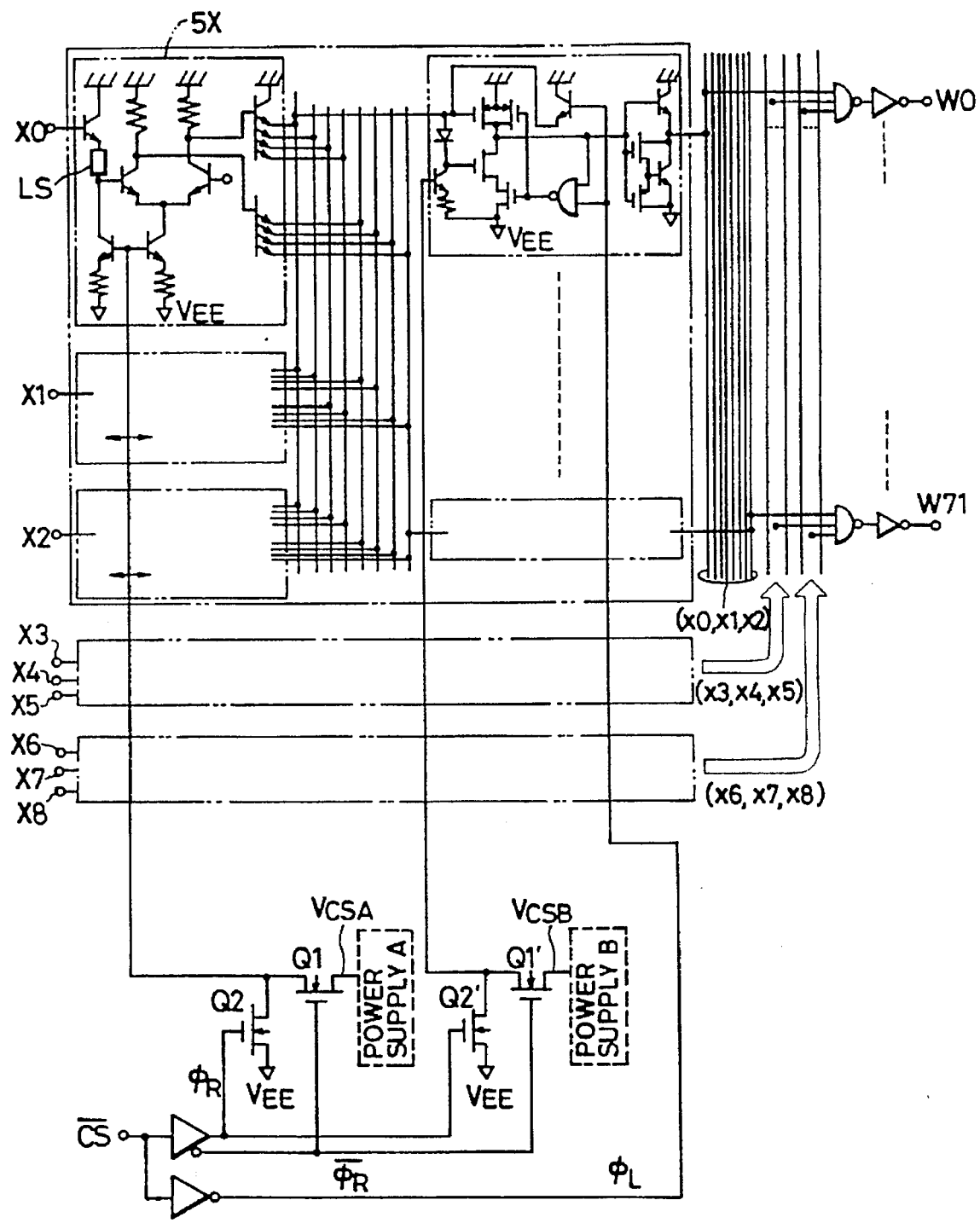

Next, an embodiment of the function (reset function) for unselecting all word lines during the data line precharge period constructed in the address buffer circuit will be described with reference to FIG. 47. The circuit arrangement includes an address buffer 5X, decoder 8X1 and word driver 8X2. The address buffer is attached with a logical OR function so that a high $\phi_R$ produced from the high $\overline{CS}$ input causes all word lines to go low for unselection and a low $\overline{CS}$ input enables one word line to be selected depending on the address input. More practical circuit arrangement of FIG. 47 is shown in FIG. 49, in which the address buffer is provided with the word line reset function, and the decoder is provided with the latch function as in FIG. 33.

The arrangement is provided with a current control circuit including HIS transistor switches Q1, Q2, Q1' and Q2' disposed between the power supply circuits A and B and the constant current sources of the input buffer and emitter follower. With the $\overline{CS}$ input being high, the $\phi_R$ and $\overline{\phi_R}$ become high and low, respectively, causing the Q1 and Q1' to be cut off and Q2 and Q2' to be conductive, and the currents in the input buffer and emitter follower are nullified. Then, all outputs of the address input buffer go high, and all word lines become the unselected state at low level. When the $\overline{CS}$ input goes low, the $\phi_R$ and $\overline{\phi_R}$ go low and high, respectively, causing the voltages $V_{CSA}$ and $VCS_B$ to be applied through the Q1 and Q1' to the respective constant current sources, which then provide certain amounts of current. Consequently, only one word line is selected in response to the address input. The latch circuit provided for the decoder is the same as shown in FIG. 33.

This embodiment achieves both of unselecting all word lines and cutting off power of the address buffer and emitter follower during the stand-by mode and data line precharge mode, whereby the power dissipation in the stand-by state and precharge state can be reduced significantly.

Figure 50:
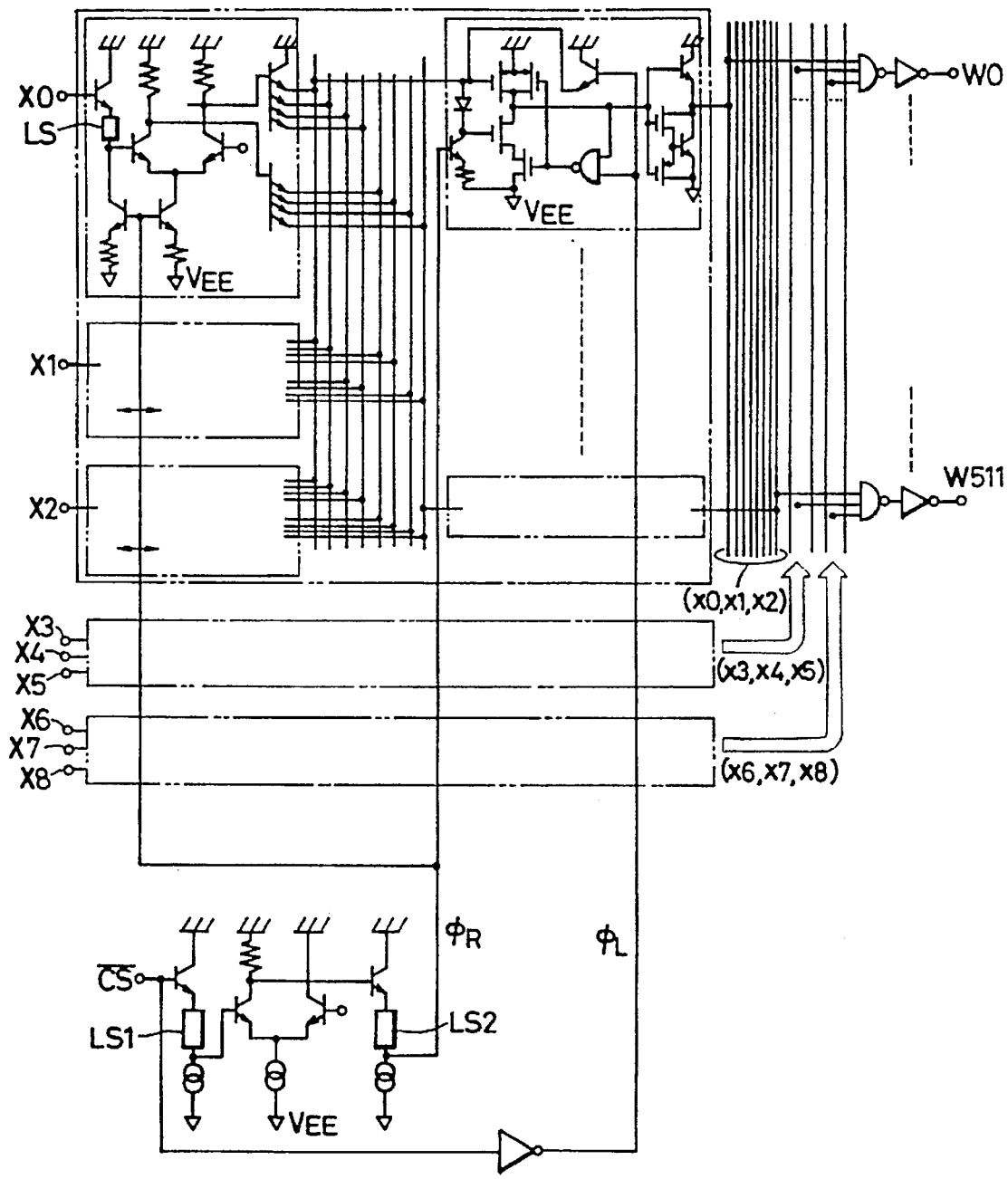

The arrangement of FIG. 50 is designed for the same purpose, and is intended to vary the constant current source drive voltage $\phi_R$ in a manner of pulsation. In the arrangement, circuit blocks LS, LS2 and LS3 are all level shift circuits. In operation, when the $\overline{CS}$ input is high, the $\phi_R$ is made low, so that the constant current sources for the input buffer and emitter follower are cut off. With the $\overline{CS}$ input becoming low, the $\phi_R$ goes high, allowing the flow of current as specified. This circuit arrangement can also achieve the all-word unselecting mode and power reduction at the same time.

The foregoing word line control is based on the provision of dummy cells separately from memory cells with differential signals of both cells being read out onto data line pairs, and the dummy word lines for the dummy cells need the reset function and latch function as for the real word lines. The dummy word lines can be controlled in exactly the same timing relationship as for the aforementioned word lines. The dummy cells are made to have a storage capacitance $C_{SD}$ half or less the storage capacitance $C_S$ of the memory cells, and are set to a low level in advance at precharging. The precharge circuit drive signal $\phi_p$ may be used as a drive signal for this purpose.

In the foregoing embodiments shown in FIGS. 24 through 50, the reset function for making all word lines unselected in correspondence to data line precharging and the latch function for holding the selected or unselected state of word lines during a period between the reading and rewriting of dynamic cells are provided in a section between the address buffer and driver. These functions are needed only for the word circuits of dynamic memory, and switching of the column selection signal $\phi_Y$ (see FIG. 3A) does not always need to be in synchronism with the switching of word lines. Accordingly, the Y-system address buffer 5Y and decoder/driver 8Y may be rid of control by the $\overline{CS}$ input, but the $\phi_Y$ may be switched in response to a change in the address input $Y_0$–$Y_n$. This allows the static column mode operation and page mode operation in which the column is switched while the word line is left selected can take place without restriction.

Figure 51:
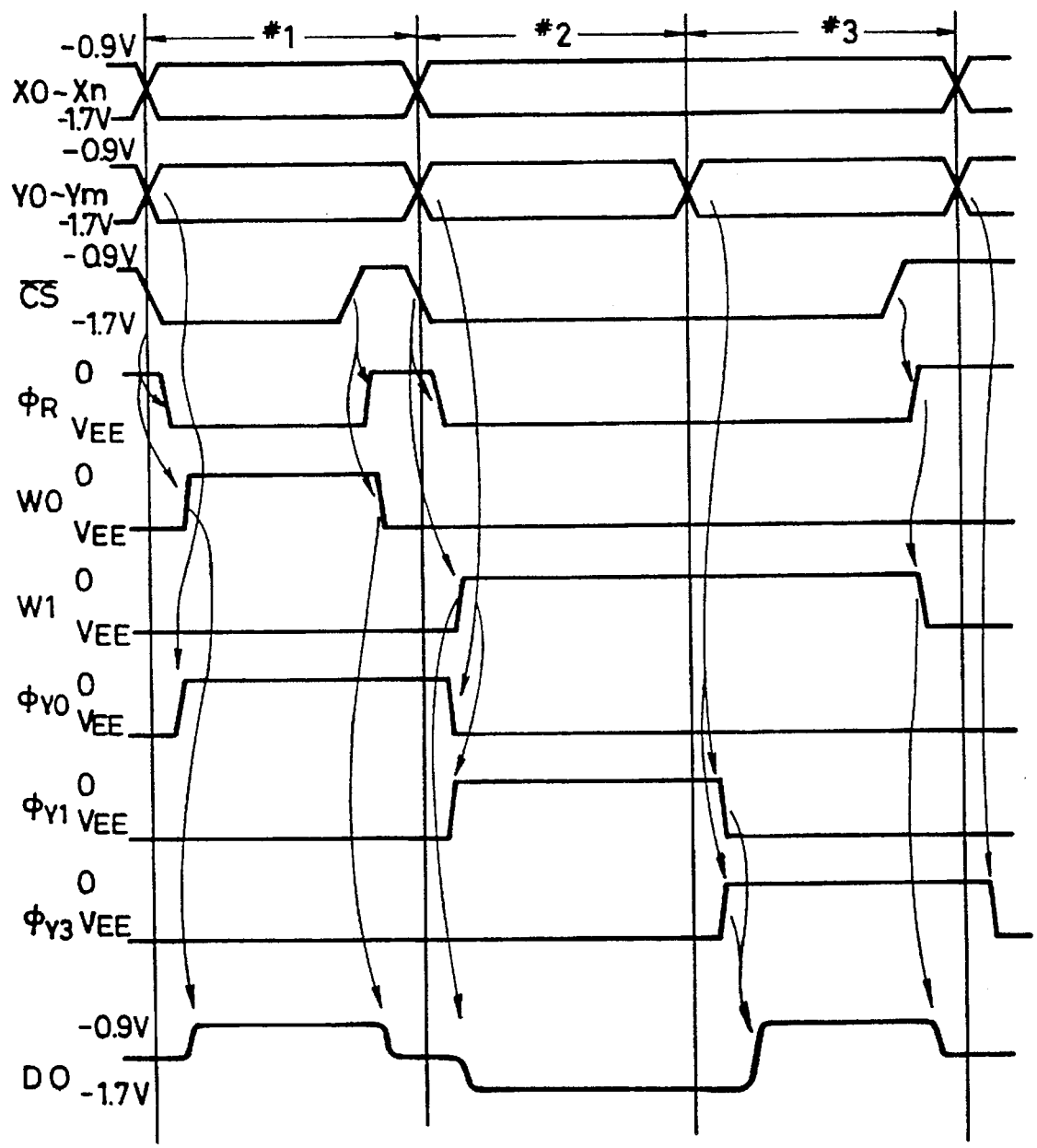

FIG. 51 shows the waveforms of the internal control signal $\phi_R$, word line signals $W_0$ and $W_1$, column selection signals $\phi_{Y0}$, $\phi_{Y1}$ and $\phi_{Y2}$ and memory output DO of the case in consideration of the switching of the Y-system address signals $Y_0$–$Y_m$. Cycle #1 is for the selection of word line $W_0$ under control of the $\overline{CS}$ input as described above, in which is shown a transition of selection for $\phi_{Y0}$ by the switching of the $Y_0$–$Y_m$ input. Cycle #2 has the same former half period as of cycle #1, but in the latter half period the $\overline{CS}$ input is not made high and the sequence proceeds to cycle #3 while the word line $W_1$ being left selected. At this time, the $Y_0$–$Y_m$ input is switched, and the column selection moves from $\phi_{Y1}$ to $\phi_{Y2}$. In the latter section of cycle #3, the $\overline{CS}$ input is made high so that the sequence proceeds to the precharge mode. In this way, cell selection varies in cycles #1, #2 and #3, and the DO output also varies accordingly. At the beginning and end of cycle #1 and at the beginning of cycle #3, all word lines are unselected in the precharge state, and therefore the DO is indeterminate even though the $\phi_Y$ is selected. Although the indeterminate output is expressed as a mid level in FIG. 51, it is often set to low for ECL or set to high-impedance for TTL, and in these cases the output circuit needs to be devised as will be described later.

As shown in FIGS. 3A and 23, the word line signal W, precharge circuit drive signal $\phi_P$ and drive signals $\phi_{SA1}$ and $\overline{\phi_{SA1}}$ of the sense amplifier restoration circuit (the first differential amplifier SA1 in FIG. 3A) all need to be synchronized, and this timing relationship is shown in FIG. 23.

Figure 52:
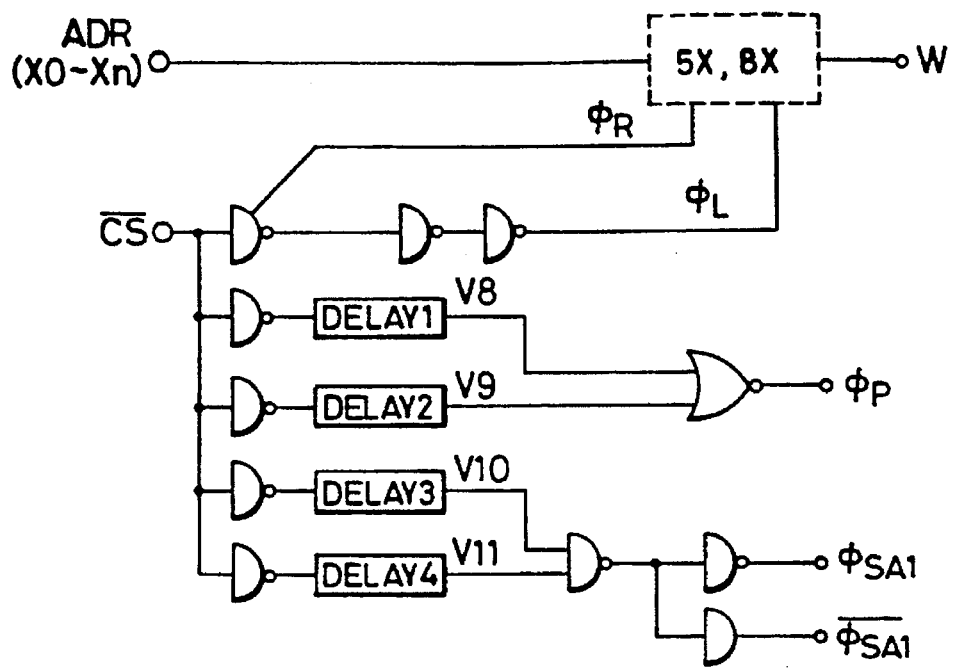
Figure 53:
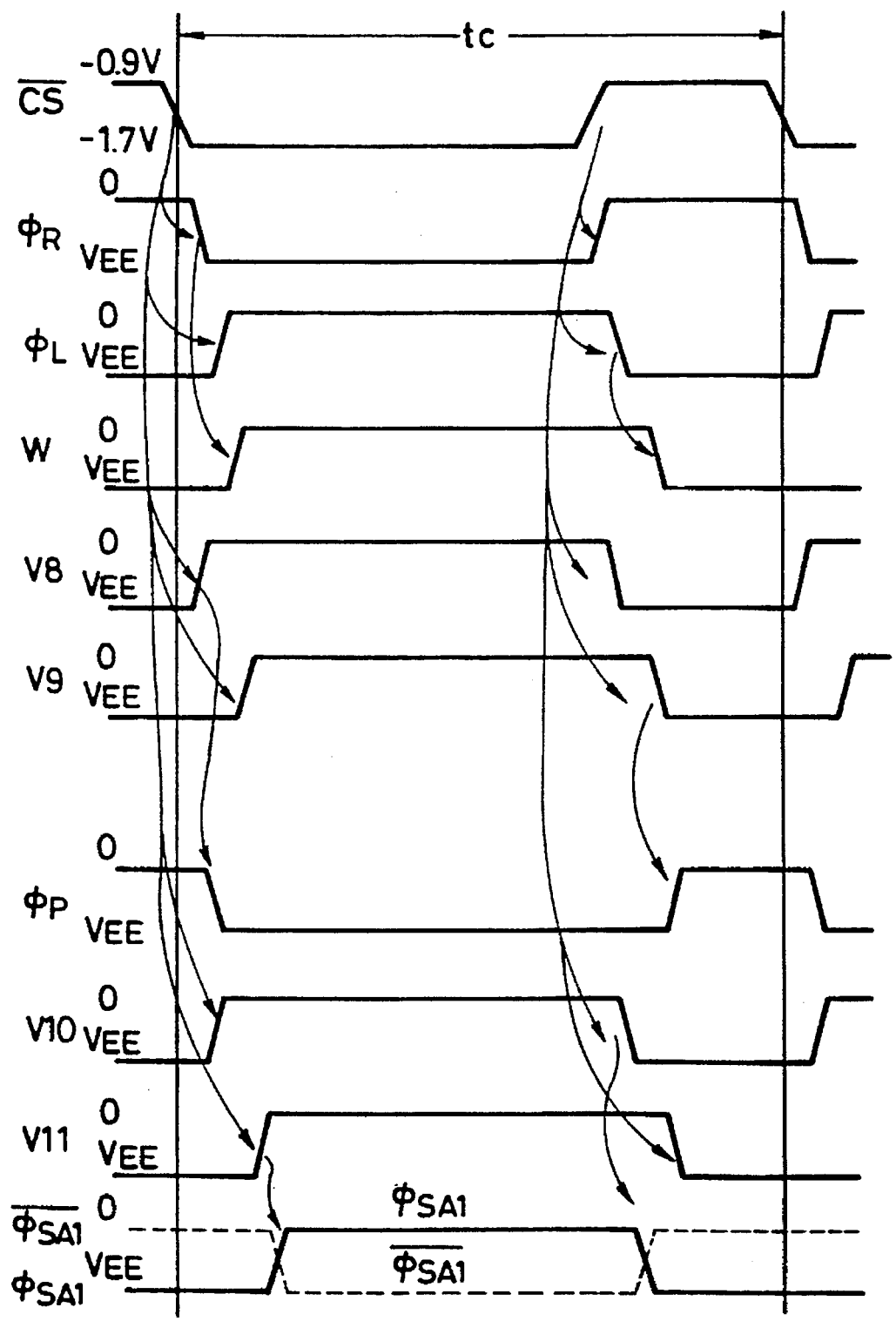

Next, an embodiment of the logic circuit for generating the above-mentioned group of signals under control of a single external input signal $\overline{CS}$ will be described in connection with FIG. 52. The figure shows a basic circuit arrangement for generating the data line precharge signal $\phi_P$ and the drive signals $\phi_{SA1}$ and $\overline{\phi_{SA1}}$ for the sense amplifier and active restoration circuit, together with the generation of the word line signal W using $\phi_R$ and $\phi_L$ shown in FIGS. 31 and 33. FIG. 53 shows the waveforms of signals produced by the circuit of FIG. 52. Prior to the selection of a word line W, the $\phi_P$ is made low so as to cancel the precharge mode. After a word line has been selected and memory reading has started, the $\phi_{SA1}$ and $\overline{\phi_{SA1}}$ are operated to activate the sense amplifier and active restoration circuit. After the reading and rewriting of memory cells, the word lines are made low, the $\phi_{SA1}$ and $\overline{\phi_{SA1}}$ are activated, and the sense amplifier and active restoration circuit are deactivated. Thereafter, the $\phi_P$ is made high to bring the data lines to the precharge mode preparatory to the next operating cycle. The phase differences between the W and the $\phi_P$, $\phi_{SA1}$ and $\overline{\phi_{SA1}}$ are set in consideration of operational margin around memory cells, and they can be produced arbitrarily using delay circuits (Delay 1, Delay 2, Delay 3, Delay 4), NOR gates and NAND gates.

Figure 54:
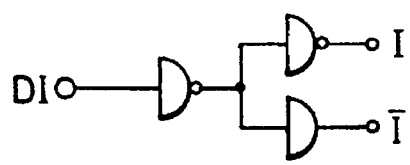
Figure 54:
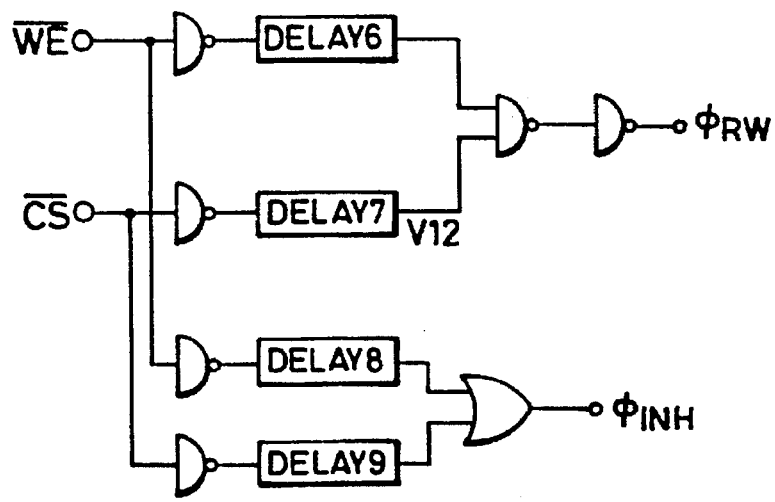

Next, a method for writing memory cells will be described. FIG. 54 shows an embodiment of generating the input line signals I and $\bar{\text{I}}$ and the write gate signal $\phi_{RW}$ for the write circuit shown in FIG. 8. The remaining drive signals W, $\phi_P$, $\phi_{SA1}$ and $\overline{\phi_{SA1}}$ are the same as for reading as described above. As shown in FIG. 54, I and $\bar{\text{I}}$ are derived from the data input signal DI through a buffer or inverter. In the write cycle, the $\overline{\text{CS}}$ input is low, and when the write signal $\overline{\text{WE}}$ goes low, data specified by the DI input is written in the selected memory cells. The $\phi_{RW}$ is high when both of the $\overline{\text{WE}}$ input and $\overline{\text{CS}}$ input are low. The timing of raising the $\phi_{RW}$ is preferably a certain time length after the word line W has been made high. The data lines immediately after the W has gone high carry small signals from memory cells, and if writing onto a selected data line takes place in this state, noises induced by the selected data line on unselected data lines disturb the small signals on the unselected data lines, resulting possibly in a malfunctional operation. On this account, the $\phi_{RW}$ should be applied after differential signals of all data line pairs have been amplified sufficiently following the operation of the sense amplifier and active restoration circuit. For this purpose, the $\phi_{RW}$ is generated with a certain time lag following the $\overline{\text{CS}}$ input by use of delay circuit Delay 7 as shown in FIG. 54. $\phi_{1NH}$ is an output circuit control signal for controlling the memory output to a certain level during the stand-by or writing mode, and further role of this signal will be described later.

Figure 55:
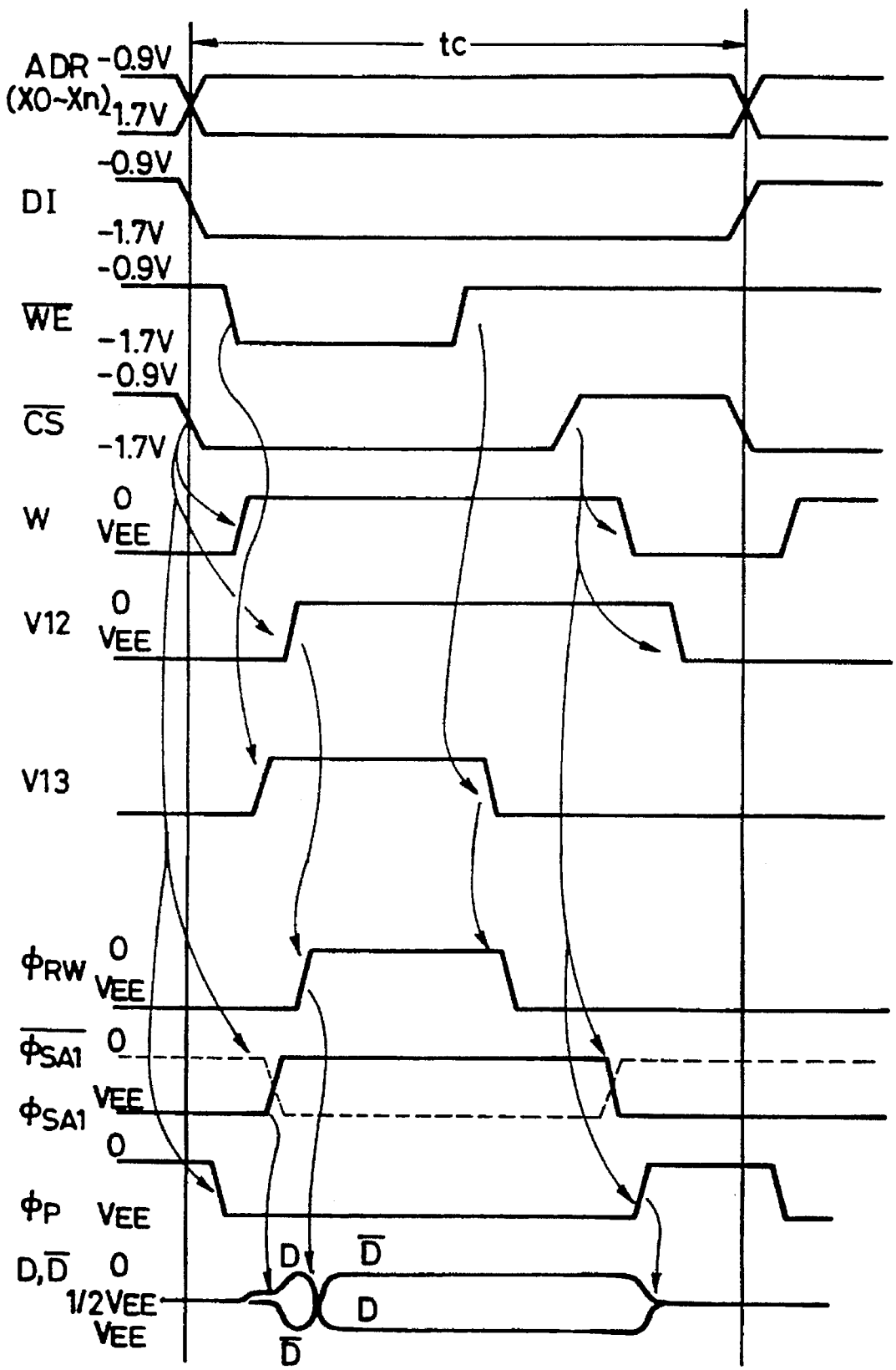

FIG. 55 shows the timing relationship of signals in FIG. 54. The figure shows that the $\phi_{RW}$ is applied after the $\phi_{SA1}$ and $\overline{\phi_{SA1}}$ have made a transition and data line signals have been amplified, and the selected data line is inverted forcedly in accordance with I and $\bar{\text{I}}$ for the writing of the selected memory cell. Although in the figure the falling edge of $\phi_{RW}$ is determined from the rising of the $\overline{\text{WE}}$ input, arrangement is also possible such that $\phi_{RW}$ with a constant pulse width is generated within the chip regardless of the pulse width of the $\overline{\text{WE}}$ input.

These are the generating methods of the W, $\phi_P$, $\phi_{SA1}$, $\overline{\phi_{SA1}}$ and $\phi_{RW}$ from the $\overline{\text{CS}}$ and $\overline{\text{WE}}$ inputs in the read and write modes. The $\overline{\text{CS}}$ and $\overline{\text{WE}}$ inputs are used not only for controlling signals around memory cells, but often used for memory output control. The $\phi_{1NH}$, which has been shown in FIG. 54, is the memory output control signal, and it operates to clamp the memory output to a certain level or brings it to a high-impedance state during the stand-by and write modes. The selected memory cell reads out data only in the read mode of operation. For example, in usual ECL-compatible memories, the memory output in the stand-by and write modes is clamped to a low level in many cases. In usual TTL-compatible memories, in which the tri-state output system is employed, the memory output is put to a high-impedance state during the stand-by and write modes in many cases.

Figure 56:
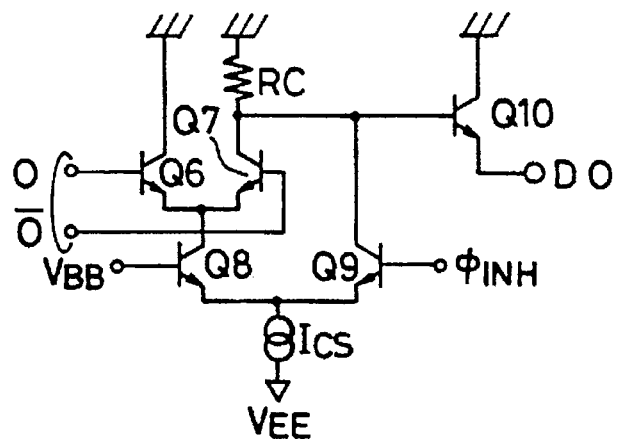
Figure 57:
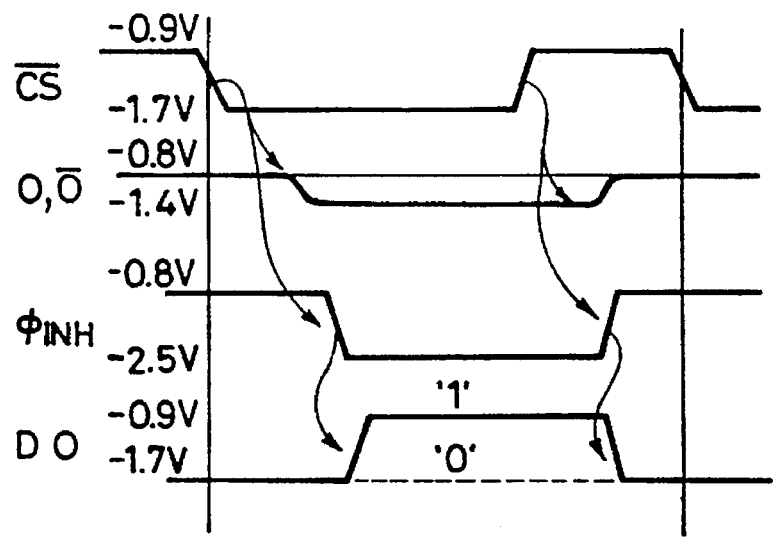
Figure 58:
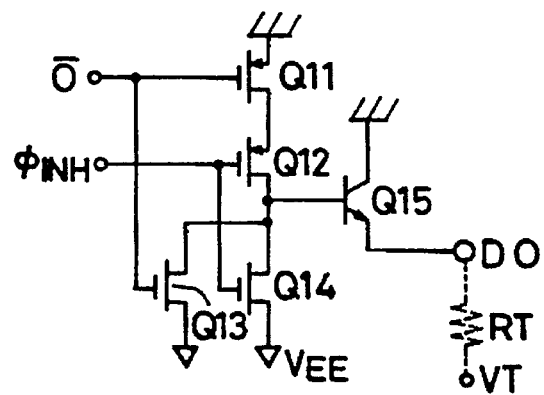
Figure 59:
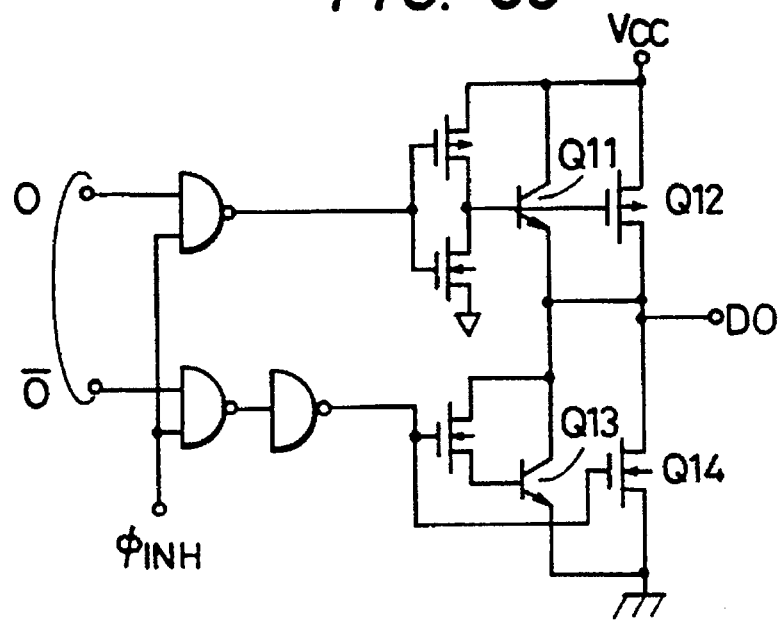
Figure 60:
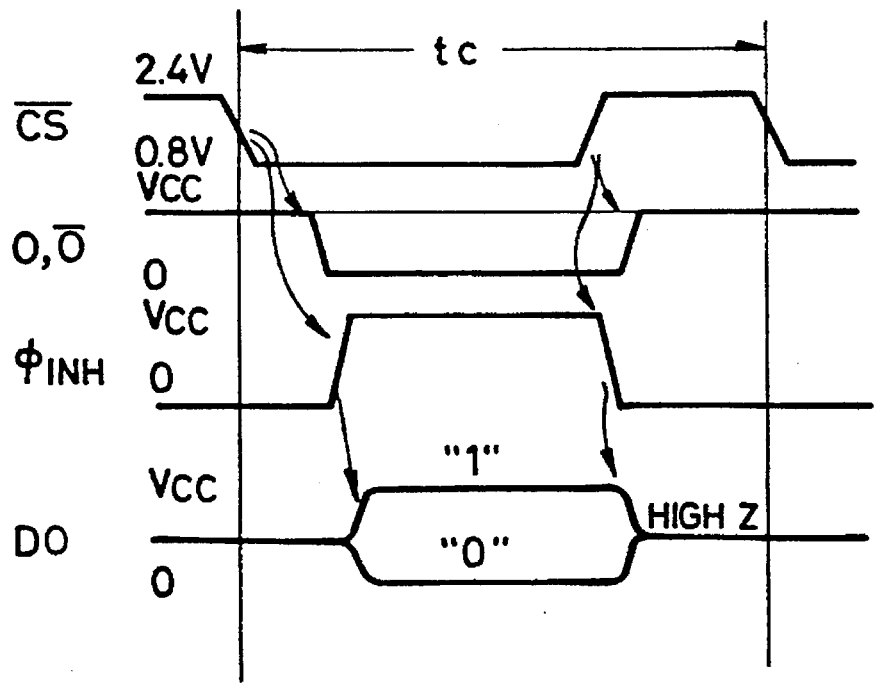

Embodiments of memory output circuit for realizing the above-mentioned function using bipolar and MIS transistors are shown in FIGS. 56 through 58 for the ECL output, and an embodiment for TTL output is shown in FIGS. 59 and 60. Shown in FIG. 56 is an ECL output circuit made up solely of bipolar transistors, with the signal waveforms shown in FIG. 57. During the stand-by and precharge modes, the output clamp signal $\phi_{1NH}$ is made higher than the reference voltage $V_{BB}$ so that a current $I_{CS}$ flows from $Q_3$ and the DO output is brought to a low level (approx. 1.7 volts). On expiration of a certain time length after the $\overline{\text{CS}}$ input has gone low, i.e., following the memory output signal appearing at the sense outputs O and $\bar{\text{O}}$, the $\phi_{1NH}$ is made lower than $V_{BB}$. The current $I_{CS}$ flows through $Q_8$, and the DO output becomes high (approx. −0.9 volt) or low (approx. −1.7 volts) depending on the states of sense outputs O and $\bar{\text{O}}$.

FIG. 58 is an output circuit using bipolar and MIS transistors. The circuit is the output circuit described in ISSCC '82, pp. 248–249, "An ECL Compatible 4K CMOS RAM", with the attachment of MIS transistors $Q_{12}$ and $Q_{14}$ for clamping. The $\phi_{1NH}$ goes high during the stand by and data line precharge modes, causing the $Q_{14}$ to become conductive thereby to bring the base voltage of bipolar transistor $Q_{15}$ to $V_{EE}$. The $Q_{15}$ becomes cut-off, and the DO output is brought to a low level (approx. −2 volts) equal to the terminal voltage $V_T$ by the terminating resistor $R_T$ provided outside the chip. With the $\phi_{1NH}$ being low, the sense output O causes the DO output to become high (approx. −0.9 volt) or low (approx. −2 volts). Thus, in this circuit arrangement, the low level of the DO output is introduced from the terminal voltage $V_T$ (approx. −2 volts) through is introduced from the terminal voltage $V_T$ Accordingly, both circuit arrangements of FIGS. 56 and 58 operate to prevent the appearance of an intermediate voltage level on the DO output, but settle it to a low voltage level even if the sense circuit output is indeterminate during the stand-by and data line precharge modes.

FIGS. 59 and 60 show an embodiment of a bipolar-MIS composite output circuit for TTL interfacing and its signal timing relationship. In the stand-by mode ($\overline{\text{CS}}$ input: high), the $\phi_{1NH}$ is made low, and the upper and lower output bipolar-MIS transistors ($Q_{11}$, $Q_{12}$; $Q_{13}$, $Q_{14}$) are all cut off, resulting in a high-impedance DO output regardless of the sense outputs O and $\bar{\text{O}}$. In the operating mode, a certain time length after the $\overline{\text{CS}}$ input has gone low, i.e., after the sense circuit has provided a regular memory cell read-out signal, the $\phi_{1NH}$ is made high so that DO can change depending on the values of the read-out signals O and $\bar{\text{O}}$ from the memory cell. With $Q_{11}$ and $Q_{12}$ being conductive and $Q_{13}$ and $Q_{14}$ being cut-off, the DO output is high (approx. $V_{cc}$−0.7 volts: logical "1"), while with $Q_{11}$ and $Q_{12}$ being cut-off and $Q_{13}$ and $Q_{14}$ being conductive, the DO output is low (approx. 0 volt: logical "0").

Figure 61:
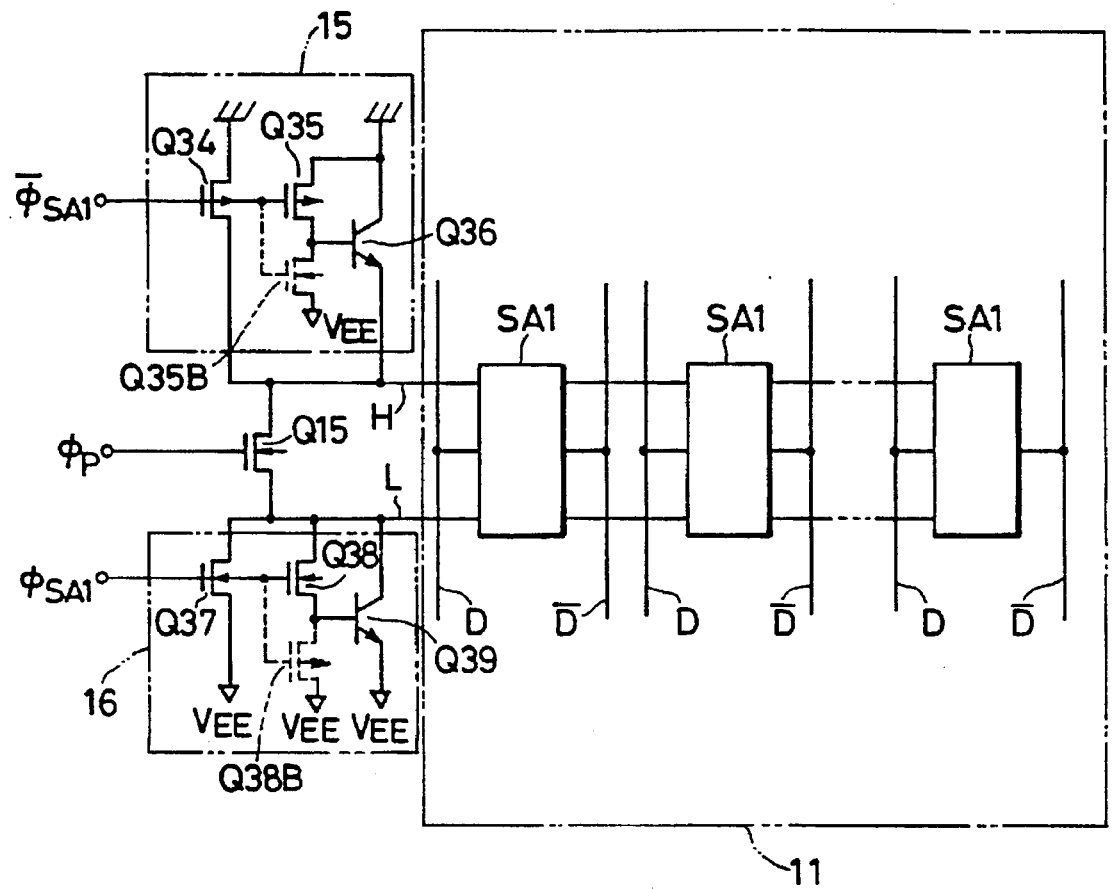

In order to operate the aforementioned sense amplifier and active restoration circuit (SA1 in FIG. 3A), their drive signals $\phi_{SA1}$ and $\overline{\phi_{SA1}}$ are applied to the circuit blocks 15 and 16 in FIG. 3A. In the preceding embodiment, these circuit blocks 15 and 16 are arranged in a bipolar-MIS composite driver as shown in FIG. 61. According to this circuit arrangement, the outputs H and L of 15 and 16 have a voltage level of around ½ $V_{EE}$ by the act of $\phi_P$ on $Q_{15}$ during the stand-by and data line precharge mode, H is 0 volt and L is $V_{EE}$ volts by the act of $\phi_{SA1}$ and $\overline{\phi_{SA1}}$ in the SA1 drive mode, and all data line pairs are 0 volt at high-level side and $V_{EE}$ at low-level side by the operation of SA1. Thus, the composite drivers 15 and 16 made up of bipolar and MIS transistors can drive SA1 and then data line pairs at a high speed, however, high-speed and large amplitude drive of data lines using bipolar transistors increases the power dissipation and peak current due to charging and discharging of the data lines. The number of data line pairs is as many as, for example, 512 (1024 lines) for a 256K-bit memory, resulting in an increased peak current of almost 150 mA by charging and discharging of data lines. To cope with this matter, the following gives a proposal for reducing the signal amplitude on the data lines so as to lower the power dissipation and peak current while maintaining the memory access time and cycle time. For this purpose, it becomes necessary to lower the high-level of H line or raise the low-level of L line in FIG. 61. The simplest method for lowering the high-level of H line is to eliminate the p-channel MIS transistor $Q_{34}$ in the circuit block 15 of FIG. 61, and this causes the H-line high level to fall by $V_{BE}$ to a level of −0.8 volt. The simplest method for raising the low-level of L line is to eliminate the n-channel MIS transistor $Q_{37}$ in the circuit block 16 of FIG. 61, and this causes the L-line low level to rise to $V_{EE}+V_{BE}$ that equals approximately −4.5 volts.

Figure 62:
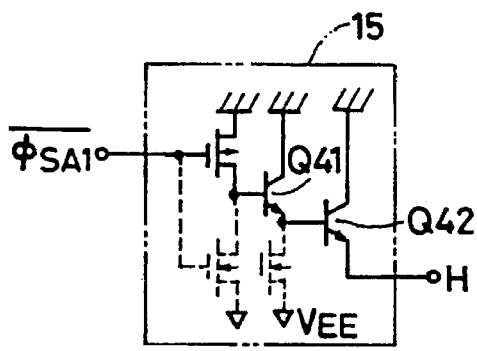
Figure 63:
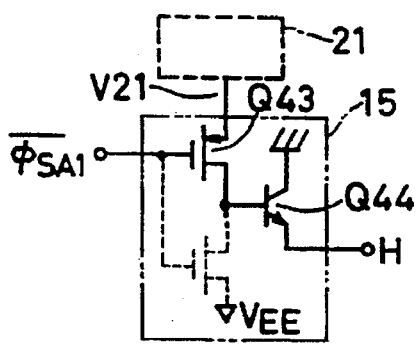
Figure 64:
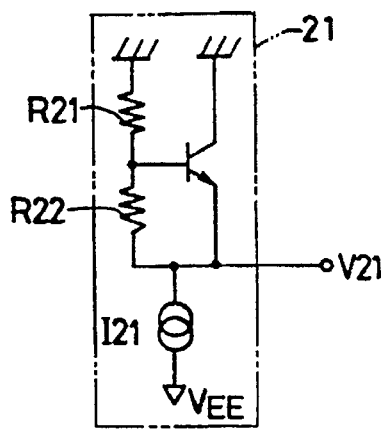
Figure 65:
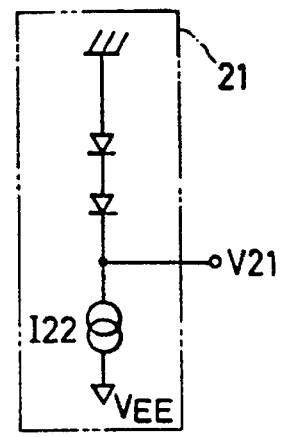

Other methods for shifting the level of H line and L line will be described in the following several embodiments. FIG. 62 shows a modified arrangement of the circuit block 15 in FIG. 61, and its feature is the Darlington configuration of bipolar transistors $Q_{41}$ and $Q_{42}$. The circuit produces a high level of $-2V_{BE}$, i.e., approx. −1.6 volts, on the H output line. Its increased drive power improves the rise time of the H line as compared with the original circuit block 15 in FIG. 61. The data signal has a high level of −1.6 volts and a low level of $V_{EE}$, resulting in a reduction of the signal amplitude to about 70%. The power dissipation and peak current for charging and discharging the data lines decrease proportionally to about 70%. Although it is not shown in the figure, the high level voltage of the H line can obviously be lowered by a multiple of $V_{BE}$ through the level shift using a cascade connection of bipolar transistors for three stages or more, or using diodes. FIG. 62 shows another circuit arrangement, in which an internal power circuit 21 is used to lower the high level voltage of the H line. The power circuit 21 supplies its output to the source of a p-channel MIS transistor $Q_{43}$. By lowering the output of the circuit 21 below 0 volt, the H line can have a lower high-level voltage. In this case, the $Q_{43}$ has its driving capacity reduced, but it is loaded merely by the base of $Q_{44}$, and this is not a significant problem. The load on the H line is driven by the bipolar transistor $Q_{44}$, and the deterioration of the rise time of the H line is little, with the result of a comparable operating speed to the arrangement of FIG. 61. The circuit block 21 in FIG. 63 reduces the output voltage variation caused by changes in the load current. The output impedance needs to be small, and the use of a bipolar transistor is favorable. FIGS. 64 and 65 show embodiments of the circuit block 21 in FIG. 63. The arrangement of FIG. 64 provides an output voltage $V_{21}$ which is given as, $$V_{21} = -\left(\frac{R_{21}}{R_{22}} + 1\right)V_{BE}.$$

By adjusting the value of $R_{21}/R_{22}$, the $V_{21}$ can be set arbitrarily in the range below $-V_{BE}$. The current source $I_{21}$ serves to ease the output voltage variation caused by changes in the load current, but it may be omitted. FIG. 65 is a level shift circuit using diodes. Although two diodes are used in the figure, any number of diodes may be connected. The role of the constant current source $I_{22}$ is to lower the output impedance as in the case of $I_{21}$, but it may be omitted. Obviously, the constant current sources $I_{21}$ and $I_{22}$ may be substituted by resistors inserted between $V_{21}$ and $V_{EE}$ in both circuits.

Figure 66:
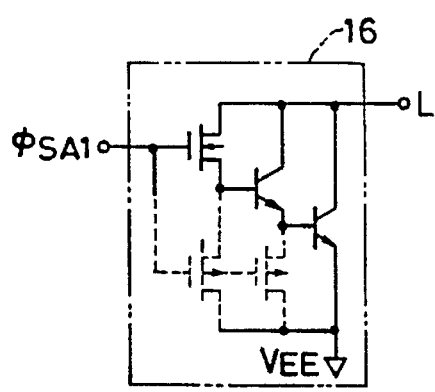
Figure 67:
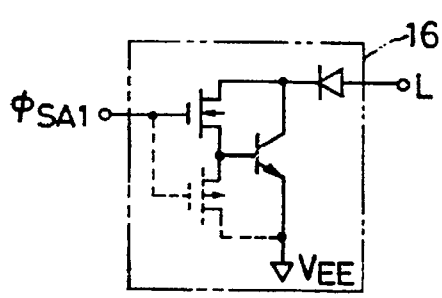
Figure 68:
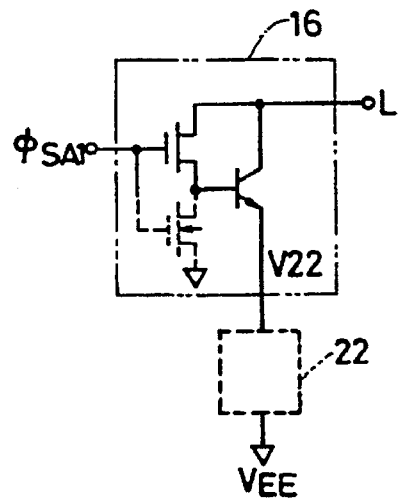
Figure 69:
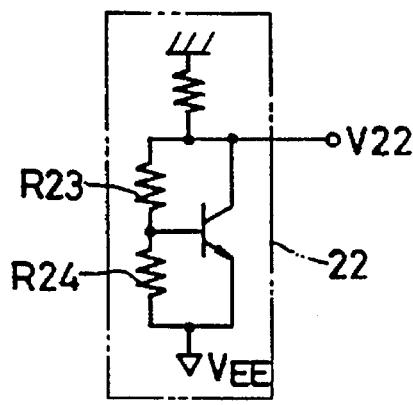
Figure 70:
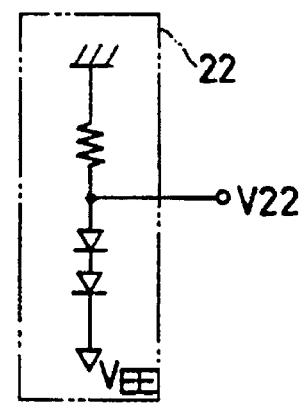

Next, FIGS. 66 and 67 show embodiments of modified circuit arrangement for the circuit block 16 in FIG. 61 for the purpose of raising the voltage level of the L line. FIG. 66 employs a bipolar transistor pair in Darlington connection for driving the L line, and it produces a low level of $V_{EE}+2 V_{BE}$, i.e., approx. −3.8 volts, on the L line. The same effect is achieved in the arrangement of FIG. 67 using a diode connected in series between the bipolar transistor and the L line. An alternative circuit arrangement shown in FIG. 68 has a circuit block 22 for voltage clamping inserted between the emitter of bipolar transistor and $V_{EE}$. Assuming the emitter voltage to be $V_{22}$, the L line has a low-level voltage of $V_{22}+V_{BE}$. The circuit block 22 can be arranged practically as shown in FIGS. 69 and 70. The arrangement of FIG. 69 provides a voltage $V_{22}$ of approximately $$V_{BE} + \left(1 + \frac{R_{23}}{R_{24}}\right)V_{BE},$$

and by adjusting the value of $R_{23}/R_{24}$ the voltage can be set arbitrarily above $V_{EE}+V_{BE}$. Another arrangement shown in FIG. 70 utilizes diode clamping, producing a $V_{22}$ of $V_{EE}+2 V_{BE}$. The factor of $V_{BE}$ can be changed to any integer by changing the number of diodes.

The principle of changing the output voltage through the change in the apply voltage to the bipolar-MIS Composite circuit is applicable not only to data line driving, but also to extensive circuitries. This is based on the outstanding property of bipolar-MIS composite circuits that the load driving capacity does not vary significantly depending on the supply voltage as compared with the circuit arrangement using solely MIS transistors.

Figure 71:
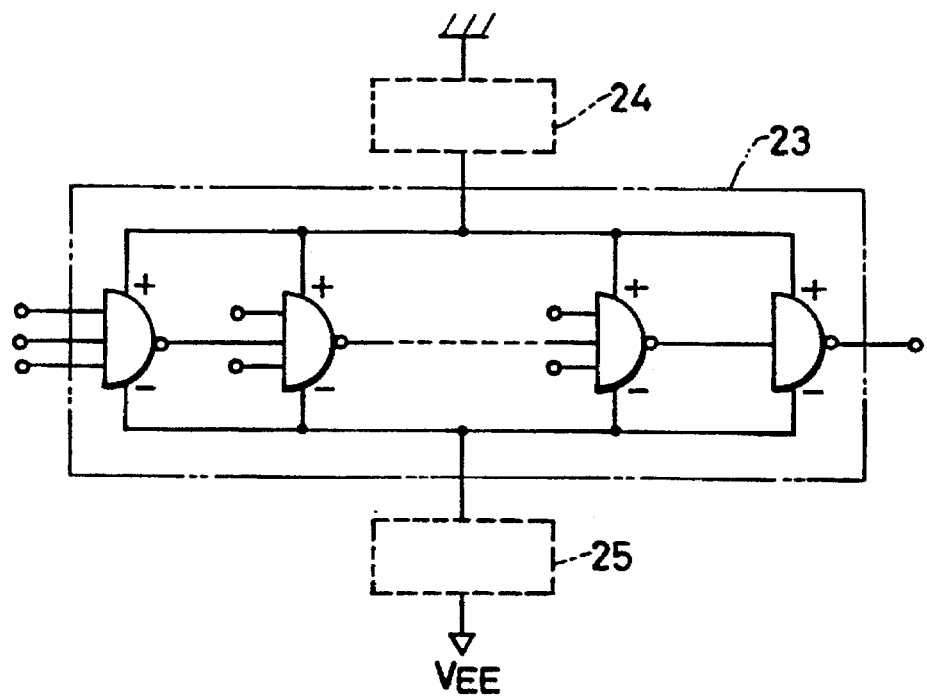

Application of this principle to a general memory peripheral circuit is shown in FIG. 71. Circuit block 23 is configured as a bipolar-MIS composite gate circuit or composite drive circuit, with its operating voltages being supplied from a limiter power circuit 24 for positive and a limiter power circuit 25 for negative. The limiter circuits lowers the effective voltages applied to the circuit block 23, whereby the output signal amplitude can also be reduced. As a result, the power dissipation and peak current of the overall circuit can be reduced. The circuit arrangements as shown in FIGS. 64, 65, 69 and 70 can be used for the limiter circuits of blocks 24 and 25. These limiter circuits using bipolar transistors provide a lower output impedance, which brings an outstanding feature of less output voltage variation caused by changes in the current flowing in the circuit block 23.

It is possible to use a bipolar-MIS composite circuit or bipolar circuit with reduced amplitude as shown in FIG. 71 for a memory buffer or decoder so as to speed up and reduce the power dissipation, while setting a higher memory cell storage voltage by driving word lines with a large amplitude.

The word line signal W and other control signals used in memory have been explained under certain assumptions, as shown in the figures, on the conductivity type of MIS and bipolar transistors to which the signals are applied. The polarity of signals is inverted for the opposite conductivity type of transistors. For example, if MIS transistors of memory cells are changed from n-channel type to p-channel type, the word line is selected by a low-level voltage and unselected by a high-level voltage. Such alterations are easily dealt with by those skilled in the art.

As described above, by application of the inventive memory peripheral circuit including bipolar transistors, data line precharging which is indispensable for the dynamic memory operation and associated functions such as unselecting all word lines can be controlled by a single external input signal.

The present invention thus provides a bipolar-MIS composite dynamic semiconductor memory having both properties of high-density integration derived from the dynamic memory cells and fast operation derived from the memory peripheral circuit including bipolar transistors.

Figure 80:
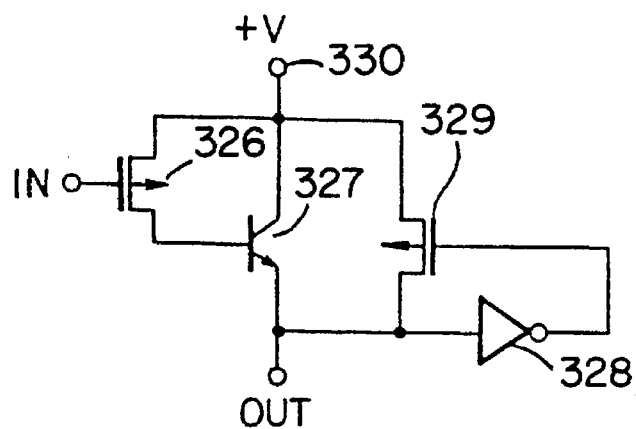
FIGS. 80–83 show third to sixth embodiments of the present invention.

FIG. 80 shows a third embodiment of the present invention. Numeral 326 denotes an enhancement type PMOS transistor having a source thereof connected to a power supply +V through a terminal 330, a gate thereof connected to an input terminal IN and a drain thereof connected to a base of an NPN switching transistor 327. A collector of the NPN transistor 327 is connected to the power supply +V through the terminal 330 and an emitter thereof is connected to an output terminal OUT. Numeral 328 denotes an inverter having an input terminal thereof connected to the output terminal OUT and an output terminal thereof connected to a gate of an enhancement type switching PMOS transistor 329. A source of the PMOS transistor 329 is connected to the power supply +V and a drain thereof is connected to the output terminal OUT.

The operation of this circuit is as follows. When the input terminal IN is at the "L" level, the PMOS transistor 326 is on and the NPN transistor 327 is also on. As a result, a capacitive load (not shown) connected to the output terminal OUT is charged through the NPN transistor 327 and the level of the output terminal OUT rises to $(+V-V_{BE})$. On the other hand, as the level of the output terminal OUT exceeds a logical threshold (VLT) of the inverter 328, the output thereof is switched to the "L" level and the PMOS transistor 329 is turned on. Since the MOS transistor has no offset at the output voltage thereof, an electrical connection substantially free from a voltage drop is established between the drain and the source in the conduction state. Accordingly, the output level raised to $(+V-V_{BE})$ is charged up to +V through the PMOS transistor 329. When the input terminal IN is at the "H" level, the PMOS transistor 326 is off and the NPN transistor 327 is also off. Accordingly, the level at the output terminal OUT does not change.

Figure 81:
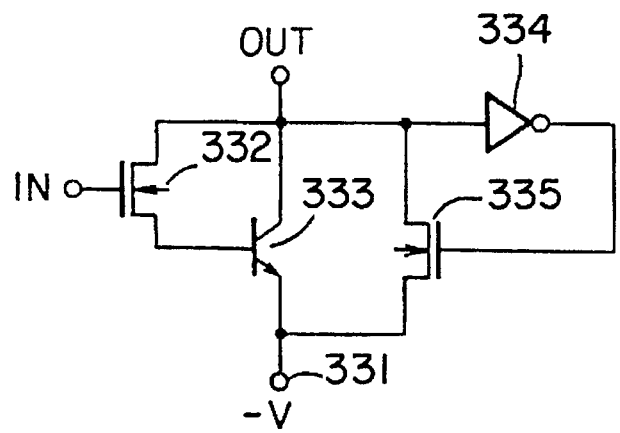

FIG. 81 shows a fourth embodiment of the present invention. Numeral 332 denotes an enhancement type NMOS transistor having a drain thereof connected to an output terminal OUT, a gate thereof connected to an input terminal IN and a source thereof connected to a base of a switching NPN transistor 333. A collector of the NPN transistor 333 is connected to the output terminal OUT and an emitter thereof is connected to a power supply −V through a terminal 331. Numeral 334 denotes an inverter having an input terminal thereof connected to the output terminal OUT and an output terminal thereof connected to a gate of a switching NMOS transistor 335. A drain of the NMOS transistor 335 is connected to the output terminal OUT and a source thereof is connected to the power supply −V.

The operation of this circuit is as follows. When the input terminal IN is at the "H" level, the NMOS transistor 332 is on and the NPN transistor 333 is also on. As a result, a charge stored in a capacitive load is discharged through the NPN transistor 333 and the level of the output terminal OUT drops to $(-V+V_{BE})$. On the other hand, as the level of the output terminal OUT drops below the VLT of the inverter 334, the output level thereof is switched to the "H" level and the NMOS transistor 335 is turned on without essential voltage drop thereacross. As a result, the output level dropped to $(-V+V_{BE})$ is discharged to −V through the NMOS transistor 335. When the input terminal IN is at the "L" level, the NMOS transistor 332 is off and the NPN transistor 333 is also off. Accordingly, the level of the output terminal OUT does not change.

Figure 82:
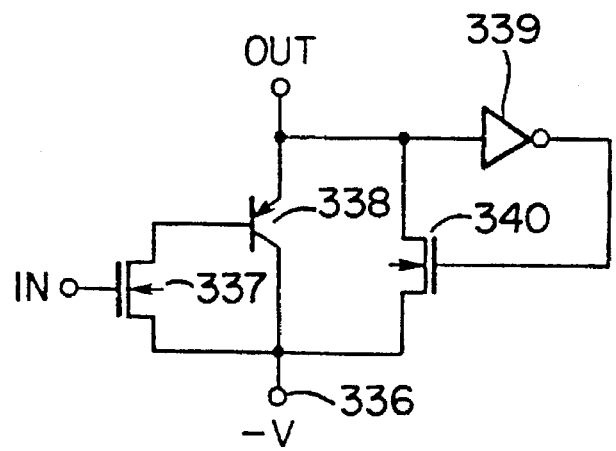

FIG. 82 shows a fifth embodiment of the present invention. Numeral 337 denotes an enhancement type NMOS transistor having a drain thereof connected to a base of a switching PNP transistor 338, a gate thereof connected to an input terminal IN and a source thereof connected to a power supply −V through a terminal 336. An emitter of the PNP transistor 338 is connected to an output terminal OUT and a collector thereof is connected to the power supply −V through the terminal 336. Numeral 339 denotes an inverter having an input terminal thereof connected to the output terminal OUT and an output terminal thereof connected to a gate of a switching NMOS transistor 340. A drain of the NMOS transistor 340 is connected to the output terminal OUT and a source thereof is connected to the power supply −V.

The operation of this circuit is as follows. When the input terminal IN is at the "H" level, the NMOS transistor 337 is on and the PNP transistor 338 is also on. As a result, a charge stored in a capacitive load is discharged through the PNP transistor 338 and the level of the output terminal OUT drops to $(-V+V_{BE})$. On the other hand, as the level of the output terminal OUT drops below the VLT of the inverter 339, the output thereof is switched to the "H" level and the NMOS transistor 340 is turned on so that an electrical connection essentially free from a voltage drop is established between the drain and the source. Accordingly, the output level dropped to $(-V+V_{BE})$ is discharged to −V through the NMOS transistor 340. When the input terminal IN is at the "L" level, the NMOS transistor 337 is off and the PNP transistor 338 is also off. Accordingly, the level of the output terminal OUT does not change.

Figure 83:
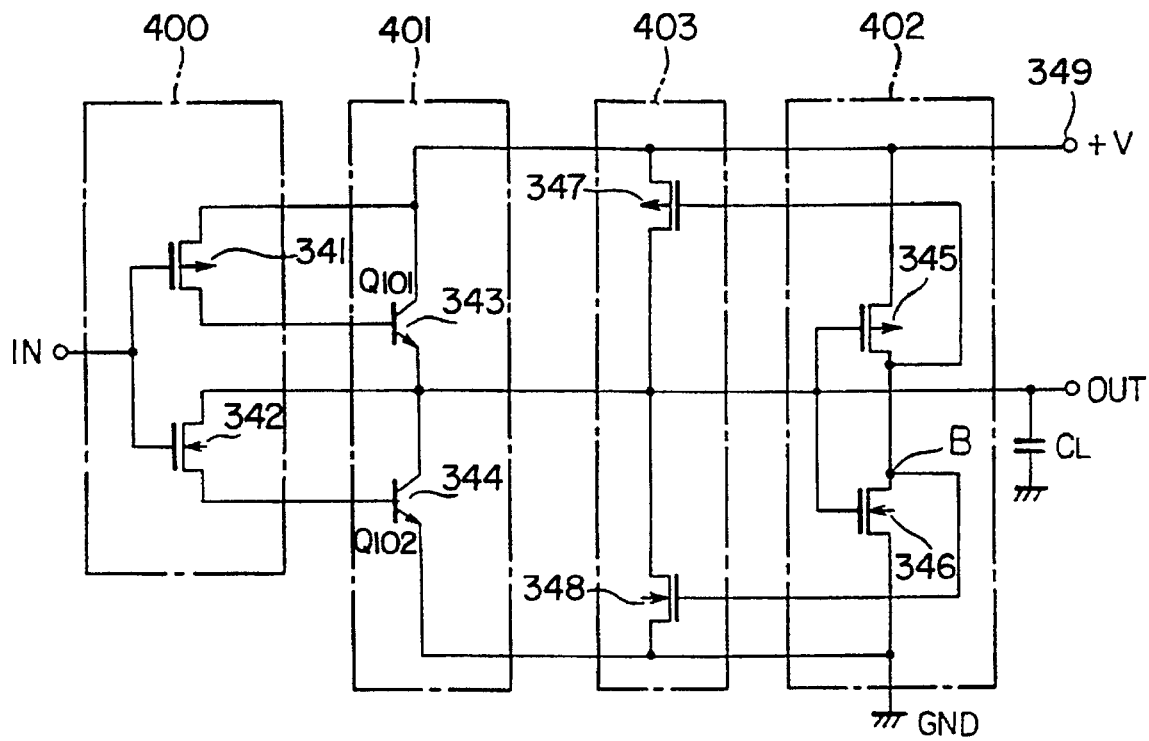

FIG. 83 shows a sixth embodiment of the present invention. Numeral 341 denotes an enhancement type PMOS transistor having a source thereof connected to a power supply +V through a terminal 349, a gate thereof connected to an input terminal IN and a drain thereof connected to a base of an NPN transistor 343, Numeral 342 denotes an enhancement type NMOS transistor having a drain thereof connected to an output terminal OUT, a gate thereof connected to the input terminal IN and a source thereof connected to a base of an NPN transistor 344. The PMOS transistor 341 and the NMOS transistor 342 form a logical control circuit 400. A collector of the NPN transistor 343 is connected to the power supply +V through the terminal 349 and an emitter thereof is connected to the output terminal OUT. A collector of the NPN transistor 344 is connected to the output terminal OUT and an emitter thereof is connected to a common potential point GND. The transistors 343 and 344 form a switching circuit 401. Numeral 345 denotes an enhancement type PMOS transistor having a source thereof connected to the power supply +V, a gate thereof connected to the output terminal OUT and a drain thereof connected to a drain of an enhancement type NMOS transistor 346. A gate of the NMOS transistor 346 is connected to the output terminal OUT and a source thereof is connected to GND. The MOS transistors 345 and 346 form an inverter 402. Numeral 347 denotes an enhancement type PMOS transistor having a source thereof connected to the power supply +V, a gate thereof connected to the common drain B of the PMOS transistor 345 and the NMOS transistor 346 and a drain thereof connected to the output terminal OUT. Numeral 348 denotes an enhancement type NMOS transistor having a drain thereof connected to the output terminal OUT, a gate thereof connected to the common drain B of the PMOS transistor 345 and the NMOS transistor 346 and a source thereof connected to GND. The MOS transistors 347 and 348 form a switching circuit 403.

The operation of this circuit is as follows. When the input terminal IN is at the "L" level, the NMOS transistor 342 is off and the NPN transistor 344 is also off. On the other hand, the PMOS transistor 341 is on and supplies a base current to the NPN transistor 343 to turn it on. As a result, a charging current flows into a capacitive load $C_L$ through the NPN transistor 343 so that the level of the output terminal OUT rises. The charging current through the NPN transistor 343 flows until the level of the output terminal OUT reaches $(+V-V_{BEQ1})$, when the NPN transistor 343 is cut off. On the other hand, as the output level sufficiently rises, the PMOS transistor 345 is turned off and the NMOS transistor 346 is turned on. As a result, the level at the node B is switched to the "L" level. Thus, the PMOS transistor 347 is turned on and an electrical connection essentially free from a voltage drop is established between the source and the drain, and the NMOS transistor 348 is turned off. Accordingly, a charging current flows into the load $C_L$ through the PMOS transistor 347 so that the output terminal OUT is charged up to the same level as the power supply +V.

When the input terminal IN is at the "H" level, the PMOS transistor 341 is off and the NPN transistor 343 is also off. On the other hand, the NMOS transistor 342 is on and a base current is supplied to the NPN transistor 344 through the NMOS transistor 342 so that the NPN transistor 344 is turned on. As a result, a charge stored in a capacitive load $C_L$ is discharged through the NPN transistor 344 and the level of the output terminal OUT drops. The discharging current through the NPN transistor 344 flows until the output level reaches $V_{BEQ2}$, when the NPN transistor 344 is cut off. On the other hand, as the level of the output terminal OUT sufficiently drops, the PMOS transistor 345 is turned on, the NMOS transistor 346 is turned off and the node B assumes the "H" level. As a result, the PMOS transistor 347 is turned off and the NMOS transistor 348 is turned on and an electrical connection essentially free from a voltage drop is established between the drain and the source. Accordingly, the charge stored in the load $C_L$ is discharged through the NMOS transistor 348 and the level of the output terminal OUT drops to the ground potential or the common potential.

Figure 75:
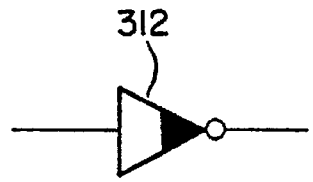
FIG. 75 shows a symbol for the circuits of FIGS. 72–74.
Figure 87:
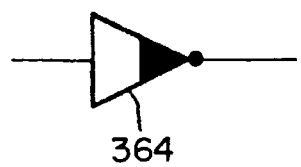
FIG. 87 shows a symbol for the circuits of FIGS. 83, 85 and 86.

Numeral 364 in FIG. 87 denotes a logical symbol for the circuit of the present embodiment which is distinguished from the logical symbol for the prior art circuit (FIG. 75).

In order to increase a switching speed when the NPN transistors 343 and 344 are turned off, pathes for discharging the base charges are necessary in the respective base circuits. The discharging path may be a passive device, an active device or a combination thereof, although it is omitted in the drawing because it does not relates to the substance of the present invention.

Figure 72:
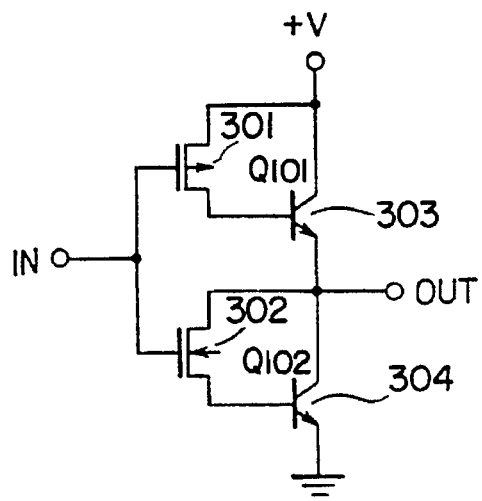
FIGS. 72–74 show prior art composite circuits.
Figure 73:
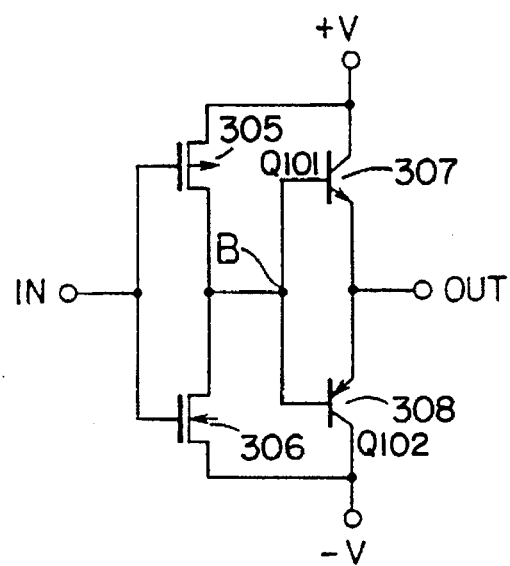
Figure 74:
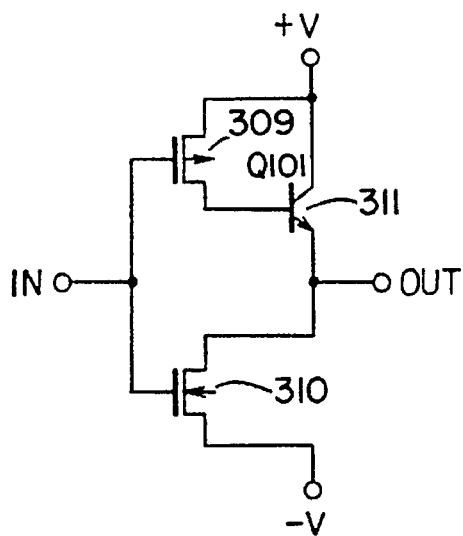
Figure 84:
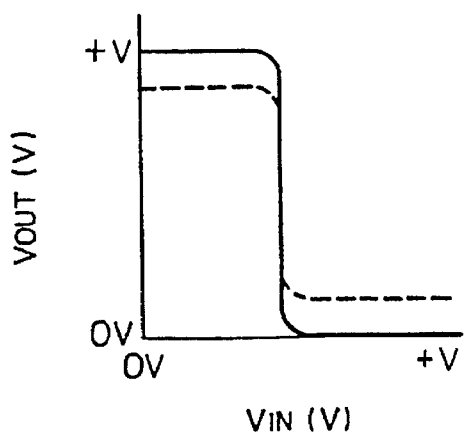
FIG. 84 shows an input-output characteristic of the circuit of FIG. 83.

FIG. 84 shows input/output characteristics of the prior art composite circuit of FIG. 72 and the composite circuit of the present invention shown in FIG. 83. A broken line shows the input/output characteristic of the prior art and a solid line shows the input/output characteristic of the circuit of the present invention. It is seen from FIG- 84 that in the composite circuit of the present invention, the high level of the output is switched to the power supply potential and the low level is switched to the GND potential.

Figure 85:
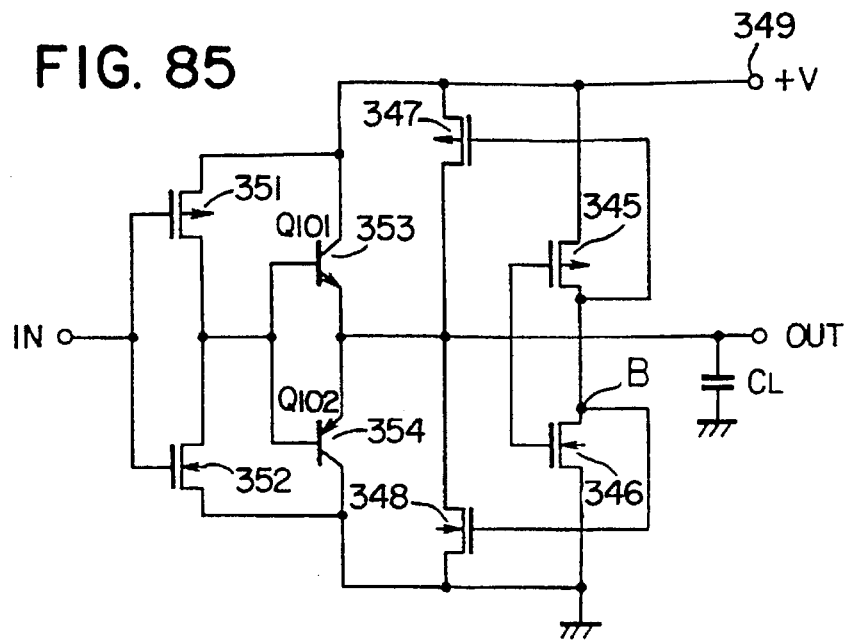
FIGS. 85–86 show seventh and eighth embodiments of the present invention.

FIG. 85 shows a seventh embodiment of the present invention. The like elements to those of FIG. 83 are designated by the like numerals. Numeral 351 denotes an enhancement type PMOS transistor having a source thereof connected to a power supply +V through a terminal 349, a gate thereof connected to an input terminal IN and a drain thereof connected to a drain of an enhancement type NMOS transistor 352, a base of an NPN transistor 353 and a base of a PNP transistor 354. A gate of the NMOS transistor 352 is connected to the input terminal IN and a source thereof is connected to a common potential point GND. The PMOS transistor 351 and the NMOS transistor 352 form a logical control circuit. A collector of the NPN transistor 353 is connected to the power supply +V and an emitter thereof is connected to an output terminal OUT. An emitter of the PNP transistor 354 is connected to the output terminal OUT and a collector thereof is connected to GND. The transistors 353 and 354 form a switching circuit.

This circuit forms an inverter as a whole and operates as follows. When the input terminal IN is at the "L" level, the output of the inverter comprising the PMOS transistor 351 and the NMOS transistor 352 assumes the "H" level, the PNP transistor 354 is turned off and the NPN transistor 353 is turned on. As a result, a capacitive load $C_L$ is charged through the NPN transistor 353 and the level of the output terminal OUT rises. When the level of the output terminal OUT rises to $(+V-V_{BEQ1})$, the NPN transistor 353 is cut off. On the other hand, as the output level sufficiently rises, the PMOS transistor 345 is turned off, the NMOS transistor 346 is turned on and the node B assumes the "L" level. As a result, the PMOS transistor 347 is turned on and an electrical connection essentially free from a voltage drop is established between the drain and the source. On the other hand, the NMOS transistor 348 is turned on. Accordingly, the capacitive load $C_L$ is charged by the PMOS transistor 347 and the output terminal OUT rises to the power supply potential +V.

When the input terminal IN is at the "H" level, the output of the inverter comprising the PMOS transistor 351 and the NMOS transistor 352 assumes the "L" level, the NPN transistor 353 is turned off and the PNP transistor 354 is turned on. As a result, the charge stored in the load $C_L$ is discharged through the PNP transistor 354 and the level of the output terminal OUT drops. The discharge through the PNP transistor 354 continues until the output level reaches $V_{BEQ2}$, when the PNP transistor 354 is cut off. On the other hand, as the output level sufficiently drops, the PMOS transistor 345 is turned on and the NMOS transistor 346 is turned off. As a result, the PMOS transistor 347 is turned off and the NMOS transistor 348 is turned on, and an electrical connection essentially free from a voltage drop is established between the drain and the source. Accordingly, the charge remaining in the load $C_L$ is discharged through the NMOS transistor 348 and the output level drops to GND. A logical symbol of the circuit of the present embodiment is shown in FIG. 87.

Figure 86:
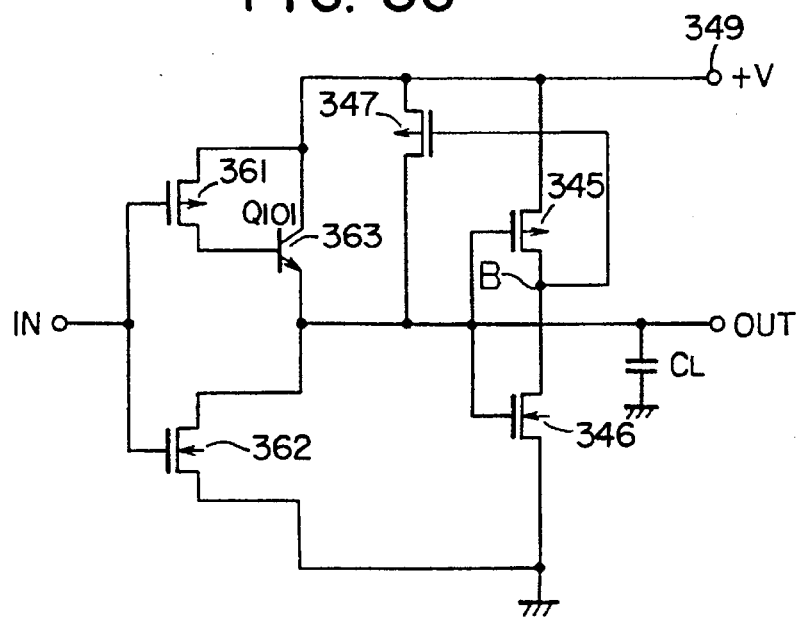

FIG. 86 shows an eighth embodiment of the present invention. The like elements to those shown in FIG. 83 are designated by the like numerals. Numeral 361 denotes an enhancement type PMOS transistor having a source thereof connected to a power supply +V through a terminal 349, a gate thereof connected to an input terminal IN and a drain thereof connected to a base of an NPN transistor 363. Numeral 362 denotes an enhancement type NMOS transistor having a drain thereof connected to an output terminal OUT, a gate thereof connected to the input terminal IN and a source thereof connected to a common potential point GND. The PMOS transistor 361 and the NMOS transistor 362 form a logical control circuit. The bipolar transistor 363 forms a switch. The PMOS transistor 347 forms another switch. The NMOS transistor 362 is common to the logical control circuit and the other switch.

This circuit forms an inverter as a whole and operates as follows. When the input terminal IN is at the "L" level, the NMOS transistor 362 is off, the PMOS transistor 361 is on and the NPN transistor 363 is on. As a result, a capacitive load $C_L$ is charged through the NPN transistor 363 and the level of the output terminal OUT rises. As the output level rises to $(+V-V_{BEQ1})$, the NPN transistor 363 is cut off. On the other hand, as the output level sufficiently rises, the PMOS transistor 345 is turned off and the NMOS transistor 346 is turned on so that the node B assumes the "L" level. As a result, the PMOS transistor 347 is turned on and an electrical connection essentially free from a voltage drop is established between the drain and the source. Accordingly, the load $C_L$ is charged through the PMOS transistor 347 and the level of the output terminal OUT rises to the power supply potential +V.

When the input terminal IN is at the "H" level, the PMOS transistor 361 is off, the NPN transistor is off and the NMOS transistor 362 is on, and an electrical connection essentially free from a voltage drop is established between the drain and the source. Accordingly, the charge stored in the load $C_L$ is discharged through the NMOS transistor 362 and the output level drops to GND. Since the PMOS transistor 345 is now on and the NMOS transistor 346 is now off, the node B is at the "H" level. Accordingly, the PMOS transistor 347 is now off.

The logical symbol of the present embodiment is shown in FIG. 87. While one-input circuit has been shown in the above embodiment, a multi-input NAND, NOR or a combination thereof may be used.

FIG. 88 shows a ninth embodiment of the present invention. The like elements to those shown in FIG. 83 are designated by the like numerals. Numerals 421 and 422 denote PMOS transistors having sources thereof connected to a power supply +V through a terminal 349, gates thereof connected to input terminals $IN_1$ and $IN_2$, respectively, and drains thereof connected to a base of an NPN transistor 343. Numerals 423 and 424 denote series-connected NMOS transistors. A drain of the NMOS transistor 423 is connected to an output node OUT and a gate thereof is connected to the input terminal $IN_1$. A gate of the NMOS transistor 424 is connected to the input terminal $IN_2$ and a source thereof is connected to a base of an NPN transistor 344. The PMOS transistors 421 and 422 and the NMOS transistors 423 and 424 form a logical control circuit. A collector of the NPN transistor 343 is connected to the power supply +V and an emitter thereof is connected to an output terminal OUT. A collector of the NPN transistor 344 is connected to the output terminal OUT and an emitter thereof is connected to GND.

This circuit forms a two-input NAND circuit as a whole and operates as follows. When at least one of the input terminals $IN_1$ and $IN_2$ is at the "L" level, at least one of the NMOS transistors 423 and 424 is off, and the NPN transistor 344 is also off.

On the other hand, at least one of the PMOS transistors 421 and 422 is turned on and the NPN transistor 343 is also turned on. As a result, a capacitive load $C_L$ is charged through the NPN transistor 343 and the output terminal OUT assumes the "H" level.

When both of the input terminals $IN_1$ and $IN_2$ are at the "H" level, the PMOS transistors 421 and 422 are off and the NPN transistor 343 is also off.

On the other hand, both of the NMOS transistors 423 and 424 are on and the NPN transistor 344 is also on. As a result, the charge stored in the load $C_L$ is discharged through the NPN transistor 344 and the output terminal OUT assumes the "L" level.

The output terminal OUT assumes the power supply potential +V or the GND level by the function of the PMOS transistors 345 and 347 and the NMOS transistors 346 and 348, in the same manner as described in connection with FIG. 83.

FIG. 89 shows a logical symbol for the circuit of FIG. 88.

FIG. 90 shows a tenth embodiment of the present invention. The like elements to those shown in FIG. 83 are designated by the like numerals. Numerals 131 and 132 denote series-connected PMOS transistors. A source of the PMOS transistor 131 is connected to a power supply +V through a terminal 349, and a gate thereof is connected to an input terminal $IN_1$. A gate of the PMOS transistor 132 is connected to an input terminal $IN_2$ and a drain thereof is connected to a base of an NPN transistor 343. Numerals 133 and 134 denote NMOS transistors having drains thereof connected to an output terminal OUT and sources thereof connected to a base of an NPN transistor 344. A gate of the NMOS transistor 133 is connected to the input terminal $IN_1$, and a gate of the NMOS transistor 134 is connected to the input terminal $IN_2$. The PMOS transistors 131 and 132 and the NMOS transistors 133 and 134 form a logical control circuit. A collector of the NPN transistor 343 is connected to the power supply +V and an emitter thereof is connected to the output terminal OUT. A collector of the NPN transistor 344 is connected to the output terminal OUT and an emitter thereof is connected to GND.

This circuit forms a two-input NOR circuit as a whole and operates as follows.

When both of the inputs $IN_1$ and $IN_2$ are at the "L" level, the NMOS transistors 133 and 134 are off and the NPN transistor 344 is also off. On the other hand, the PMOS transistors 131 and 132 are on and the NPN transistor 343 is on. As a result, the capacitive load $C_L$ is charged through the NPN transistor 343 and the output terminal OUT assumes the "H" level. When at least one of the input terminals $IN_1$ and $IN_2$ is at the "H" level, at least one of the PMOS transistors 131 and 132 is off and the NPN transistor 343 is off. On the other hand, at least one of the NMOS transistors 133 and 134 is on and the NPN transistor 344 is on. As a result, a charge stored in the capacitive load $C_L$ is discharged through the NPN transistor 344 and the output level OUT assumes the "L" level. The output terminal OUT assumes the power supply potential +V or the GND level by the function of the PMOS transistors 345 and 347 and the NMOS transistors 346 and 348 in the same manner as described in conjucntion with FIG. 12.

FIG. 91 shows a logical symbol for the present embodiment.

Figure 76:
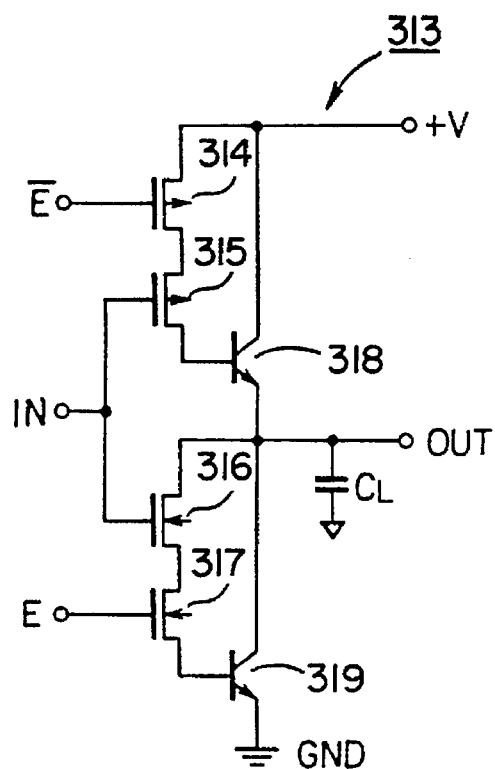
FIG. 76 shows another composite circuit.
Figure 77:
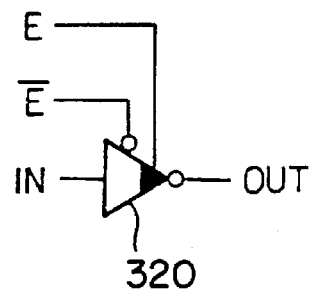
FIG. 77 shows a symbol for the circuit of FIG. 76.
Figure 92:
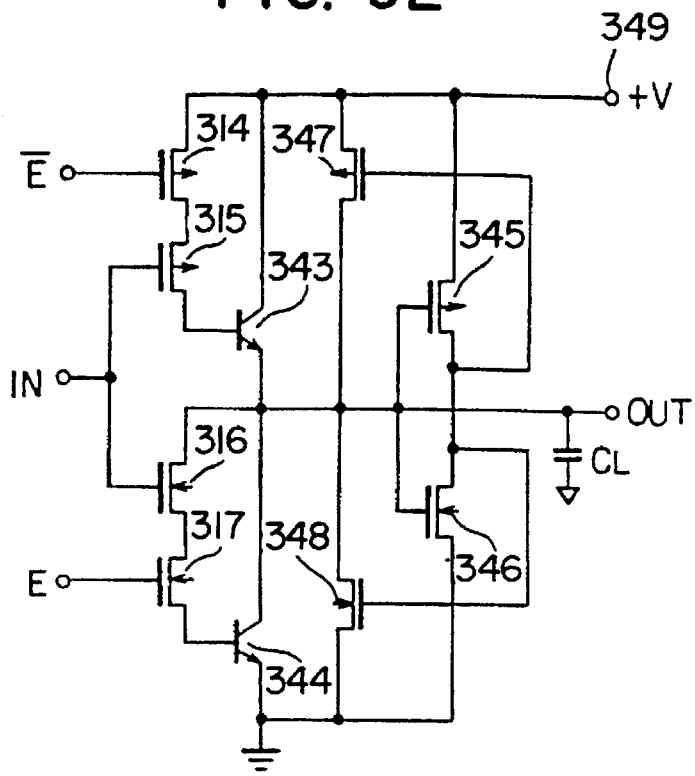
FIG. 92 shows an eleventh embodiment of the present invention.

FIG. 92 shows an eleventh embodiment of the present invention. The like elements to those shown in FIGS. 83 and 76 are designated by the like numerals. The bipolar NPN transistors 343 and 344, the PMOS transistors 345 and 347 and the NMOS transistors 346 and 348 are same as those of FIG. 83, and other portion of the circuit is same as FIG. 76. The PMOS transistors 314 and 315, and the NMOS transistors 316 and 317 form a logical control circuit.

A logical function of this circuit is a tri-state logic circuit like FIG. 76 but differs from the circuit of FIG. 85 in that the output terminal OUT does not include a level shift because of the function of the PMOS transistors 345 and 347 and the NMOS transistors 346 and 348.

Figure 93:
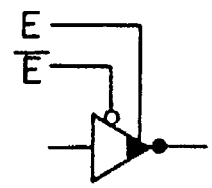
FIG. 93 shows a symbol for the circuit of FIG. 92.

FIG. 93 shows a logical symbol for the circuit of FIG. 92.

As seen from the embodiments shown in FIGS. 83, 85, 88, 90 and 92, a characteristic of the MOS-drive bipolar-output level-shiftless logic circuit of the present invention resides in that a configuration of the portion of the circuit for compensating for the level shift of the output, which comprises the PMOS transistors 345 and 347 and the NMOS transistors 346 and 348 does not change even if the logic of the MOS logical control circuit which controls the bipolar transistors changes. In accordance with the present invention, the output signal can be essentially perfectly switched from the power supply potential to the ground or common potential. The switching is effected at a high speed.

Figure 94:
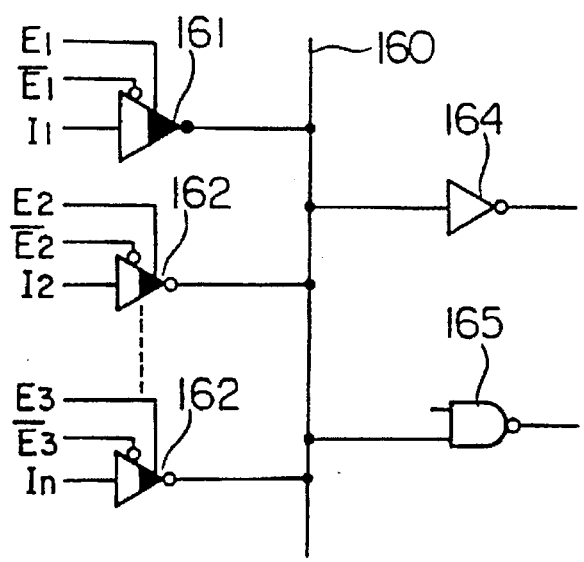
FIGS. 94–104 show additional embodiments of the present invention.

FIG. 94 shows a twelfth embodiment of the present invention. Numeral 160 denotes a signal bus and numerals 164 and 165 denote logical gates which receive signals from the signal bus 160. Numeral 161 denotes the level-shiftless tri-state logic circuit shown in FIG. 92. It outputs an input $I_1$ to the signal bus 160 by control signals $E_1$ and $\overline{E}_1$. Numerals 162 and 163 denote tri-state logic circuits having level shifts at outputs, such as that shown in FIG. 76.

In the present embodiment, the level-shiftless tri-state logic circuit and the plurality of tri-state circuits with level shifts drive the signal bus 160 so that the level-shiftless signal is produced on the signal bus.

When the tri-state logic circuit with the level shift 162 or 163 drives the signal bus 160, the level shift compensation circuit (PMOS transistors 345 and 347, and NMOS transistors 346 and 348 in FIG. 86) of the level shiftless tri-state logic circuit 161 functions so that the level-shiftless signal is produced on the signal bus 160.

In accordance with the present embodiment, since the tri-state logic circuits 162 and 163 can be constructed with less number of elements than that of the tri-state logic circuit 161, the level-shiftless bus signal is obtained with a smaller element area. The level-shiftless bus signal is important in order to avoid the attenuation of the gate drive signal of the logic circuit which receives the bus signal, and to prevent the increase of power consumption.

Figure 95:
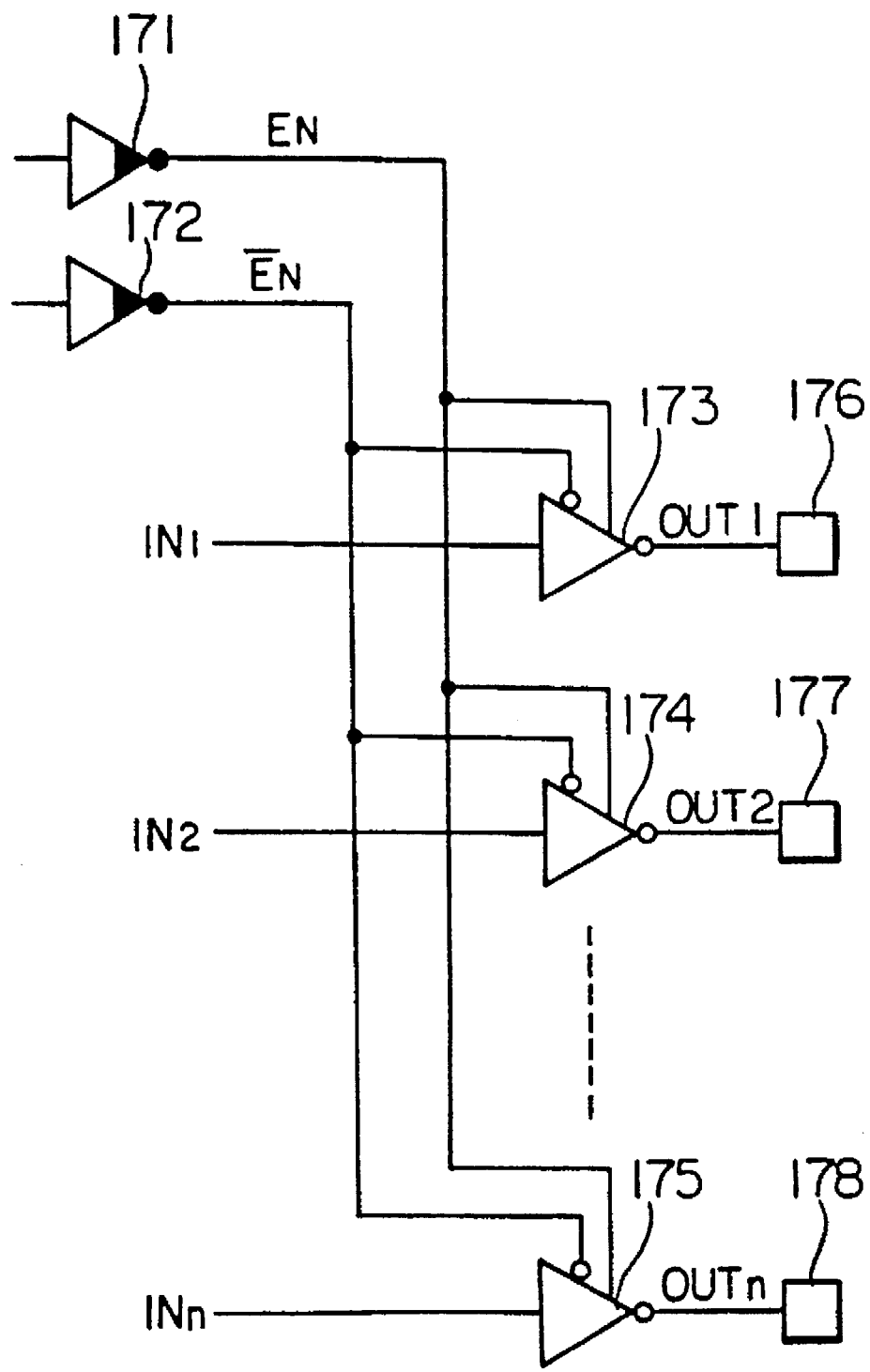

FIG. 95 shows a thirteenth embodiment of the present invention. Numerals 171 and 172 denote level-shiftless MOS-drive bipolar-output logic circuits, numerals 173, 174 and 175 denote tri-state output buffer circuits, and numerals 176, 177 and 178 denote pads through which outputs are derived from the integrated ted circuit chip to external terminals. The tri-state output buffers 173, 174 and 175 output input signals $IN_1$, $IN_2$ and $IN_n$ depending on output signals from the logic circuits 171 and 172. One of performance indices of the signals to $OUT_1$, $OUT_2$, ... $OUT_n$. It is important to tri-state output buffer is a delay time from the input of the drive signals EN and $\overline{EN}$ to the transmission of reduce the delay times in the drive circuits 171 and 172. A typical application of the tri-state output buffer is a data bus output of a microprocessor which parallelly outputs 8 bits, 16 bits, or 32 bits. Accordintly, the drive circuits 171 and 172 have to drive a number of tri-state buffers parallelly. Because of input capacitances and long wirings of the tri-state buffers, a large load has to be driven. Accordingly, the bipolar-output logic circuits 171 and 172 are very effective in driving such a large load at a high speed.

Another performance index of the tri-state output buffer is that a leakage current from the power supply to the output terminal or from the output terminal to GND is small when the output is in a high impedance state. In order to reduce the leakage current, the path from the power supply of the tri-state output buffer circuit to the output terminal and the path from the output terminal to GND must be completely cut off. To this end, it is essential that the drive circuits 171 and 172 are the level-shiftless logic circuits.

Figure 96:
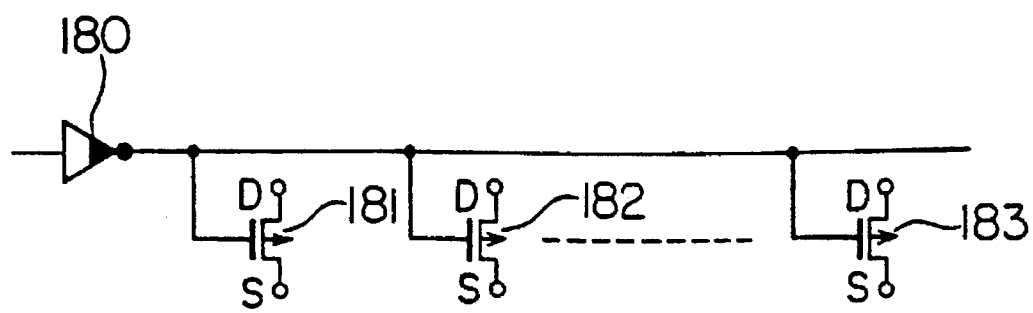

FIG. 96 shows a fourteenth embodiment of the present invention. Numeral 180 denotes a MOS-drive bipolar-output level-shiftless logic circuit. An output terminal thereof is connected to gates of NMOS transistors 181, 182 and 183 to turn on and off them. Drains and sources of the NMOS transistors 181, 182 and 183 are connected to predetermined nodes to construct various circuits. In the present embodiment, the drive circuit 180 is preferably the MOS-drive bipolar-output logic circuit in order to drive a number of gates at a high speed, and it is important that at least the low level output is shiftless in order to completely cut off the NMOS transistors 181, 182 and 183.

Figure 97:
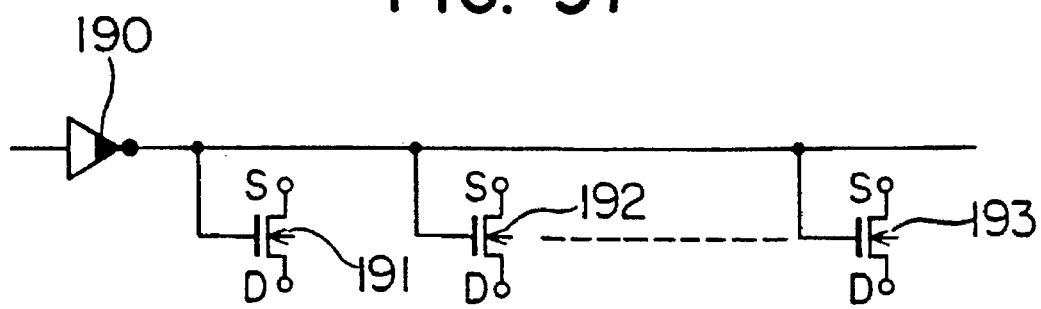

FIG. 97 shows a fifteenth embodiment of the present invention. Numeral 190 denotes a MOS-drive bipolar-output level-shiftless logic circuit. An output terminal thereof is connected to gates of the PMOS transistors 191, 192 and 193 to turn on and off them. Sources and drains of the PMOS transistors 191, 192 and 193 are connected to predetermined nodes to construct various circuits. In the present embodiment, the drive circuit 190 is preferably the MOS-drive bipolar-output logic circuit in order to drive a number of gates at a high speed, and it is important that at least the high level output is level-shiftless in order to completely cut off the PMOS transistors 191, 192 and 193.

Figure 98:
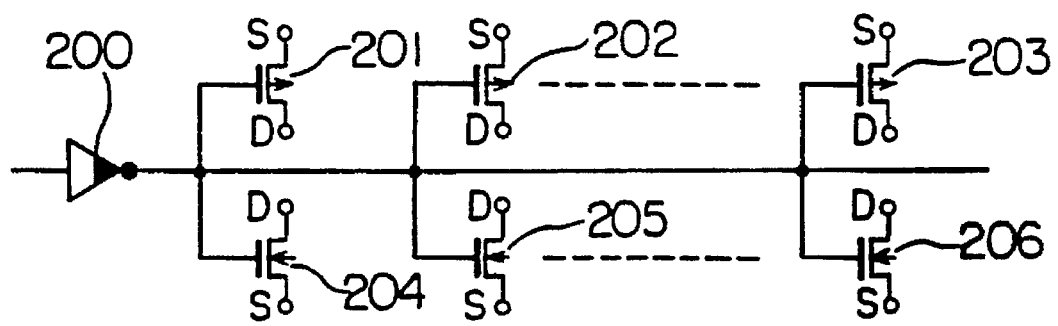

FIG. 98 shows a sixteenth embodiment of the present invention. Numeral 200 denotes a MOS-drive bipolar-output level-shiftless logic circuit. An output terminal thereof is connected to gates of PMOS transistors 201, 202 and 203 and the NMOS transistors 204, 205 and 206 to turn on and off them. Sources and drains of the PMOS transistors 201, 202 and 203 and the NMOS transistors 204, 205 and 206 are connected to predetermined nodes to construct various circuits. In the present embodiment, the drive circuit 200 is preferably the MOS-drive bipolar-output logic circuit in order to drive a number of gates at a high speed. It is important that the high level output is level-shiftless in order to completely cut off the PMOS transistors 201, 202 and 203, and the low level output is level-shiftless in order to completely cut off the NMOS transistors 204, 205 and 206.

Figure 99:
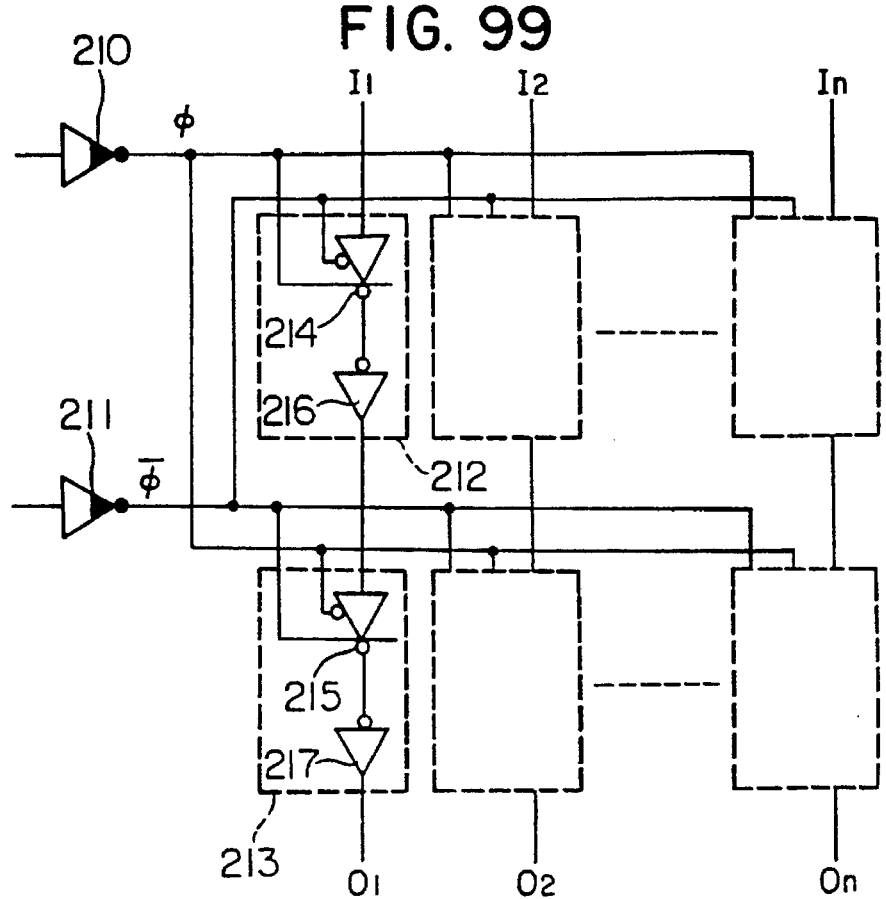

FIG. 99 shows a seventeenth embodiment of the present invention. Numerals 210 and 211 denote MOS-drive bipolar-output level-shiftless logic circuits. Outputs thereof drive a plurality of 1-bit dynamic latch circuits represented by 212 and 213. The dynamic latch 212 comprises a clocked inverter 214 and an inverter 216. The latches are arranged in n bits and two stages to construct an n-bit two-stage dynamic shift register.

Figure 78:
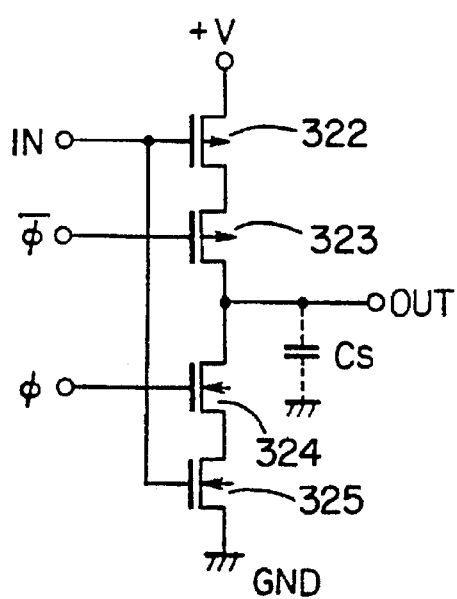
FIG. 78 shows a clocked inverter circuit.
Figure 79:
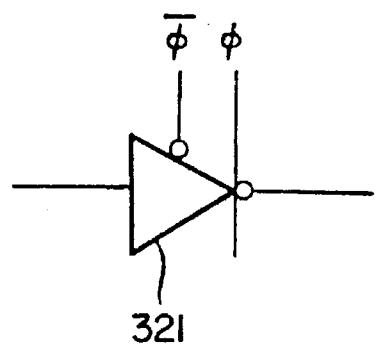
FIG. 79 shows a symbol for the circuit of FIG. 78.

In the present embodiment, the drive circuits 210 and 211 are preferably the MOS-drive bipolar-output logic circuits in order to drive a number of dynamic latches at a high speed. It is important that the high level output and the low level output are level-shiftless as was explained in connection with the dynamic latch circuit of FIG. 78.

Figure 100:
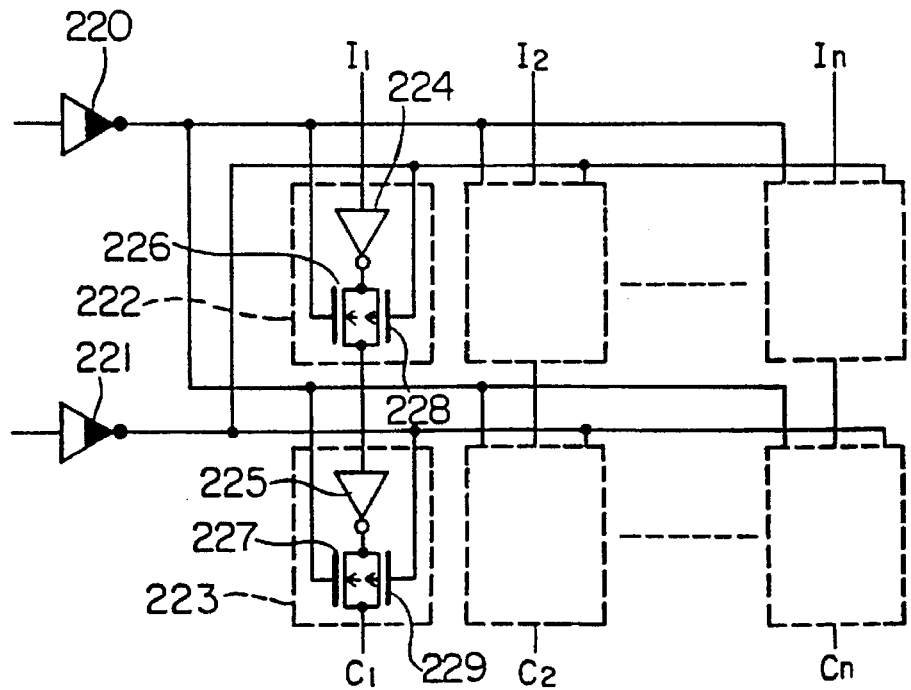

FIG. 100 shows an eighteenth embodiment of the present invention. Like the embodiment of FIG. the present embodiment forms an n-bit two-stage dynamic shift register. In FIG. 93, the clocked inverters 214 and 215 of FIG. 92 are replaced by a complementary switch comprising an NMOS transistor 226 and a PMOS transistor 228, and a complementary switch comprising an NMOS transistor 227 and a PMOS transistor 229.

In the present embodiment, the drive circuits 220 and 221 are preferably the MOS-drive bipolar-output logic circuits in order to drive a number of dynamic latches at a high speed. It is important that the high level output and the low level output are level-shiftless.

Figure 101:
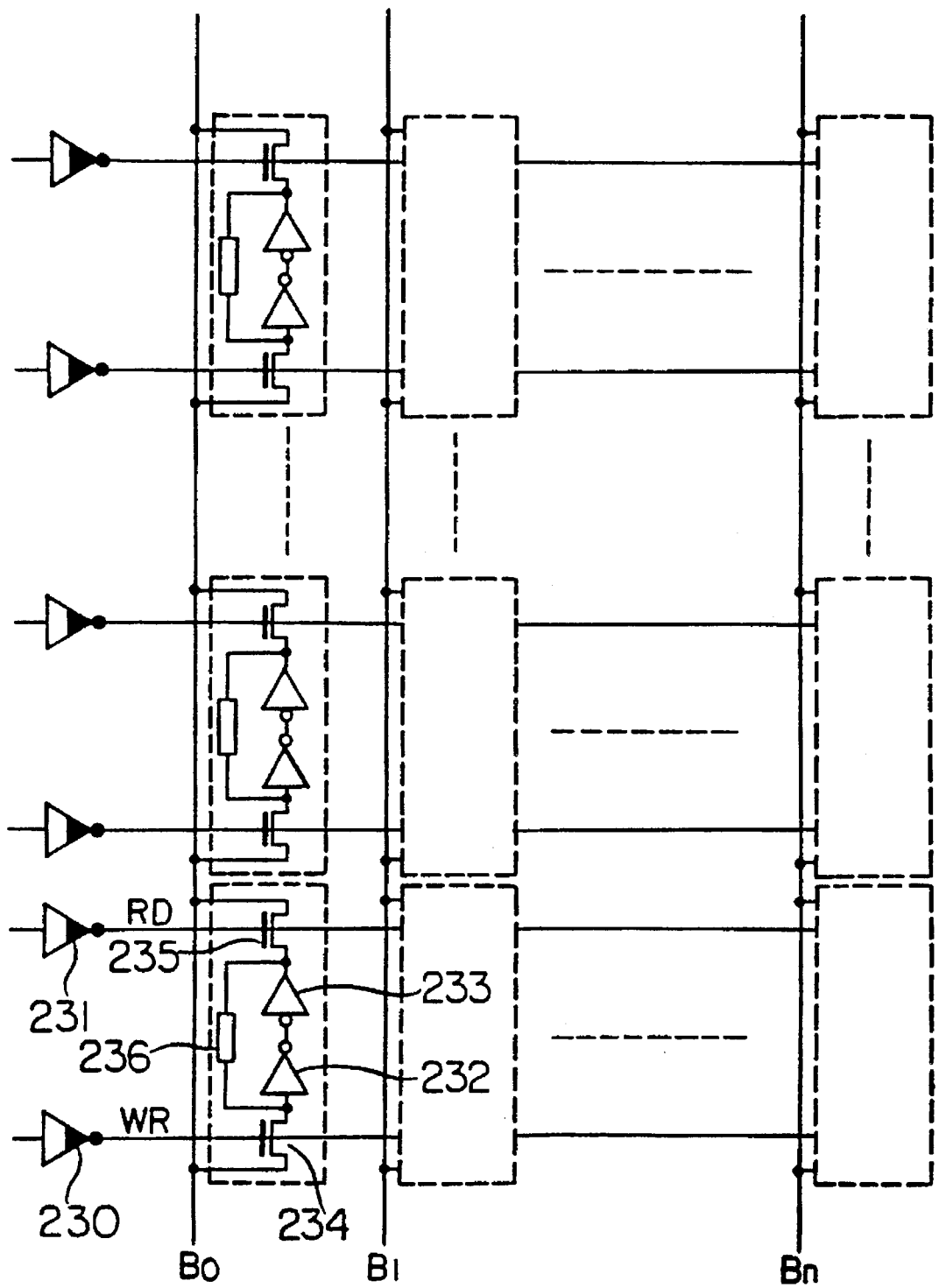

FIG. 101 shows a configuration of a resistor file in accordance with a nineteenth embodiment of the present invention. Numerals 230 and 231 denote MOS-drive bipolar-output level shiftless logic circuits, numerals 232 and 233 denote inverters, and numeral 236 denotes feedback means comprising an impedance element. The inverters 232 and 233 and the feedback means 236 form a one-bit memory. Numeral 234 denotes a write control enhancement type NMOS transistor. It writes a data on a data line $B_0$ into the memory when a write signal WR is "H" level, and is turned off when the write signal WR is "L" level. Numeral 235 denotes a read control enhancement type NMOS transistor. It reads the content of the memory to the data line $B_0$ when a read signal RD is "H" level, and is turned off when the read signal RD is "L" level.

In the present embodiment, the drive circuits 230 and 231 are preferably the MOS-drive bipolar-output logic circuits in order to drive a number of gates represented by 234 and 235 at a high speed. It is important that at least the low level output is level-shiftless. If the level shift is included, a number of write control and read control NMOS transistors represented of the data lines $B_0$, $B_1$, $B_n$ are changed by 234 and 235 which should be in the off state remains in the slightly on state. As a result, the and a data line sense circuit (not shown) may malfunction.

Figure 102:
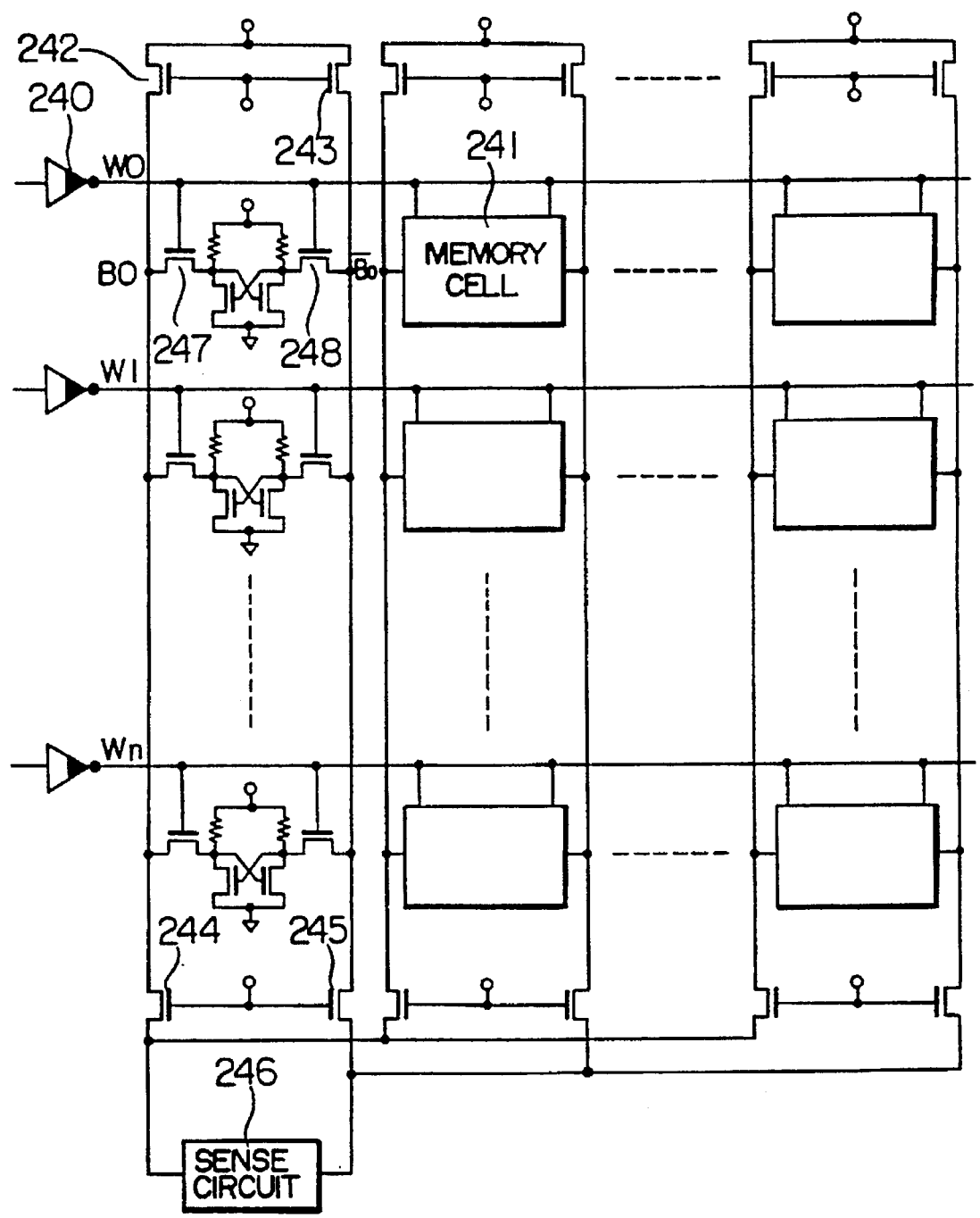

FIG. 102 shows a configuration of a static RAM in accordance with a twentieth embodiment of the present invention. Numeral 240 denotes a MOS-drive bipolar-output level-shiftless logic circuit which drives a word line $W_0$. Numeral 241 denotes a one-bit memory cell which comprises a memory including a positive feedback inverter and write and read control enhancement type NMOS transistors 247 and 248 which are turned on and off by the word line $W_0$. Numerals 242 and 243 denote MOS transistors for precharging data lines $B_0$ and $\overline{B}_0$, numerals 244 and 245 denote column select MOS transistors and numeral 246 denotes a sense circuit.

In the present embodiment, the word line drive circuit 240 is preferably the MOS-drive bipolar-output logic circuit in order to drive a number of MOS gates represented by 247 and 248 at a high speed. It is important that at least the low level output is level-shiftless in order to completely cut off the write control and read control NMOS transistors represented by 247 and 248.

If the level shift is included, a number of NMOS transistors which should be in the off state remain in the slightly on state and the potentials of the bit lines $B_0$ and $\overline{B}_0$ are changed. As a result, the sense circuit 246 may malfunction.

Figure 103:
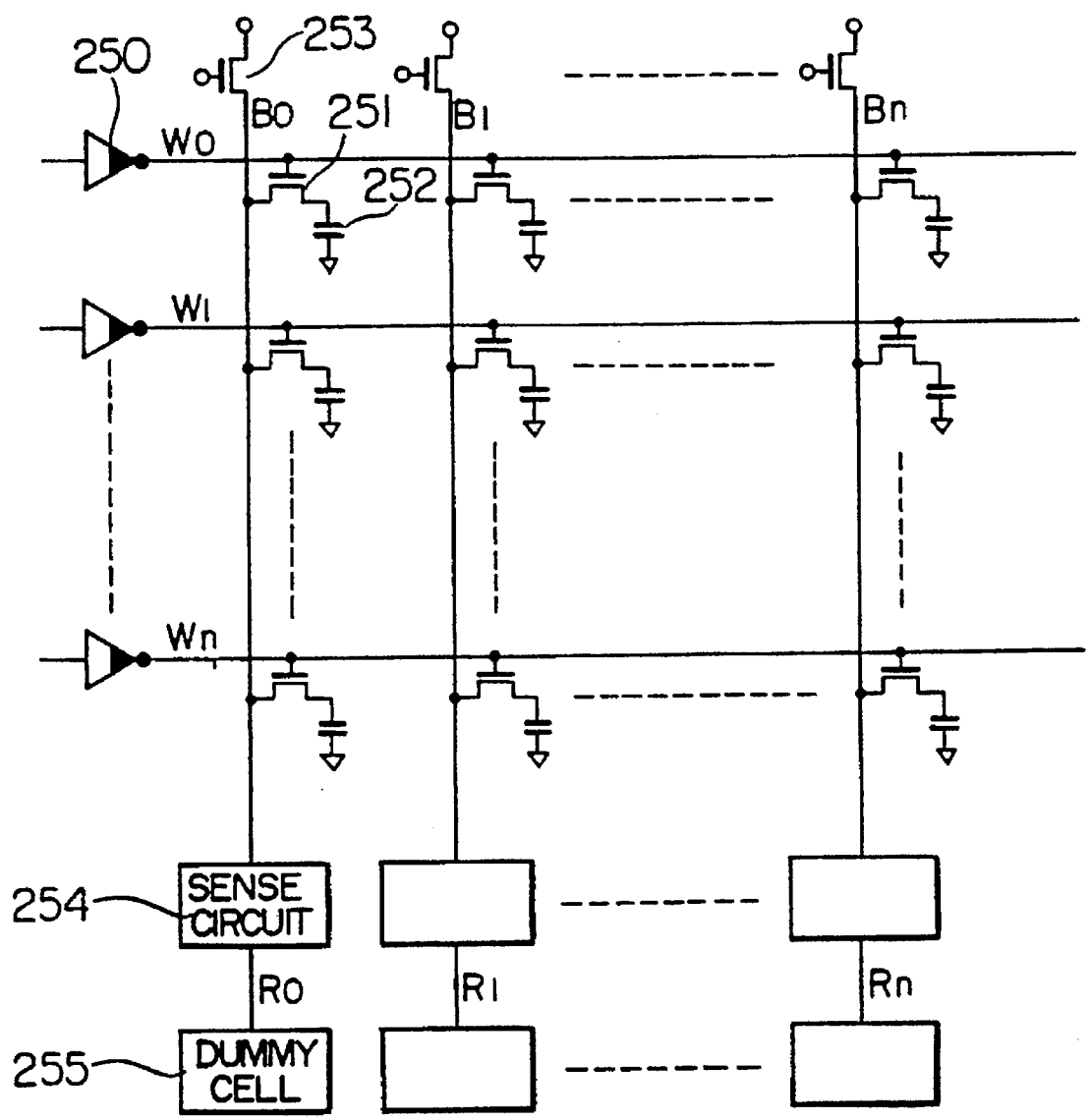

FIG. 103 shows a configuration of a dynamic RAM in accordance with a twenty-first embodiment of the present invention. Numeral 250 denotes a MOS-drive bipolar-output level-shiftless logic circuit which drives a word line $W_0$. Numeral 251 denotes an enhancement type MOS switch which is turned on and off by a signal on the word line $W_0$, and numeral 252 denotes a capacitor which stores one bit of information. The MOS switch 251 and the capacitor 252 form a one-bit dynamic memory. Numeral 254 denotes a sense circuit which differentially senses an output $R_0$ of a dummy cell 255 and a signal on a bit line $B_0$.

In the present embodiment, the word line drive circuit 250 is preferably the MOS-drive bipolar-output logic circuit in order to drive a number of NMOS gates represented by 251 at a high speed. It is important that at least the low level output is level-shiftless in order to completely cut off the NMOS transistors.

If the level shift is included, a number of NMOS transistors which should be in the off state remains in the slightly on state so that the potentials on the bit lines $B_0$, $B_1$, $B_n$ are changed and the sense circuit 254 may malfunction.

Figure 104:
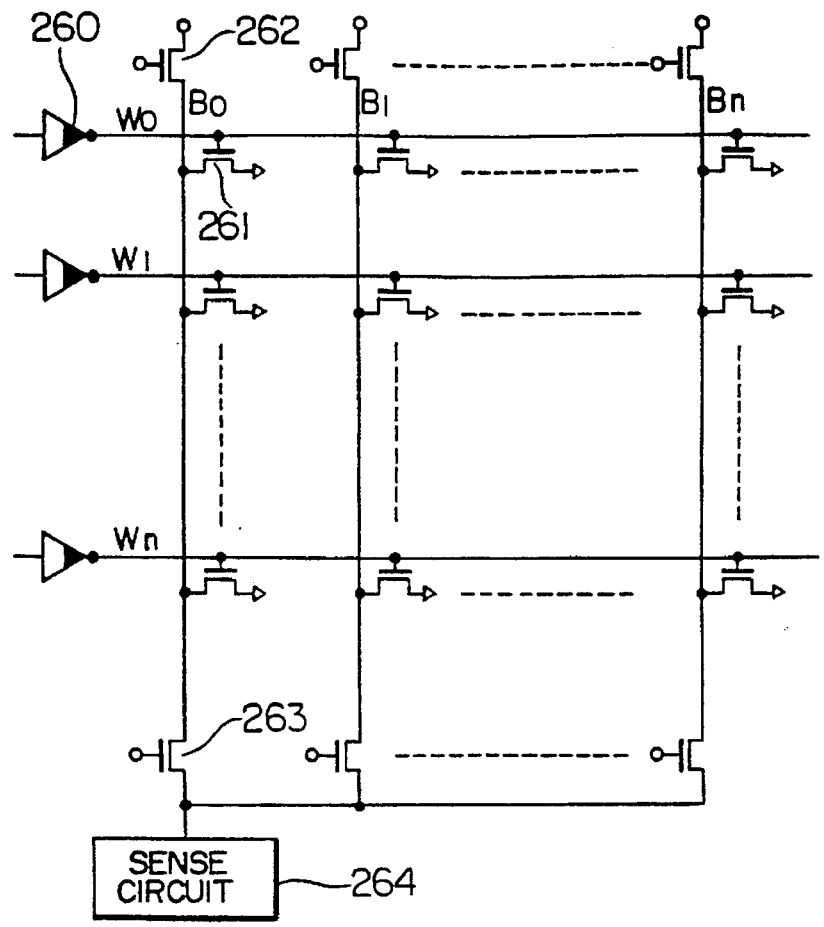

FIG. 104 shows a configuration of a ROM in accordance with a twenty-second embodiment of the present invention. Numeral 260 denotes a MOS-drive bipolar-output level-shiftless logic circuit which drives a word line $W_0$. Numeral 261 denotes an enhancement type NMOS which is turned on and off by a word line $W_0$. When an "H" level signal is applied to a gate of the NMOS transistor 261, it is actively coupled to a bit line $B_0$ to store information "1". Numeral 262 denotes a MOS transistor for precharging the bit line, numeral 263 denotes a column select MOS transistor and numeral 264 denotes a sense circuit.

In the present embodiment the word line drive circuit 260 is preferably the MOS-drive bipolar-output logic circuit in order to drive a number of NMOS gates represented by 261 at a high speed. It is important that at least the low level output is level-shiftless in order to completely cut off the NMOS transistors.

If the level shift is included, a number of bit lines $B_0$, $B_1$, ... $B_n$ are changed and the sense circuit NMOS transistors which should be in the off state remain in the slightly on state so that the potentials of the 264 may malfunction.

The MOS-drive bipolar-output logic circuit described in the above embodiments requires a combination of a miniturized MOS transistor of less than 2 µm and a comparably miniturized bipolar transistor in order to drive the heavy load at the high speed. Thus, the above object is not attained by a low performance bipolar transistor such as a lateral NPN transistor by a CMOS process or a well structure vertical NPN transistor.

Figure 105:
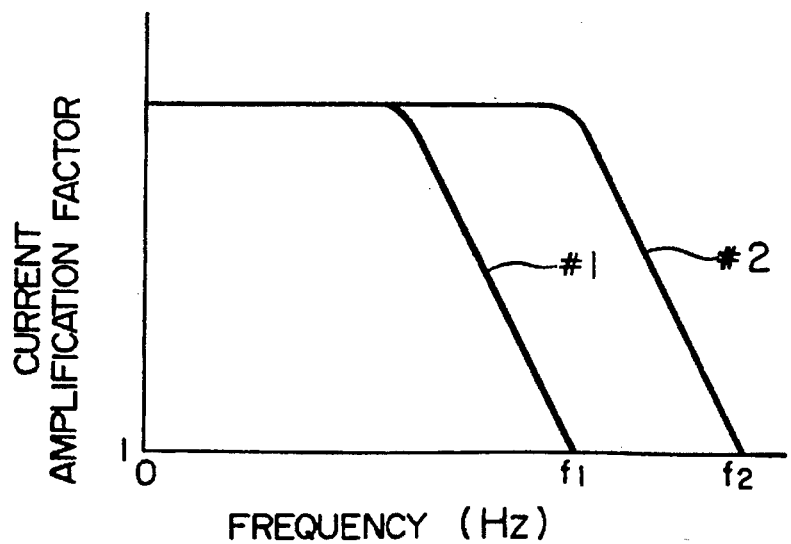
FIG. 105 shows a chart useful to explain the present invention.

The MOS-drive bipolar-output logic circuit amplifies the drive current of the MOS by the current gain of the bipolar transistor to charge or discharge a large current to or from a heavy load. As shown in FIG. 105, a current gain of a low performance bipolar transistor #1 is 1 at a frequency $f_1$ and it does no longer function as an amplifier. Thus, the high speed charge/discharge of the load by the bipolar transistor is not attained.

Figure 106:
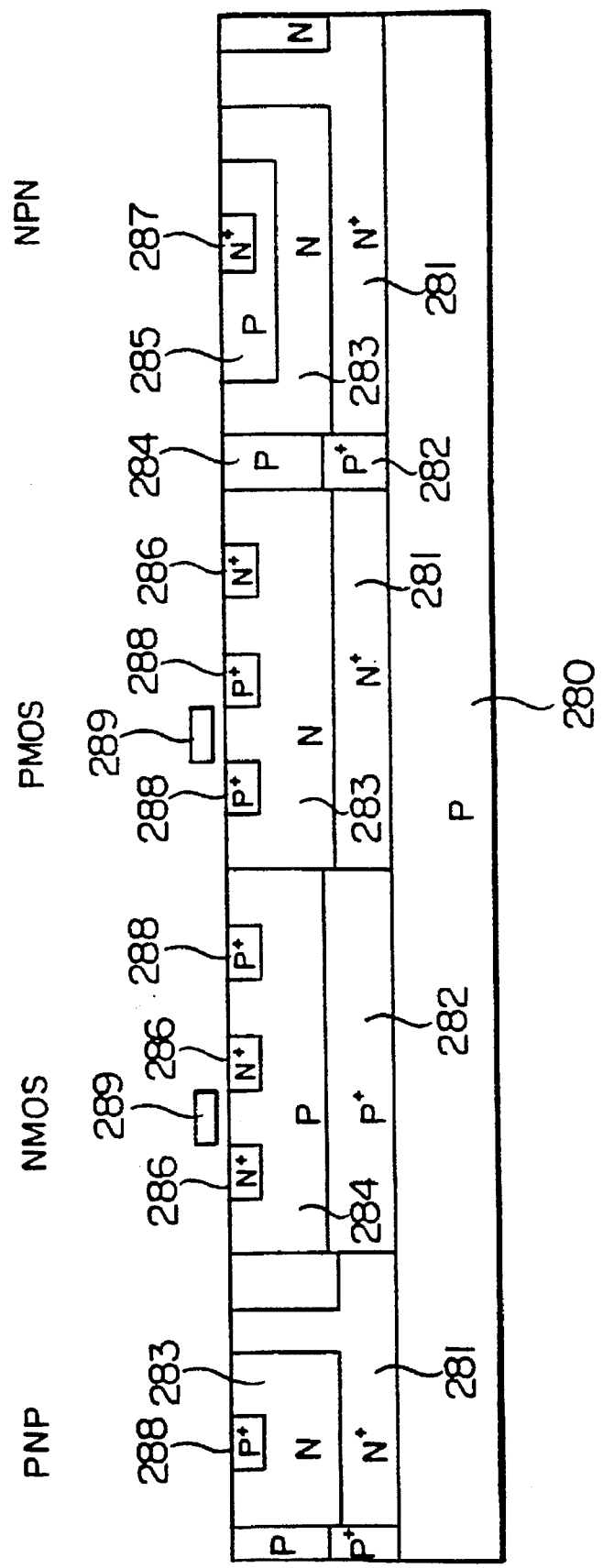
FIG. 106 shows a sectional view of a device structure of a composite circuit of the present invention.

FIG. 106 shows a sectional view of a device used in the MOS-drive bipolar-output logic circuit of the present invention. Numeral 280 denotes a p-substrate on which an $n^+$-buried layer 281 and a $p^+$-buried layer 282 is formed, and an n-epitaxial layer 283 and a p-epitaxial layer 284 are formed thereon. A PNP transistor is formed having the p-substrate 280 as a collector, the n-epitaxial layer 283 as a base and a $p^+$-diffusion layer 288 as an emitter. An NMOS transistor is formed having the p-epitaxial layer 284 as a substrate, an $n^+$-diffusion layer as a drain and a source, and a polysilicon 289 as a gate. A PMOS transistor is formed having the n-epitaxial layer 283 as a substrate, the $p^+$-diffusion layer 288 as a drain and a source, and the polysilicon 289 as a gate. An NPN transistor is a collector-isolated vertical NPN transistor having the n-epitaxial layer 283 as a collector, a p-base diffusion layer 285 as a base and an $n^+$-emitter diffusion layer 287 as an emitter. This device structure allows formation of a high performance bipolar transistor having an emitter width of less than 2 µm and the $f_T$ of higher than several giga $H_Z$.

It is to be understood that the above-described arrangements are simply illustrative of the application of the principles of this invention. Numerous other arrangements may be readily devised by those skilled in the art which embody the principles of the invention and fall within its spirit and scope.

What is claimed is:

1. A semiconductor circuit having a dynamic memory cell, a word line coupled to said dynamic memory cell, a data line coupled to said dynamic memory cell, a precharge circuit coupled to said data line, a word driver coupled to said word line and a decoder coupled to said word driver, comprising:

a plurality of address lines coupled to said decoder;

wherein said decoder has a first logic circuit whose inputs are connected to said plurality of address lines, respectively, for decoding an address signal on said plurality of address lines;

wherein said decoder has a latch circuit whose input is connected to an output of said first logic circuit and whose output is coupled to said word line, wherein said decoder receives a first signal as an input for placing said word line in a selected state, and wherein said word line remains in said selected state while a second signal is input to said decoder even if the first signal is input to said decoder.

2. A semiconductor circuit according to claim 1, further comprising:

a second logic circuit located between said first decoder and said word driver.

3. A semiconductor circuit according to claim 1, wherein said second signal is input to said latch circuit to maintain its output signal.

* * * * *